US011930328B2

(12) United States Patent
Lewis et al.

(10) Patent No.: US 11,930,328 B2
(45) Date of Patent: Mar. 12, 2024

(54) OPERATION MODES, AUDIO LAYERING, AND DEDICATED CONTROLS FOR TARGETED AUDIO EXPERIENCES

(71) Applicant: Sonos, Inc., Santa Barbara, CA (US)

(72) Inventors: Kirsten Lewis, Boston, MA (US); Kristen Leclerc, Boston, MA (US); Youjin Nam, Santa Barbara, CA (US); Dayn Wilberding, Portland, OR (US); James Nesfield, London (GB); Fiede Schillmoeller, Waterland (NL); Dimitri Singer, Paris (FR); DonPaul Nogueira, Boston, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 17/689,885

(22) Filed: Mar. 8, 2022

(65) Prior Publication Data
US 2022/0286795 A1     Sep. 8, 2022

Related U.S. Application Data

(60) Provisional application No. 63/190,638, filed on May 19, 2021, provisional application No. 63/157,982, filed on Mar. 8, 2021.

(51) Int. Cl.
*H04R 5/04* (2006.01)
*H03G 1/02* (2006.01)
(Continued)

(52) U.S. Cl.
CPC ............... *H04R 27/00* (2013.01); *H03G 1/02* (2013.01); *H03G 5/005* (2013.01); *H03G 5/16* (2013.01);
(Continued)

(58) Field of Classification Search
CPC ..... H04R 27/00; H04R 5/04; H04R 2227/005
(Continued)

(56) References Cited

U.S. PATENT DOCUMENTS 5,440,644 A   8/1995  Farinelli et al.
5,761,320 A   6/1998  Farinelli et al.
(Continued)

FOREIGN PATENT DOCUMENTS

EP       1389853 A1    2/2004
WO       200153994     7/2001
WO    2003093950 A2   11/2003

OTHER PUBLICATIONS

AudioTron Quick Start Guide, Version 1.0, Mar. 2001, 24 pages.
(Continued)

*Primary Examiner* — Disler Paul

(57) ABSTRACT

A playback device is configured to: based on a room setting of the playback device, determine that the playback device is associated with a first room of a media playback system; operate in a first mode that is associated with a first user type and a first set of playback control options; determine that the room setting of the playback device has changed; determine that the playback device is no longer associated with the first room and is associated with a second room of the media playback system; transition to operating in a second mode; determine that the playback device is no longer associated with the second room and is associated with the first room; transition to operating in the first mode; receive a playback command; determine that the playback command corresponds to a playback control option within the first set; and execute the playback command.

20 Claims, 19 Drawing Sheets

(51) Int. Cl.
*H03G 5/00* (2006.01)
*H03G 5/16* (2006.01)
*H04R 27/00* (2006.01)

(52) U.S. Cl.
CPC ......... *H04R 5/04* (2013.01); *H04R 2227/005* (2013.01)

(58) Field of Classification Search
USPC ................................ 381/56–59, 103, 80, 98
See application file for complete search history.

(56) References Cited

U.S. PATENT DOCUMENTS

| | | | |
|---|---|---|---|
| 5,923,902 | A | 7/1999 | Inagaki |
| 6,032,202 | A | 2/2000 | Lea et al. |
| 6,256,554 | B1 | 7/2001 | DiLorenzo |
| 6,404,811 | B1 | 6/2002 | Cvetko et al. |
| 6,469,633 | B1 | 10/2002 | Wachter |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,757,517 | B2 | 6/2004 | Chang |
| 6,778,869 | B2 | 8/2004 | Champion |
| 7,130,608 | B2 | 10/2006 | Hollstrom et al. |
| 7,130,616 | B2 | 10/2006 | Janik |
| 7,143,939 | B2 | 12/2006 | Henzerling |
| 7,236,773 | B2 | 6/2007 | Thomas |
| 7,295,548 | B2 | 11/2007 | Blank et al. |
| 7,391,791 | B2 | 6/2008 | Balassanian et al. |
| 7,483,538 | B2 | 1/2009 | McCarty et al. |
| 7,571,014 | B1 | 8/2009 | Lambourne et al. |
| 7,630,501 | B2 | 12/2009 | Blank et al. |
| 7,643,894 | B2 | 1/2010 | Braithwaite et al. |
| 7,657,910 | B1 | 2/2010 | McAulay et al. |
| 7,853,341 | B2 | 12/2010 | McCarty et al. |
| 7,987,294 | B2 | 7/2011 | Bryce et al. |
| 8,014,423 | B2 | 9/2011 | Thaler et al. |
| 8,045,952 | B2 | 10/2011 | Qureshey et al. |
| 8,103,009 | B2 | 1/2012 | McCarty et al. |
| 8,234,395 | B2 | 7/2012 | Millington |
| 8,483,853 | B1 | 7/2013 | Lambourne |
| 8,498,425 | B2 * | 7/2013 | Graylin ............... H04M 1/6066 84/625 |
| 8,942,252 | B2 | 1/2015 | Balassanian et al. |
| 10,404,768 | B2 * | 9/2019 | Lang .................. H04N 21/4363 |
| 10,657,949 | B2 * | 5/2020 | Starobin .......... G10K 11/17857 |
| 10,732,826 | B2 * | 8/2020 | Klein ...................... G06F 3/011 |
| 11,005,440 | B2 * | 5/2021 | Shaya .................. H04R 29/001 |
| 11,012,780 | B2 * | 5/2021 | Freeman .................. H04R 5/04 |
| 11,109,173 | B2 * | 8/2021 | Po ............................ H04S 7/30 |
| 11,176,922 | B2 * | 11/2021 | Starobin .......... G10K 11/17875 |
| 11,239,811 | B2 * | 2/2022 | Knode ..................... H04R 3/00 |
| 11,265,653 | B2 * | 3/2022 | Family .................... H04S 7/302 |
| 2001/0042107 | A1 | 11/2001 | Palm |
| 2002/0022453 | A1 | 2/2002 | Balog et al. |
| 2002/0026442 | A1 | 2/2002 | Lipscomb et al. |
| 2002/0124097 | A1 | 9/2002 | Isely et al. |
| 2003/0157951 | A1 | 8/2003 | Hasty, Jr. |
| 2004/0024478 | A1 | 2/2004 | Hans et al. |
| 2007/0142944 | A1 | 6/2007 | Goldberg et al. |
| 2021/0377662 | A1 * | 12/2021 | Khonsaripour .......... H04R 5/04 |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc Scatternet for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Palm, Inc., "Handbook for the Palm VII Handheld," May 2000, 311 pages.
Presentations at WinHEC 2000, May 2000, 138 pages.
*Sonos, Inc.* v. *D&M Holdings* (No. 14-1330-RGA), DI 219, Claim Construction Opinion (Jan. 12, 2017) (24 pages).
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

\* cited by examiner

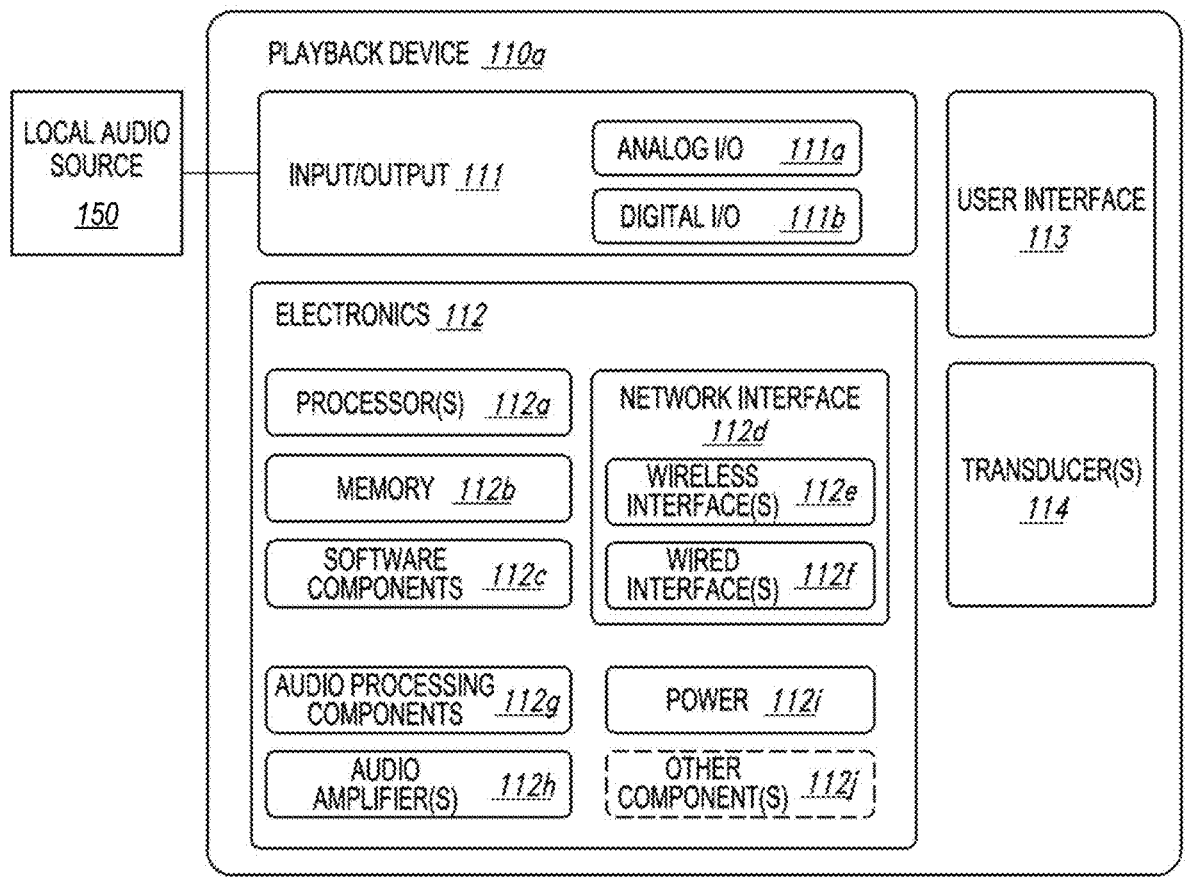
FIG. 1C
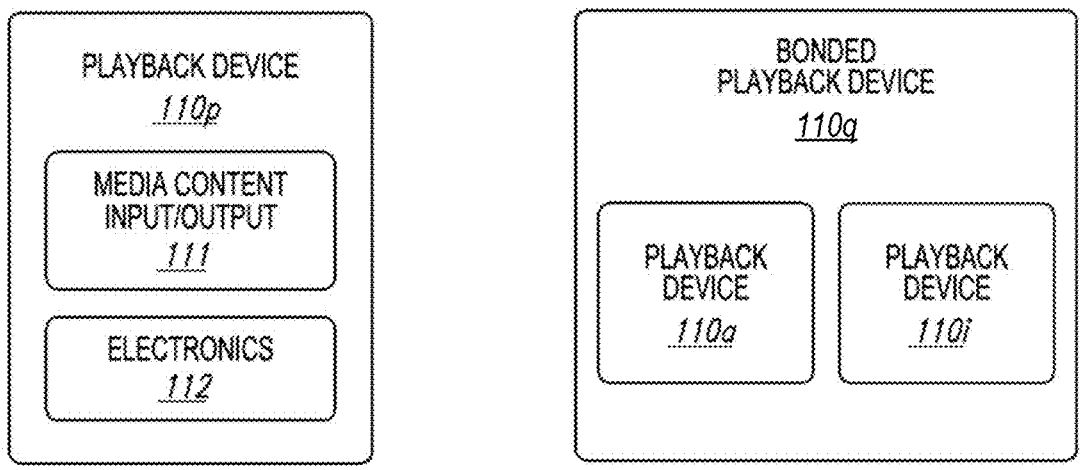
FIG. 1D
FIG. 1E

OPERATION MODES, AUDIO LAYERING, AND DEDICATED CONTROLS FOR TARGETED AUDIO EXPERIENCES

CROSS-REFERENCE TO RELATED APPLICATIONS

This application claims priority to U.S. Provisional Application No. 63/157,982 filed Mar. 8, 2021 and titled "Operation Modes for Targeted Audio Experiences," and U.S. Provisional Application No. 63/190,638 filed May 19, 2021 and titled "Dedicated Controls for Targeted Audio Experiences," each of which is herein incorporated by reference in its entirety.

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

Given the ever-growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 1C is a block diagram of an example playback device.

FIG. 1D is a block diagram of an example playback device.

FIG. 1E is a block diagram of an example playback device.

Figure 1A:
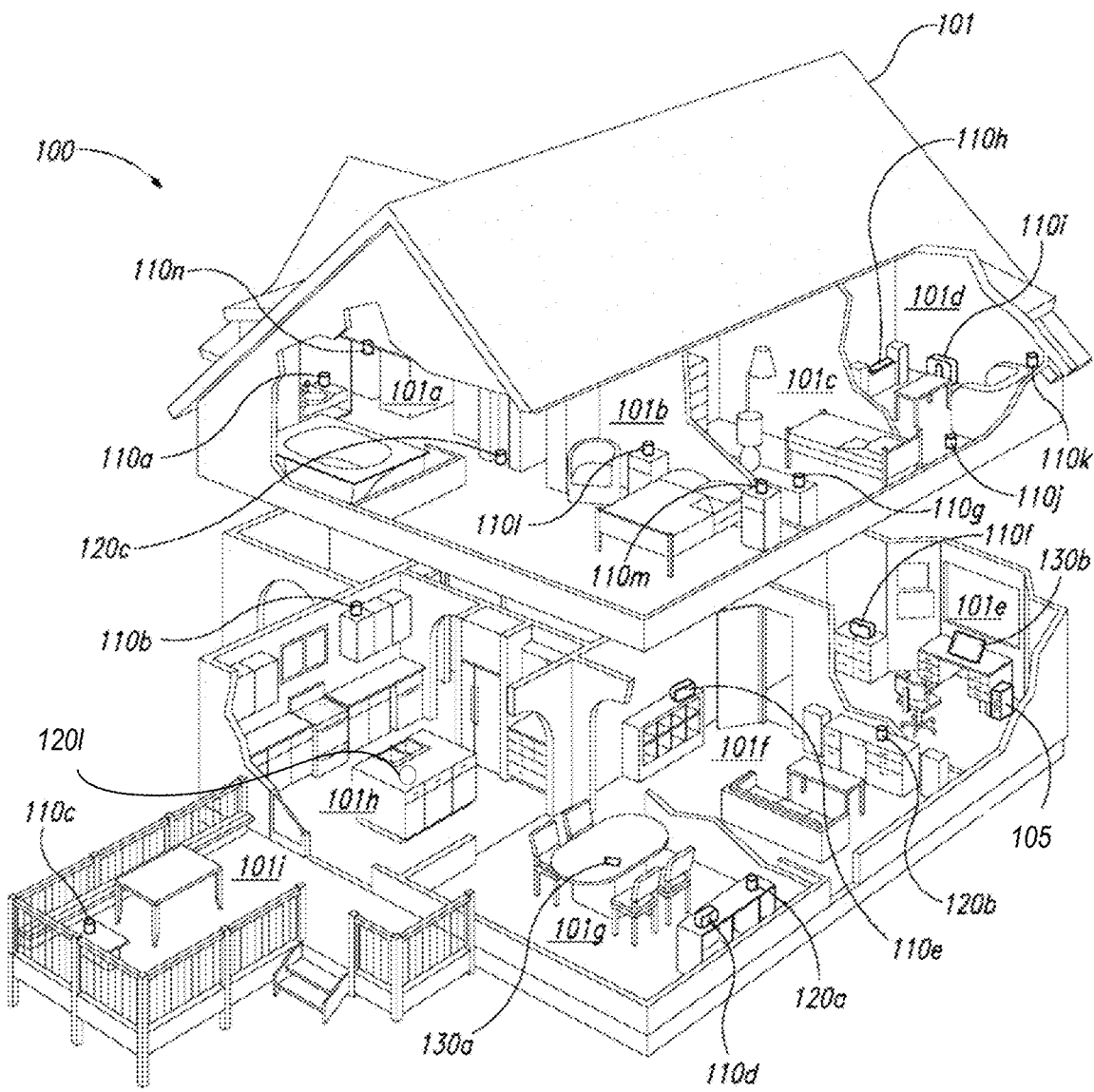
FIG. 1A is a partial cutaway view of an environment having a media playback system configured in accordance with aspects of the disclosed technology.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

Throughout one's day, different types of listening moments can occur, and listening moments for an individual versus a family will be different as well. Some activities call for personal listening moments while other moments are centered around room-filling sound. Sound helps to create or support different listening moments or moods and foster a more personal, meaningful, and targeted interaction with one's environment. The directionality of sound, layering of sound, or types of sound can be selected to create particular listening moments or moods.

Further, different listening moments and/or listening experiences are appropriate based on the listener's age (e.g., baby, toddler, child, adult, etc.). Accordingly, listening experiences may be catered for a given listener based on the listener's age to help create a more purposeful environment and a more immersive experience for the listener during various times and stages of the listener's lifecycle. For example, a listening experience for a user who is a newborn or a baby may focus on providing a soothing ambience so as to help the user calm down and/or fall asleep. As another example, a listening experience for a toddler or pre-school age user may focus on providing educational and/or other age-restricted audio content such that the user can explore audio content safely without risking exposure to content that may be more appropriate for a mature or experienced user. In this regard, it may be desirable for a playback device to be configured to operate in a particular mode so as to provide an age-appropriate listening experience for a given user and also adapt playback behavior based on the given user's developmental progress and ability to interact with the playback device. It may further be desirable to enable a user to autonomously engage in a desired listening experience in a way that eases reliance on a controller device (e.g., smartphone, tablet, computer, voice input device) to initiate, control, and/or otherwise facilitate the listening experience. Accordingly, disclosed herein are various modes of operation, dedicated controls, and related techniques and embodiments.

Accordingly, in one aspect, disclosed herein is a playback device including at least one processor, a non-transitory computer-readable medium, and program instructions stored on the non-transitory computer-readable medium that are executable by the at least one processor such that the first playback device is configured to: (i) based on a room setting of the playback device, determine that the playback device is associated with a first room of a media playback system; (ii) operate in a first mode, wherein the first mode comprises a default mode of the playback device, and wherein the first mode is associated with a first user type and a first set of playback control options; (iii) determine that the room setting of the playback device has changed; (iv) based on the changed room setting, determine that the playback device is no longer associated with the first room and is associated with a second room of the media playback system; (v) based on determining that the playback device is associated with the second room, transition to operating in a second mode, wherein the second mode is associated with a second user type and a second set of playback control options; (vi) while operating in the second mode, determine that the playback device is no longer associated with the second room and is associated with the first room; (vii) transition to operating in the first mode; (vii) while operating in the first mode, receive a playback command; (ix) determine that the playback command corresponds to a playback control option within the first set; and (x) based on the determination, execute the playback command.

In another aspect, disclosed herein is a non-transitory computer-readable medium. The non-transitory computer-readable medium is provisioned with program instructions that, when executed by at least one processor, cause a playback device to: (i) based on a room setting of the playback device, determine that the playback device is associated with a first room of a media playback system; (ii) operate in a first mode, wherein the first mode comprises a default mode of the playback device, and wherein the first mode is associated with a first user type and a first set of playback control options; (iii) determine that the room setting of the playback device has changed; (iv) based on the changed room setting, determine that the playback device is no longer associated with the first room and is associated with a second room of the media playback system; (v) based on determining that the playback device is associated with the second room, transition to operating in a second mode, wherein the second mode is associated with a second user type and a second set of playback control options; (vi) while operating in the second mode, determine that the playback device is no longer associated with the second room and is associated with the first room; (vii) transition to operating in the first mode; (vii) while operating in the first mode, receive a playback command; (ix) determine that the playback command corresponds to a playback control option within the first set; and (x) based on the determination, execute the playback command.

In yet another aspect, disclosed herein is a method carried out by a playback device that involves: (i) based on a room setting of the playback device, determining that the playback device is associated with a first room of a media playback system; (ii) operating in a first mode, wherein the first mode comprises a default mode of the playback device, and wherein the first mode is associated with a first user type and a first set of playback control options; (iii) determining that the room setting of the playback device has changed; (iv) based on the changed room setting, determining that the playback device is no longer associated with the first room and is associated with a second room of the media playback system; (v) based on determining that the playback device is associated with the second room, transitioning to operating in a second mode, wherein the second mode is associated with a second user type and a second set of playback control options; (vi) while operating in the second mode, determining that the playback device is no longer associated with the second room and is associated with the first room; (vii) transitioning to operating in the first mode; (vii) while operating in the first mode, receiving a playback command; (ix) determining that the playback command corresponds to a playback control option within the first set; and (x) based on the determination, executing the playback command.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

Moreover, some functions are described herein as being performed "based on" or "in response to" another element or function. "Based on" should be understood that one element or function is related to another function or element. "In response to" should be understood that one element or function is a necessary result of another function or element. For the sake of brevity, functions are generally described as being based on another function when a functional link exists; however, such disclosure should be understood as disclosing either type of functional relationship.

In the figures, identical reference numbers identify generally similar, and/or identical, elements. To facilitate the discussion of any particular element, the most significant digit or digits of a reference number refers to the figure in which that element is first introduced. For example, element 110a is first introduced and discussed with reference to FIG. 1A. Many of the details, dimensions, angles and other features shown in the figures are merely illustrative of particular embodiments of the disclosed technology. Accordingly, other embodiments can have other details, dimensions, angles and features without departing from the spirit or scope of the disclosure. In addition, those of ordinary skill in the art will appreciate that further embodiments of the various disclosed technologies can be practiced without several of the details described below.

II. Suitable Operating Environment a. Suitable Media Playback System

Figure 1B:
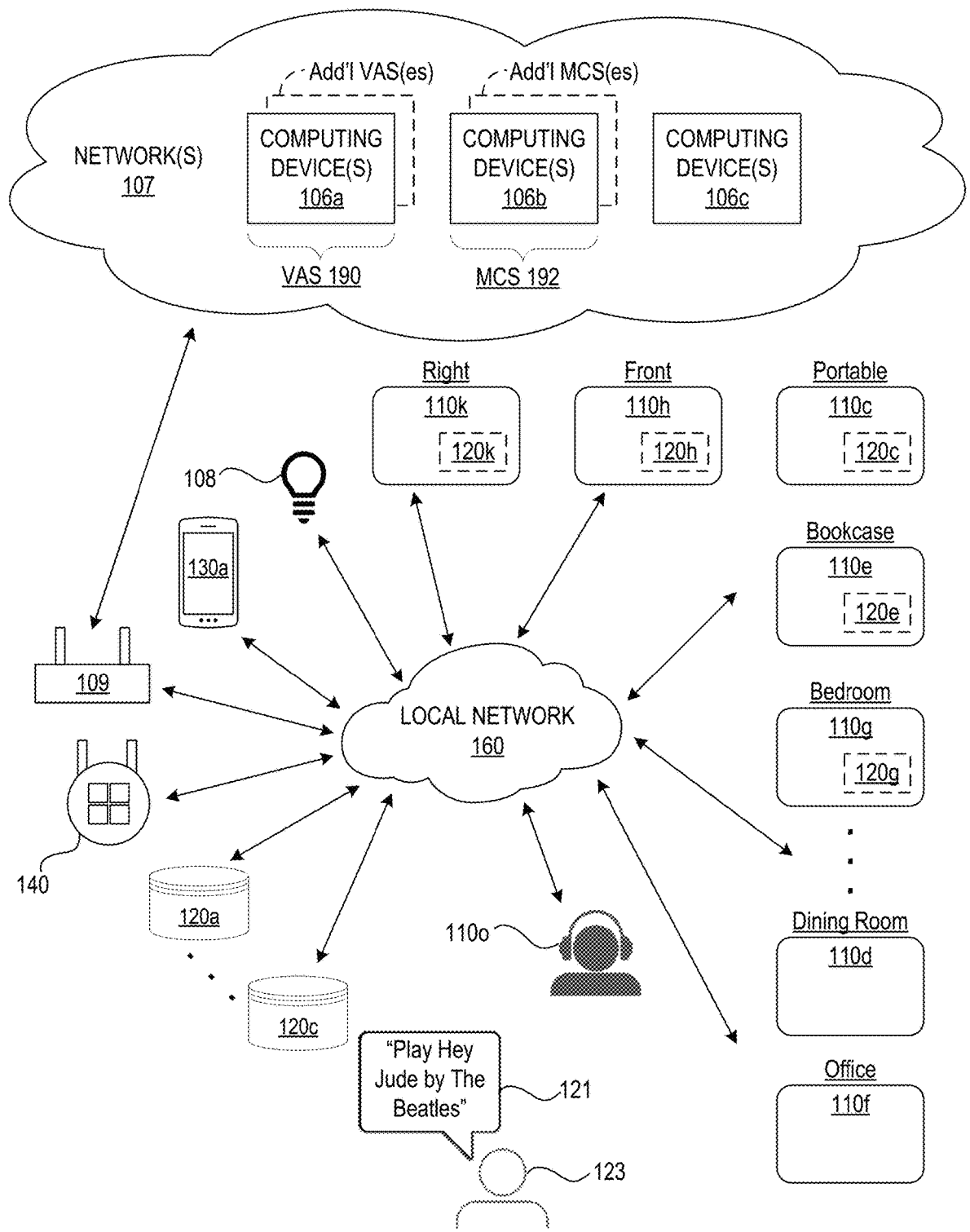
FIG. 1B is a schematic diagram of the media playback system of FIG. 1A and one or more networks.

FIGS. 1A and 1B illustrate an example configuration of a media playback system ("MPS") 100 in which one or more embodiments disclosed herein may be implemented. Referring first to FIG. 1A, a partial cutaway view of MPS 100 distributed in an environment 101 (e.g., a house) is shown. The MPS 100 as shown is associated with an example home environment having a plurality of rooms and spaces. The MPS 100 comprises one or more playback devices 110 (identified individually as playback devices 110*a-o*), one or more network microphone devices ("NMDs") 120 (identified individually as NMDs 120*a-c*), and one or more control devices 130 (identified individually as control devices 130*a* and 130*b*).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the MPS 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the MPS 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the MPS 100 is configured to play back audio from a first playback device (e.g., the playback device 100*a*) in synchrony with a second playback device (e.g., the playback device 100*b*). Interactions between the playback devices 110, NMDs 120, and/or control devices 130 of the MPS 100 configured in accordance with the various embodiments of the disclosure are described in greater detail below with respect to FIGS. 1B-1M and FIG. 2.

In the illustrated embodiment of FIG. 1A, the environment 101 comprises a household having several rooms, spaces, and/or playback zones, including (clockwise from upper left) a Master Bathroom 101*a*, a Master Bedroom 101*b*, a Second Bedroom 101*c*, a Family Room or Den 101*d*, an Office 101*e*, a Living Room 101*f*, a Dining Room 101*g*, a Kitchen 101*h*, and an outdoor Patio 101*i*. While certain embodiments and examples are described below in the context of a home environment, the technologies described herein may be implemented in other types of environments. In some embodiments, for example, the MPS 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The MPS 100 can comprise one or more playback zones, some of which may correspond to the rooms in the environment 101. The MPS 100 can be established with one or more playback zones, after which additional zones may be added and/or removed to form, for example, the configuration shown in FIG. 1A. Each zone may be given a name according to a different room or space such as the Office 101*e*, Master Bathroom 101*a*, Master Bedroom 101*b*, the Second Bedroom 101*c*, Kitchen 101*h*, Dining Room 101*g*, Living Room 101*f*, and/or the Patio 101*i*. In some aspects, a single playback zone may include multiple rooms or spaces. In certain aspects, a single room or space may include multiple playback zones.

In the illustrated embodiment of FIG. 1A, the Master Bathroom 101*a*, the Second Bedroom 101*c*, the Office 101*e*, the Living Room 101*f*, the Dining Room 101*g*, the Kitchen 101*h*, and the outdoor Patio 101*i* each include one playback device 110, and the Master Bedroom 101*b* and the Den 101*d* include a plurality of playback devices 110. In the Master Bedroom 101*b*, the playback devices 110*l* and 110*m* may be configured, for example, to play back audio content in synchrony as individual ones of playback devices 110, as a bonded playback zone, as a consolidated playback device, and/or any combination thereof. Similarly, in the Den 101*d*, the playback devices 110*h-j* can be configured, for instance, to play back audio content in synchrony as individual ones of playback devices 110, as one or more bonded playback devices, and/or as one or more consolidated playback devices.

Referring to FIG. 1B, the home environment may include additional and/or other computing devices, including local network devices, such as one or more smart illumination devices 108 (FIG. 1B), a smart thermostat 140 (FIG. 1B), and a local computing device 105 (FIG. 1A). In embodiments described below, one or more of the various playback devices 110 may be configured as portable playback devices, while others may be configured as stationary playback devices. For example, the headphones 110*o* (FIG. 1B) are a portable playback device, while the playback device 110*e* on the bookcase may be a stationary device. As another example, the playback device 110*c* on the Patio 101*i* may be a portable, battery-powered device, which may allow it to be transported to various areas within the environment 101, and outside of the environment 101, when it is not plugged in to a wall outlet or the like.

With reference still to FIG. 1B, the various playback, network microphone, and controller devices and/or other network devices of the MPS 100 may be coupled to one another via point-to-point connections and/or over other connections, which may be wired and/or wireless, via a local network 160 that may include a network router 109. For example, the playback device 110*j* in the Den 101*d* (FIG. 1A), which may be designated as the "Left" device, may have a point-to-point connection with the playback device 110*k*, which is also in the Den 101*d* and may be designated as the "Right" device. In a related embodiment, the Left playback device 110*j* may communicate with other network devices, such as the playback device 110*h*, which may be designated as the "Front" device, via a point-to-point connection and/or other connections via the local network 160.

The local network 160 may be, for example, a network that interconnects one or more devices within a limited area (e.g., a residence, an office building, a car, an individual's workspace, etc.). The local network 160 may include, for example, one or more local area networks (LANs) such as a wireless local area network (WLAN) (e.g., a WIFI network, a Z-Wave network, etc.) and/or one or more personal area networks (PANs) (e.g. a BLUETOOTH network, a wireless USB network, a ZigBee network, an IRDA network, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WIFI" can refer to several different communication protocols including, for example, Institute of Electrical and Electronics Engineers (IEEE) 802.11a, 802.11b, 802.11g, 802.12, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, 6 GHz, and/or another suitable frequency.

The MPS 100 is configured to receive media content from the local network 160. The received media content can comprise, for example, a Uniform Resource Identifier (URI) and/or a Uniform Resource Locator (URL). For instance, in some examples, the MPS 100 can stream, download, or otherwise obtain data from a URI or a URL corresponding to the received media content.

As further shown in FIG. 1B, the MPS 100 may be coupled to one or more remote computing devices 106 via a wide area network ("WAN") 107. In some embodiments, each remote computing device 106 may take the form of one or more cloud servers. The remote computing devices 106 may be configured to interact with computing devices in the environment 101 in various ways. For example, the remote computing devices 106 may be configured to facilitate streaming and/or controlling playback of media content, such as audio, in the environment 101 (FIG. 1A).

In some implementations, the various playback devices 110, NMDs 120, and/or control devices 130 may be communicatively coupled to at least one remote computing device associated with a voice assistant service ("VAS") and/or at least one remote computing device associated with a media content service ("MCS"). For instance, in the illustrated example of FIG. 1B, remote computing devices 106*a* are associated with a VAS 190 and remote computing devices 106*b* are associated with an MCS 192. Although only a single VAS 190 and a single MCS 192 are shown in the example of FIG. 1B for purposes of clarity, the MPS 100 may be coupled to any number of different VASes and/or MCSes. In some embodiments, the various playback devices 110, NMDs 120, and/or control devices 130 may transmit data associated with a received voice input to a VAS configured to (i) process the received voice input data and (ii) transmit a corresponding command to the MPS 100. In some aspects, for example, the computing devices 106*a* may comprise one or more modules and/or servers of a VAS. In some implementations, VASes may be operated by one or more of SONOS®, AMAZON®, GOOGLE® APPLE®, MICROSOFT®, NUANCE®, or other voice assistant providers. In some implementations, MCSes may be operated by one or more of SPOTIFY, PANDORA, AMAZON MUSIC, GOOGLE PLAY, or other media content services.

In some embodiments, the local network 160 comprises a dedicated communication network that the MPS 100 uses to transmit messages between individual devices and/or to transmit media content to and from MCSes. In certain embodiments, the local network 160 is configured to be accessible only to devices in the MPS 100, thereby reducing interference and competition with other household devices. In other embodiments, however, the local network 160 comprises an existing household communication network (e.g., a household WIFI network). In some embodiments, the MPS 100 is implemented without the local network 160, and the various devices comprising the MPS 100 can communicate with each other, for example, via one or more direct connections, PANs, telecommunication networks (e.g., an LTE network or a 5G network, etc.), and/or other suitable communication links.

In some embodiments, audio content sources may be regularly added and/or removed from the MPS 100. In some embodiments, for example, the MPS 100 performs an indexing of media items when one or more media content sources are updated, added to, and/or removed from the MPS 100. The MPS 100 can scan identifiable media items in some or all folders and/or directories accessible to the various playback devices and generate or update a media content database comprising metadata (e.g., title, artist, album, track length) and other associated information (e.g., URIs, URLs) for each identifiable media item found. In some embodiments, for example, the media content database is stored on one or more of the various playback devices, network microphone devices, and/or control devices of MPS 100.

As further shown in FIG. 1B, the remote computing devices 106 further include remote computing device(s) 106*c* configured to perform certain operations, such as remotely facilitating media playback functions, managing device and system status information, directing communications between the devices of the MPS 100 and one or multiple VASes and/or MCSes, among other operations. In one example, the remote computing devices 106*c* provide cloud servers for one or more SONOS Wireless HiFi Systems.

In various implementations, one or more of the playback devices 110 may take the form of or include an on-board (e.g., integrated) network microphone device configured to receive voice utterances from a user. For example, the playback devices 110*c*-110*h*, and 110*k* include or are otherwise equipped with corresponding NMDs 120*c*-120*h*, and 120*k*, respectively. A playback device that includes or is equipped with an NMD may be referred to herein interchangeably as a playback device or an NMD unless indicated otherwise in the description. In some cases, one or more of the NMDs 120 may be a stand-alone device. For example, the NMD 120*l* (FIG. 1A) may be a stand-alone device. A stand-alone NMD may omit components and/or functionality that is typically included in a playback device, such as a speaker or related electronics. For instance, in such cases, a stand-alone NMD may not produce audio output or may produce limited audio output (e.g., relatively low-quality audio output).

The various playback and network microphone devices 110 and 120 of the MPS 100 may each be associated with a unique name, which may be assigned to the respective devices by a user, such as during setup of one or more of these devices. For instance, as shown in the illustrated example of FIG. 1B, a user may assign the name "Bookcase" to playback device 110e because it is physically situated on a bookcase. Similarly, the NMD 1201 may be assigned the named "Island" because it is physically situated on an island countertop in the Kitchen 101h (FIG. 1A). Some playback devices may be assigned names according to a zone or room, such as the playback devices 110g, 110d, and 110f, which are named "Bedroom," "Dining Room," and "Office," respectively. Further, certain playback devices may have functionally descriptive names. For example, the playback devices 110k and 110h are assigned the names "Right" and "Front," respectively, because these two devices are configured to provide specific audio channels during media playback in the zone of the Den 101d (FIG. 1A). The playback device 110c in the Patio 101i may be named "Portable" because it is battery-powered and/or readily transportable to different areas of the environment 101. Other naming conventions are possible.

As discussed above, an NMD may detect and process sound from its environment, such as sound that includes background noise mixed with speech spoken by a person in the NMD's vicinity. For example, as sounds are detected by the NMD in the environment, the NMD may process the detected sound to determine if the sound includes speech that contains voice input intended for the NMD and ultimately a particular VAS. For example, the NMD may identify whether speech includes a wake word associated with a particular VAS.

In the illustrated example of FIG. 1B, the NMDs 120 are configured to interact with the VAS 190 over the local network 160 and/or the router 109. Interactions with the VAS 190 may be initiated, for example, when an NMD identifies in the detected sound a potential wake word. The identification causes a wake-word event, which in turn causes the NMD to begin transmitting detected-sound data to the VAS 190. In some implementations, the various local network devices 105, 110, 120, and 130 (FIG. 1A) and/or remote computing devices 106c of the MPS 100 may exchange various feedback, information, instructions, and/or related data with the remote computing devices associated with the selected VAS. Such exchanges may be related to or independent of transmitted messages containing voice inputs. In some embodiments, the remote computing device(s) and the MPS 100 may exchange data via communication paths as described herein and/or using a metadata exchange channel as described in U.S. Pat. No. 10,499,146 issued Nov. 13, 2019 and titled "Voice Control of a Media Playback System," which is herein incorporated by reference in its entirety.

Upon receiving the stream of sound data, the VAS 190 may determine if there is voice input in the streamed data from the NMD, and if so the VAS 190 may also determine an underlying intent in the voice input. The VAS 190 may next transmit a response back to the MPS 100, which can include transmitting the response directly to the NMD that caused the wake-word event. The response is typically based on the intent that the VAS 190 determined was present in the voice input. As an example, in response to the VAS 190 receiving a voice input with an utterance to "Play Hey Jude by The Beatles," the VAS 190 may determine that the underlying intent of the voice input is to initiate playback and further determine that intent of the voice input is to play the particular song "Hey Jude" by The Beatles. After these determinations, the VAS 190 may transmit a command to a particular MCS 192 to retrieve content (i.e., the song "Hey Jude" by The Beatles), and that MCS 192, in turn, provides (e.g., streams) this content directly to the NIPS 100 or indirectly via the VAS 190. In some implementations, the VAS 190 may transmit to the NIPS 100 a command that causes the MPS 100 itself to retrieve the content from the MCS 192.

In certain implementations, NMDs may facilitate arbitration amongst one another when voice input is identified in speech detected by two or more NMDs located within proximity of one another. For example, the NMD-equipped playback device 110e in the environment 101 (FIG. 1A) is in relatively close proximity to the NMD-equipped Living Room playback device 120b, and both devices 110e and 120b may at least sometimes detect the same sound. In such cases, this may require arbitration as to which device is ultimately responsible for providing detected-sound data to the remote VAS. Examples of arbitrating between NMDs may be found, for example, in previously referenced U.S. Pat. No. 10,499,146.

In certain implementations, an NMD may be assigned to, or otherwise associated with, a designated or default playback device that may not include an NMD. For example, the Island NMD 1201 in the Kitchen 101h (FIG. 1A) may be assigned to the Dining Room playback device 110d, which is in relatively close proximity to the Island NMD 1201. In practice, an NMD may direct an assigned playback device to play audio in response to a remote VAS receiving a voice input from the NMD to play the audio, which the NMD might have sent to the VAS in response to a user speaking a command to play a certain song, album, playlist, etc. Additional details regarding assigning NMDs and playback devices as designated or default devices may be found, for example, in previously referenced U.S. Pat. No. 10,499,146.

Further aspects relating to the different components of the example MPS 100 and how the different components may interact to provide a user with a media experience may be found in the following sections. While discussions herein may generally refer to the example MPS 100, technologies described herein are not limited to applications within, among other things, the home environment described above. For instance, the technologies described herein may be useful in other home environment configurations comprising more or fewer of any of the playback devices 110, network microphone devices 120, and/or control devices 130. For example, the technologies herein may be utilized within an environment having a single playback device 110 and/or a single NMD 120. In some examples of such cases, the local network 160 (FIG. 1B) may be eliminated and the single playback device 110 and/or the single NMD 120 may communicate directly with the remote computing devices 106a-c. In some embodiments, a telecommunication network (e.g., an LTE network, a 5G network, etc.) may communicate with the various playback devices 110, network microphone devices 120, and/or control devices 130 independent of the local network 160.

b. Suitable Playback Devices

FIG. 1C is a block diagram of the playback device 110a comprising an input/output 111. The input/output 111 can include an analog I/O 111a (e.g., one or more wires, cables, and/or other suitable communication links configured to carry analog signals) and/or a digital I/O 111b (e.g., one or more wires, cables, or other suitable communication links configured to carry digital signals). In some embodiments, the analog I/O 111a is an audio line-in input connection comprising, for example, an auto-detecting 3.5 mm audio line-in connection. In some embodiments, the digital I/O 111b comprises a Sony/Philips Digital Interface Format (S/PDIF) communication interface and/or cable and/or a Toshiba Link (TOSLINK) cable. In some embodiments, the digital I/O 111b comprises a High-Definition Multimedia Interface (HDMI) interface and/or cable. In some embodiments, the digital I/O 111b includes one or more wireless communication links comprising, for example, a radio frequency (RF), infrared, WIFI, BLUETOOTH, or another suitable communication protocol. In certain embodiments, the analog I/O 111a and the digital 111b comprise interfaces (e.g., ports, plugs, jacks) configured to receive connectors of cables transmitting analog and digital signals, respectively, without necessarily including cables.

The playback device 110a, for example, can receive media content (e.g., audio content comprising music and/or other sounds) from a local audio source 150 via the input/output 111 (e.g., a cable, a wire, a PAN, a BLUETOOTH connection, an ad hoc wired or wireless communication network, and/or another suitable communication link). The local audio source 150 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 150 includes local music libraries on a smartphone, a computer, a networked-attached storage (NAS), and/or another suitable device configured to store media files. In certain embodiments, one or more of the playback devices 110, NMDs 120, and/or control devices 130 comprise the local audio source 150. In other embodiments, however, the media playback system omits the local audio source 150 altogether. In some embodiments, the playback device 110a does not include an input/output 111 and receives all audio content via the local network 160.

The playback device 110a further comprises electronics 112, a user interface 113 (e.g., one or more buttons, knobs, dials, touch-sensitive surfaces, displays, touchscreens), and one or more transducers 114 (e.g., a driver), referred to hereinafter as "the transducers 114." The electronics 112 is configured to receive audio from an audio source (e.g., the local audio source 150) via the input/output 111, one or more of the computing devices 106a-c via the local network 160 (FIG. 1B)), amplify the received audio, and output the amplified audio for playback via one or more of the transducers 114. In some embodiments, the playback device 110a optionally includes one or more microphones 115 (e.g., a single microphone, a plurality of microphones, a microphone array) (hereinafter referred to as "the microphones 115"). In certain embodiments, for example, the playback device 110a having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112a (referred to hereinafter as "the processors 112a"), memory 112b, software components 112c, a network interface 112d, one or more audio processing components 112g (referred to hereinafter as "the audio components 112g"), one or more audio amplifiers 112h (referred to hereinafter as "the amplifiers 112h"), and power components 112i (e.g., one or more power supplies, power cables, power receptacles, batteries, induction coils, Power-over Ethernet (POE) interfaces, and/or other suitable sources of electric power).

In some embodiments, the electronics 112 optionally include one or more other components 112j (e.g., one or more sensors, video displays, touchscreens, battery charging bases, etc.). In some embodiments, the playback device 110a and electronics 112 may further include one or more voice processing components that are operable coupled to one or more microphones, and other components as described below with reference to FIGS. 1F and 1G.

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110a to retrieve audio data from an audio source (e.g., one or more of the computing devices 106a-c (FIG. 1B)), and/or another one of the playback devices 110. In some embodiments, the operations further include causing the playback device 110a to send audio data to another one of the playback devices 110a and/or another device (e.g., one of the NMDs 120). Certain embodiments include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices and/or zones can be found, for example, in U.S. Pat. No. 8,234,395 entitled, "System and method for synchronizing operations among a plurality of independently clocked digital data processing devices," which is herein incorporated by reference in its entirety.

In some embodiments, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the MPS 100. In some aspects, for example, the state data is shared during predetermined intervals of time (e.g., every 5 seconds, every 10 seconds, every 60 seconds) among at least a portion of the devices of the MPS 100, so that one or more of the devices have the most recent data associated with the MPS 100.

The network interface 112d is configured to facilitate a transmission of data between the playback device 110a and one or more other devices on a data network. The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated embodiment of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the local network 160 (FIG. 1B) in accordance with a suitable wireless communication protocol (e.g., WIFI, BLUETOOTH, LTE). In some embodiments, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals. In some embodiments, the audio processing components 112g comprise, for example, one or more digital-to-analog converters (DAC), audio preprocessing components, audio enhancement components, digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112h comprise a suitable combination of two or more of the foregoing types of power amplifiers. Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

In some implementations, the power components 112i of the playback device 110a may additionally include an internal power source (e.g., one or more batteries) configured to power the playback device 110a without a physical connection to an external power source. When equipped with the internal power source, the playback device 110a may operate independent of an external power source. In some such implementations, an external power source interface may be configured to facilitate charging the internal power source. As discussed before, a playback device comprising an internal power source may be referred to herein as a "portable playback device." On the other hand, a playback device that operates using an external power source may be referred to herein as a "stationary playback device," although such a device may in fact be moved around a home or other environment.

The user interface 113 may facilitate user interactions independent of or in conjunction with user interactions facilitated by one or more of the control devices 130 (FIG. 1A). In various embodiments, the user interface 113 includes one or more physical buttons and/or supports graphical interfaces provided on touch sensitive screen(s) and/or surface(s), among other possibilities, for a user to directly provide input. The user interface 113 may further include one or more light components (e.g., LEDs) and the speakers to provide visual and/or audio feedback to a user.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

In some embodiments, the playback device 110a may include a speaker interface for connecting the playback device to external speakers. In other embodiments, the playback device 110a may include an audio interface for connecting the playback device to an external audio amplifier or audio-visual receiver.

By way of illustration, SONOS, Inc. presently offers (or has offered) for sale certain playback devices including, for example, a "SONOS ONE," "PLAY:1," "PLAY:3," "PLAY:5," "PLAYBAR," "PLAYBASE," "CONNECT:AMP," "CONNECT," "SUB," "ARC," "MOVE," and "ROAM." Other suitable playback devices may additionally or alternatively be used to implement the playback devices of example embodiments disclosed herein. Additionally, one of ordinary skilled in the art will appreciate that a playback device is not limited to the examples described herein or to SONOS product offerings. In some embodiments, for example, one or more of the playback devices 110 comprises a docking station and/or an interface configured to interact with a docking station for personal mobile media playback devices. In other embodiments, a playback device may be integrated to another device or component such as a television, a lighting fixture, or some other device for indoor or outdoor use. In certain embodiments, a playback device omits a user interface and/or one or more transducers. For example, FIG. 1D is a block diagram of a playback device 110p comprising the input/output 111 and electronics 112 without the user interface 113 or transducers 114.

FIG. 1E is a block diagram of a bonded playback device 110q comprising the playback device 110a (FIG. 1C) sonically bonded with the playback device 110i (e.g., a subwoofer) (FIG. 1A). In the illustrated embodiment, the playback devices 110a and 110i are separate ones of the playback devices 110 housed in separate enclosures. In some embodiments, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110l and 110m of FIG. 1B). In some embodiments, for example, the playback device 110a is full-range playback device configured to render low frequency, mid-range frequency, and high frequency audio content, and the playback device 110i is a subwoofer configured to render low frequency audio content. In some aspects, the playback device 110a, when bonded with playback device 110i, is configured to render only the mid-range and high frequency components of a particular audio content, while the playback device 110i renders the low frequency component of the particular audio content. In some embodiments, the bonded playback device 110q includes additional playback devices and/or another bonded playback device.

Figure 2:
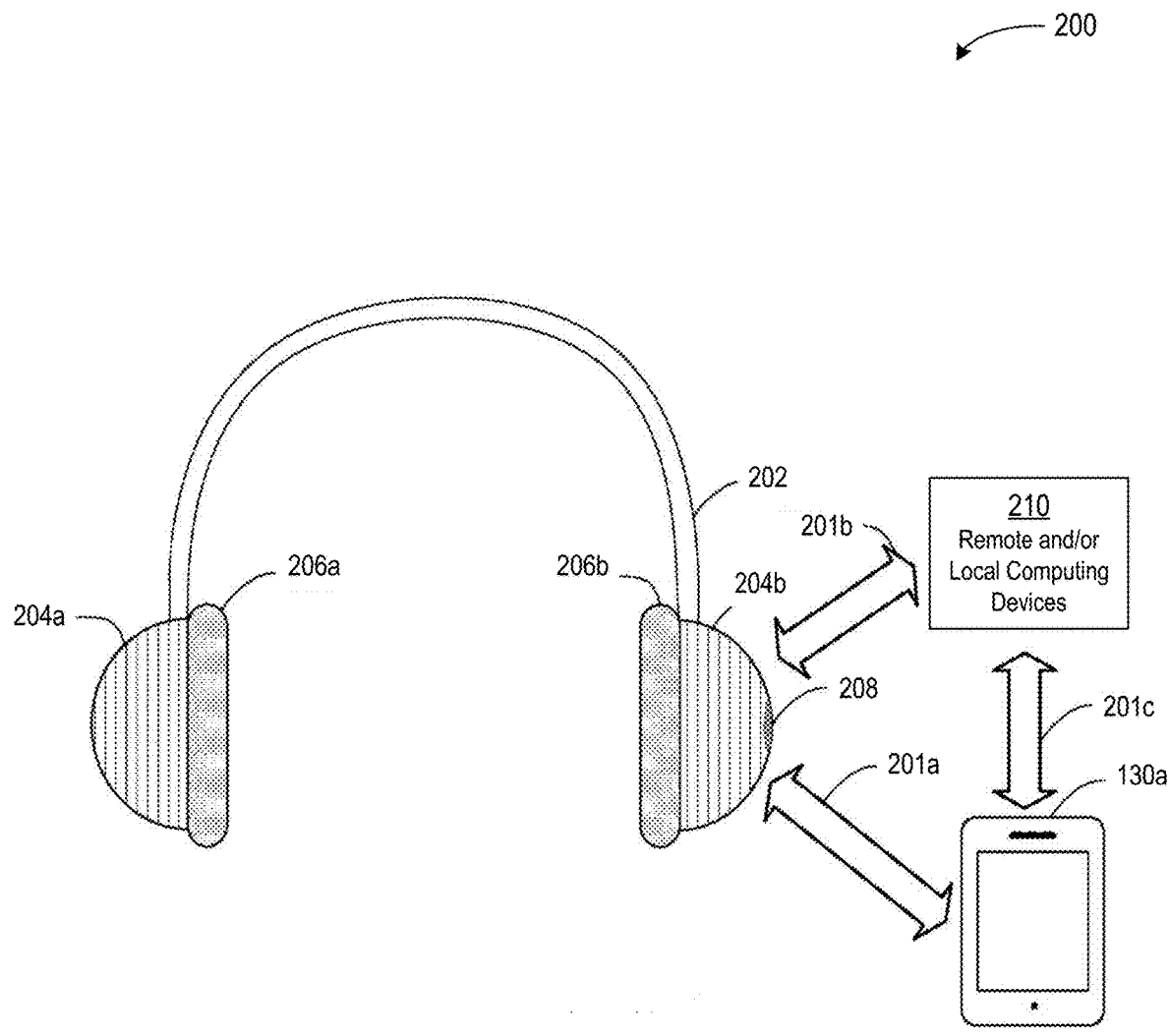
FIG. 2 is a diagram of an example wearable playback device comprising a headset assembly.

In some embodiments, the playback device 110 may take the form of a wired and/or wireless headphone (e.g., an over-ear headset, an on-ear headset, or an in-ear headset). For instance, FIG. 2 shows an example headset assembly 200 ("headset 200") for such an implementation of the playback device 110. As shown, the headset 200 includes a headband 202 that couples a first earcup 204a to a second earcup 204b. Each of the earcups 204a and 204b may house any portion of the electronic components of the playback device 110, such as one or more speakers. Further, one or both of the earcups 204a and 204b may include a user interface for controlling audio playback, volume level, and other functions. The user interface may include any of a variety of control elements such as a physical button 208, a slider (not shown), a knob (not shown), and/or a touch control surface (not shown). As shown in FIG. 2, the headset 200 may further include ear cushions 206a and 206b that are coupled to ear cups 204a and 204b, respectively. The ear cushions 206a and 206b may provide a soft barrier between the head of a user and the earcups 204a and 204b, respectively, to improve user comfort and/or provide acoustic isolation from the ambient (e.g., passive noise reduction (PNR)).

As described in greater detail below, the electronic components of a playback device may include one or more network interface components (not shown in FIG. 2) to facilitate wireless communication over one more communication links. For instance, a playback device may communicate over a first communication link 201a (e.g., a BLU-ETOOTH link) with one of the control devices 130, such as the control device 130a, and/or over a second communication link 201b (e.g., a WIFI or cellular link) with one or more other computing devices 210 (e.g., a network router and/or a remote server). As another possibility, a playback device may communicate over multiple communication links, such as the first communication link 201a with the control device 130a and a third communication link 201c (e.g., a WIFI or cellular link) between the control device 130a and the one or more other computing devices 210. Thus, the control device 130a may function as an intermediary between the playback device and the one or more other computing devices 210, in some embodiments.

In some instances, the headphone device may take the form of a hearable device. Hearable devices may include those headphone devices (including ear-level devices) that are configured to provide a hearing enhancement function while also supporting playback of media content (e.g., streaming media content from a user device over a PAN, streaming media content from a streaming music service provider over a WLAN and/or a cellular network connection, etc.). In some instances, a hearable device may be implemented as an in-ear headphone device that is configured to play back an amplified version of at least some sounds detected from an external environment (e.g., all sound, select sounds such as human speech, etc.)

It should be appreciated that one or more of the playback devices 110 may take the form of other wearable devices separate and apart from a headphone device. Wearable devices may include those devices configured to be worn about a portion of a user (e.g., a head, a neck, a torso, an arm, a wrist, a finger, a leg, an ankle, etc.). For example, the playback devices 110 may take the form of a pair of glasses including a frame front (e.g., configured to hold one or more lenses), a first temple rotatably coupled to the frame front, and a second temple rotatable coupled to the frame front. In this example, the pair of glasses may comprise one or more transducers integrated into at least one of the first and second temples and configured to project sound towards an ear of the subject.

c. Suitable Network Microphone Devices (NMD)s

Figure 1F:
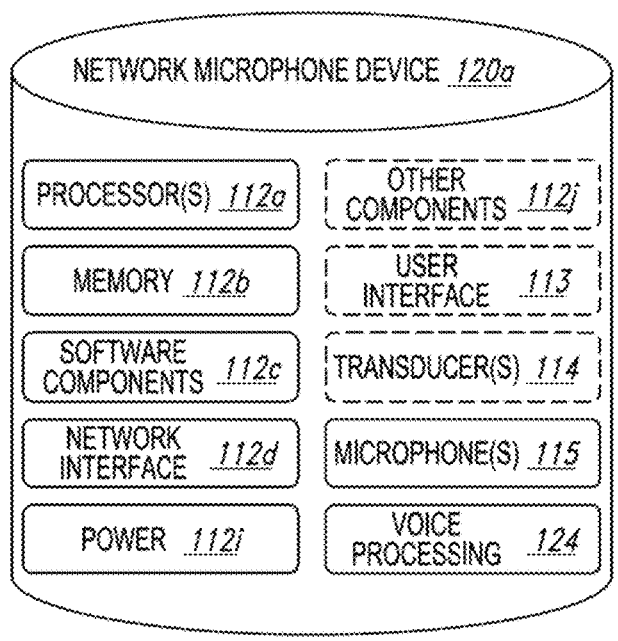
FIG. 1F is a block diagram of an example network microphone device.

FIG. 1F is a block diagram of the NMD 120a (FIGS. 1A and 1B). The NMD 120a includes one or more voice processing components 124 (hereinafter "the voice components 124") and several components described with respect to the playback device 110a (FIG. 1C) including the processors 112a, the memory 112b, and the microphones 115. The NMD 120a optionally comprises other components also included in the playback device 110a (FIG. 1C), such as the user interface 113 and/or the transducers 114. In some embodiments, the NMD 120a is configured as a media playback device (e.g., one or more of the playback devices 110), and further includes, for example, one or more of the audio components 112g (FIG. 1C), the transducers 114, and/or other playback device components. In certain embodiments, the NMD 120a comprises an Internet of Things (IoT) device such as, for example, a thermostat, alarm panel, fire and/or smoke detector, etc. In some embodiments, the NMD 120a comprises the microphones 115, the voice processing components 124, and only a portion of the components of the electronics 112 described above with respect to FIG. 1B. In some aspects, for example, the NMD 120a includes the processor 112a and the memory 112b (FIG. 1B), while omitting one or more other components of the electronics 112. In some embodiments, the NMD 120*a* includes additional components (e.g., one or more sensors, cameras, thermometers, barometers, hygrometers).

Figure 1G:
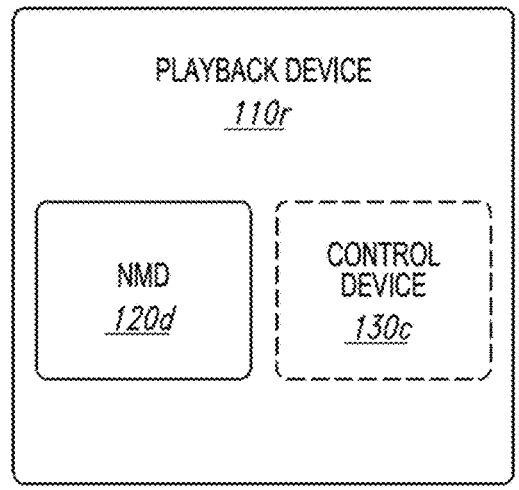
FIG. 1G is a block diagram of an example playback device.

In some embodiments, an NMD can be integrated into a playback device. FIG. 1G is a block diagram of a playback device 110*r* comprising an NMD 120*d*. The playback device 110*r* can comprise many or all of the components of the playback device 110*a* and further include the microphones 115 and voice processing components 124 (FIG. 1F). The microphones 115 are configured to detect sound (i.e., acoustic waves) in the environment of the playback device 110*r*, which is then provided to voice processing components 124. More specifically, each microphone 115 is configured to detect sound and convert the sound into a digital or analog signal representative of the detected sound, which can then cause the voice processing component to perform various functions based on the detected sound, as described in greater detail below. In some implementations, the microphones 115 may be arranged as an array of microphones (e.g., an array of six microphones). In some implementations the playback device 110*r* may include fewer than six microphones or more than six microphones. The playback device 110*r* optionally includes an integrated control device 130*c*. The control device 130*c* can comprise, for example, a user interface configured to receive user input (e.g., touch input, voice input) without a separate control device. In other embodiments, however, the playback device 110*r* receives commands from a separate control device (e.g., the control device 130*a* of FIG. 1B).

In operation, the voice-processing components 124 are generally configured to detect and process sound received via the microphones 115, identify potential voice input in the detected sound, and extract detected-sound data to enable a VAS, such as the VAS 190 (FIG. 1B), to process voice input identified in the detected-sound data. The voice processing components 124 may include one or more analog-to-digital converters, an acoustic echo canceller ("AEC"), a spatial processor (e.g., one or more multi-channel Wiener filters, one or more other filters, and/or one or more beam former components), one or more buffers (e.g., one or more circular buffers), one or more wake-word engines, one or more voice extractors, and/or one or more speech processing components (e.g., components configured to recognize a voice of a particular user or a particular set of users associated with a household), among other example voice processing components. In example implementations, the voice processing components 124 may include or otherwise take the form of one or more DSPs or one or more modules of a DSP. In this respect, certain voice processing components 124 may be configured with particular parameters (e.g., gain and/or spectral parameters) that may be modified or otherwise tuned to achieve particular functions. In some implementations, one or more of the voice processing components 124 may be a subcomponent of the processor 112*a*.

In some implementations, the voice-processing components 124 may detect and store a user's voice profile, which may be associated with a user account of the MPS 100. For example, voice profiles may be stored as and/or compared to variables stored in a set of command information or data table. The voice profile may include aspects of the tone of frequency of a user's voice and/or other unique aspects of the user's voice, such as those described in previously-referenced U.S. Pat. No. 10,499,146.

Referring again to FIG. 1F, the microphones 115 are configured to acquire, capture, and/or receive sound from an environment (e.g., the environment 101 of FIG. 1A) and/or a room in which the NMD 120*a* is positioned. The received sound can include, for example, vocal utterances, audio played back by the NMD 120*a* and/or another playback device, background voices, ambient sounds, etc. The microphones 115 convert the received sound into electrical signals to produce microphone data. The voice processing components 124 receive and analyze the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing components 124 monitor the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home.

d. Suitable Controller Devices

Figure 1H:
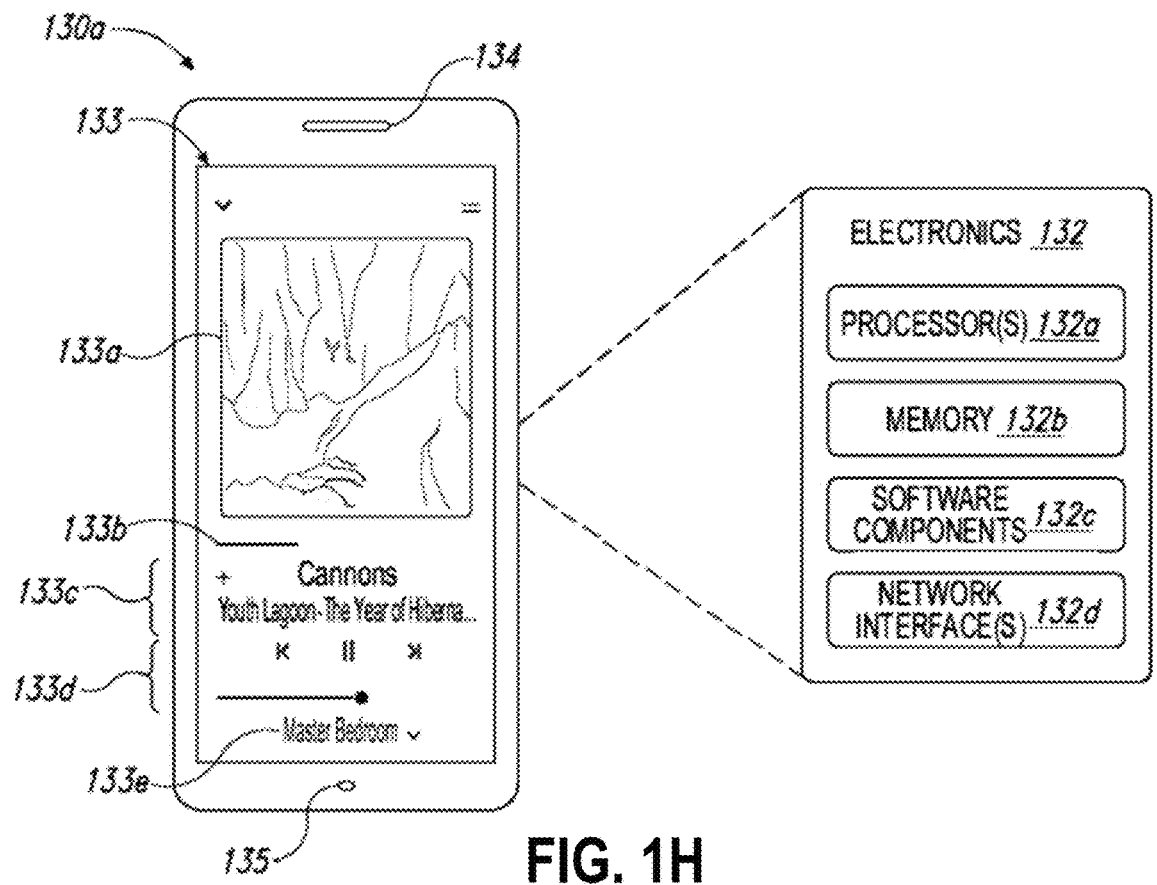
FIG. 1H is a partially schematic diagram of an example control device.

FIG. 1H is a partially schematic diagram of one of the control device 130*a* (FIGS. 1A and 1B). As used herein, the term "control device" can be used interchangeably with "controller," "controller device," or "control system." Among other features, the control device 130*a* is configured to receive user input related to the MPS 100 and, in response, cause one or more devices in the MPS 100 to perform an action(s) and/or an operation(s) corresponding to the user input. In the illustrated embodiment, the control device 130*a* comprises a smartphone (e.g., an iPhone™, an Android phone, etc.) on which media playback system controller application software is installed. In some embodiments, the control device 130*a* comprises, for example, a tablet (e.g., an iPad™), a computer (e.g., a laptop computer, a desktop computer), and/or another suitable device (e.g., a television, an automobile audio head unit, an IoT device). In certain embodiments, the control device 130*a* comprises a dedicated controller for the MPS 100. In other embodiments, as described above with respect to FIG. 1G, the control device 130*a* is integrated into another device in the MPS 100 (e.g., one more of the playback devices 110, NMDs 120, and/or other suitable devices configured to communicate over a network).

The control device 130*a* includes electronics 132, a user interface 133, one or more speakers 134, and one or more microphones 135. The electronics 132 comprise one or more processors 132*a* (referred to hereinafter as "the processors 132*a*"), a memory 132*b*, software components 132*c*, and a network interface 132*d*. The processor 132*a* can be configured to perform functions relevant to facilitating user access, control, and configuration of the MPS 100. The memory 132*b* can comprise data storage that can be loaded with one or more of the software components executable by the processor 302 to perform those functions. The software components 132*c* can comprise applications and/or other executable software configured to facilitate control of the MPS 100. The memory 112*b* can be configured to store, for example, the software components 132*c*, media playback system controller application software, and/or other data associated with the MPS 100 and the user.

The network interface 132*d* is configured to facilitate network communications between the control device 130*a* and one or more other devices in the MPS 100, and/or one or more remote devices. In some embodiments, the network interface 132*d* is configured to operate according to one or more suitable communication industry standards (e.g., infrared, radio, wired standards including IEEE 802.3, wireless standards including IEEE 802.11a, 802.11b, 802.11g, 802.12, 802.11ac, 802.15, 4G, LTE). The network interface 132*d* can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132*d* can transmit a playback device control command (e.g., volume control, audio playback control, audio content selection) from the control device 130*a* to one or more of the playback devices 100. The network interface 132*d* can also transmit and/or receive configuration changes such as, for example, adding/removing one or more playback devices 100 to/from a zone, adding/removing one or more zones to/from a zone group, forming a bonded or consolidated player, separating one or more playback devices from a bonded or consolidated player, among other changes. Additional description of zones and groups can be found below with respect to FIGS. 1J through 2.

Figure 1I:
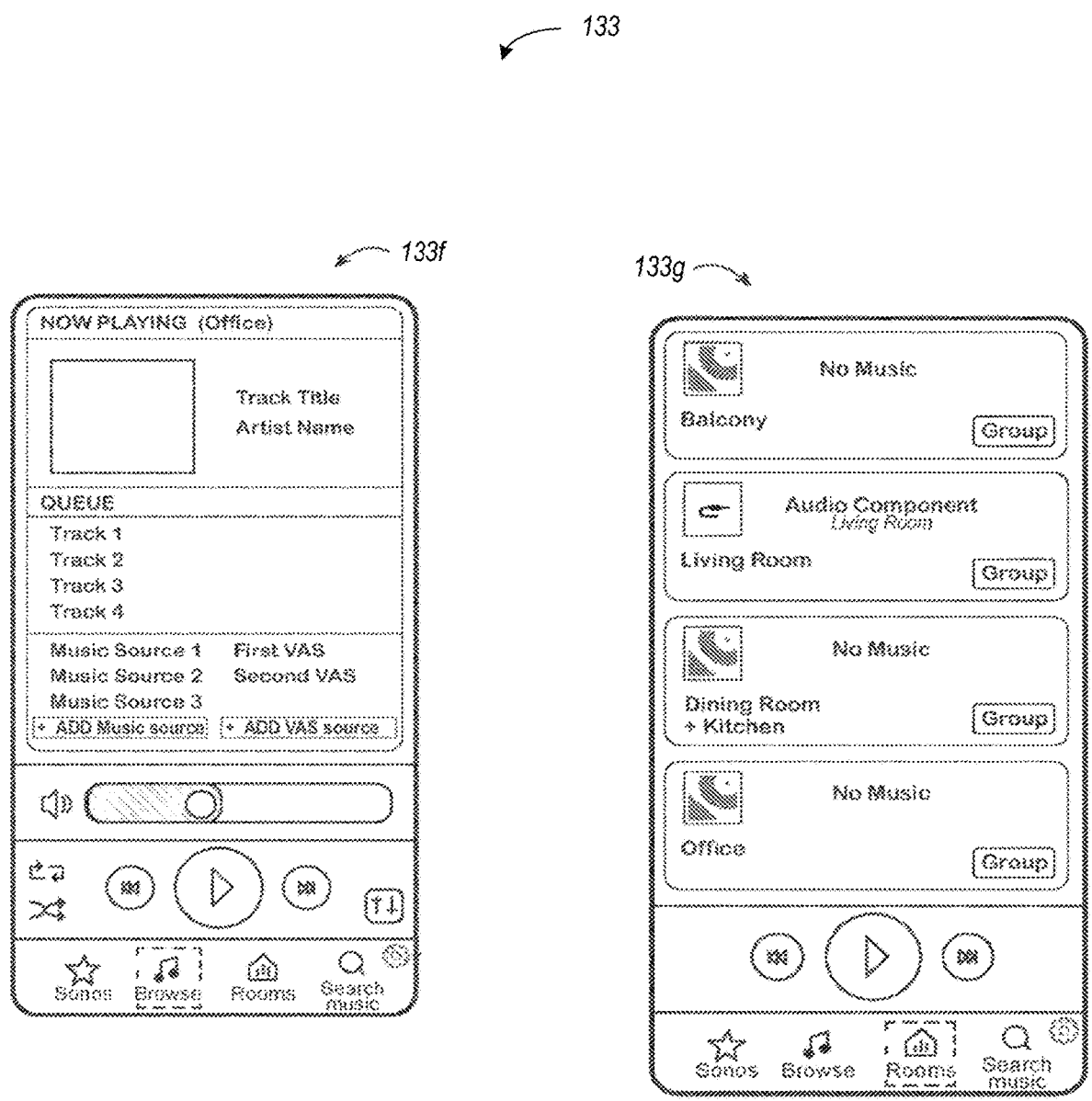
FIG. 1I is a schematic diagram of example user interfaces of the example control device of FIG. 1H.

The user interface 133 is configured to receive user input and can facilitate control of the MPS 100. The user interface 133 includes media content art 133*a* (e.g., album art, lyrics, videos), a playback status indicator 133*b* (e.g., an elapsed and/or remaining time indicator), media content information region 133*c*, a playback control region 133*d*, and a zone indicator 133*e*. The media content information region 133*c* can include a display of relevant information (e.g., title, artist, album, genre, release year) about media content currently playing and/or media content in a queue or playlist. The playback control region 133*d* can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133*d* may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone, etc.). In some embodiments, however, user interfaces of varying formats, styles, and interactive sequences may alternatively be implemented on one or more network devices to provide comparable control access to a media playback system. FIG. 1I shows two additional example user interface displays 133*f* and 133*g* of user interface 133. Additional examples are also possible.

The one or more speakers 134 (e.g., one or more transducers) can be configured to output sound to the user of the control device 130*a*. In some embodiments, the one or more speakers comprise individual transducers configured to correspondingly output low frequencies, mid-range frequencies, and/or high frequencies. In some aspects, for example, the control device 130*a* is configured as a playback device (e.g., one of the playback devices 110). Similarly, in some embodiments the control device 130*a* is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130*a* is configured to operate as playback device and an NMD. In other embodiments, however, the control device 130*a* omits the one or more speakers 134 and/or the one or more microphones 135. For instance, the control device 130*a* may comprise a device (e.g., a thermostat, an IoT device, a network device, etc.) comprising a portion of the electronics 132 and the user interface 133 (e.g., a touch screen) without any speakers or microphones.

e. Suitable Playback Device Configurations

Figure 1J:
FIGS. 1J, 1K, 1L, and 1M are schematic diagrams of example media playback system zones.
Figure 1K:
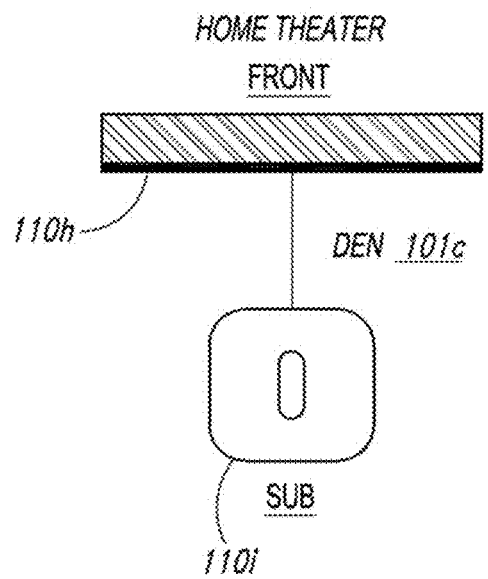
Figure 1L:
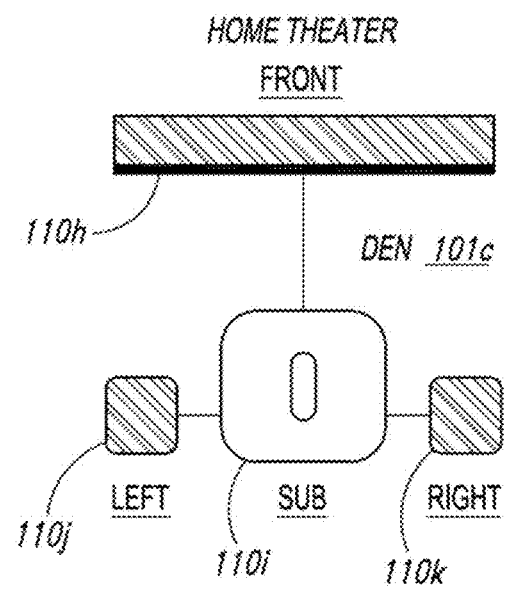
Figure 1M:
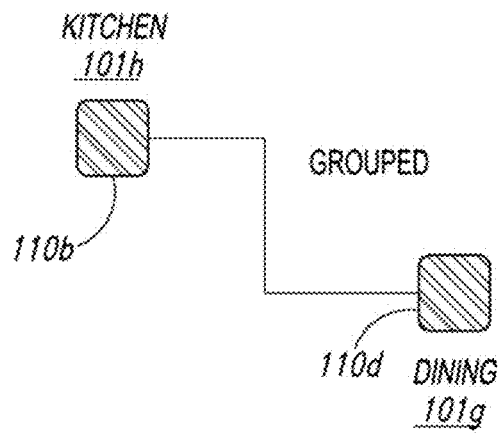
Figure 1N:
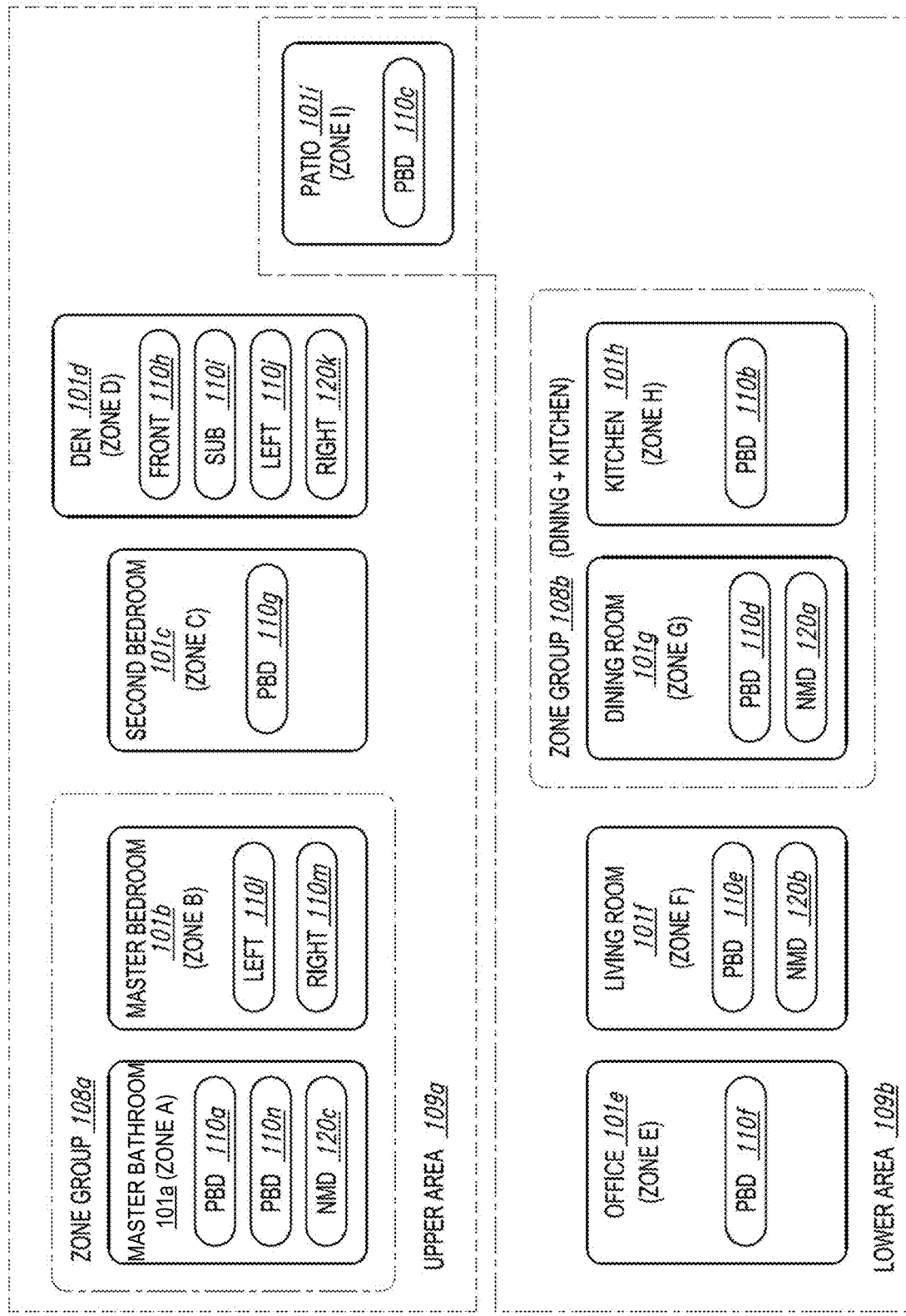
FIG. 1N is a schematic diagram of example media playback system areas.

FIGS. 1J, 1K, 1L, 1M, and 1N show example configurations of playback devices in zones and zone groups. Referring first to FIG. 1N, in one example, a single playback device may belong to a zone. For example, the playback device 110*g* in the Second Bedroom 101*c* (FIG. 1A) may belong to Zone C. In some implementations described below, multiple playback devices may be "bonded" to form a "bonded pair" which together form a single zone. For example, the playback device 110*l* (e.g., a left playback device) can be bonded to the playback device 110*m* (e.g., a right playback device) to form Zone B. Bonded playback devices may have different playback responsibilities (e.g., channel responsibilities). In another implementation described below, multiple playback devices may be merged to form a single zone. For example, the playback device 110*h* (e.g., a front playback device) may be merged with the playback device 110*i* (e.g., a subwoofer), and the playback devices 110*j* and 110*k* (e.g., left and right surround speakers, respectively) to form a single Zone D. In another example, the playback zones 110*g* and 110*h* can be merged to form a merged group or a zone group 108*b*. The merged playback zones 110*g* and 110*h* may not be specifically assigned different playback responsibilities. That is, the merged playback zones 110*g* and 110*h* may, aside from playing audio content in synchrony, each play audio content as they would if they were not merged.

Each zone in the MPS 100 may be provided for control as a single user interface (UI) entity. For example, Zone A may be provided as a single entity named Master Bathroom. Zone B may be provided as a single entity named Master Bedroom. Zone C may be provided as a single entity named Second Bedroom. the playback device 110*a* can be bonded to the playback device 110*n* and the NMD 120*c* to form Zone A. As another example, In some implementations, playback devices that are bonded may have different playback responsibilities, such as responsibilities for certain audio channels. For example, as shown in FIG. 1J, the playback devices 110*l* and 110*m* may be bonded so as to produce or enhance a stereo effect of audio content. In this example, the playback device 110*l* may be configured to play a left channel audio component, while the playback device 110*m* may be configured to play a right channel audio component. In some implementations, such stereo bonding may be referred to as "pairing."

Additionally, bonded playback devices may have additional and/or different respective speaker drivers. As shown in FIG. 1K, the playback device 110*h* named Front may be bonded with the playback device 110*i* named SUB. The Front device 110*h* can be configured to render a range of mid to high frequencies and the SUB device 110*i* can be configured to render low frequencies. When unbonded, however, the Front device 110*h* can be configured to render a full range of frequencies. As another example, FIG. 1L shows the Front and SUB devices 110*h* and 110*i* further bonded with Left and Right playback devices 110*j* and 110*k*, respectively. In some implementations, the Right and Left devices 110*j* and 110*k* can be configured to form surround or "satellite" channels of a home theater system. The bonded playback devices 110*h*, 110*i*, 110*j*, and 110*k* may form a single Zone D (FIG. 1N).

In other implementations, playback devices that are merged may not have assigned playback responsibilities and may each render the full range of audio content of which the respective playback device is capable. Nevertheless, merged devices may be represented as a single UI entity (i.e., a zone, as discussed above). For instance, the playback devices 110*a* and 110*n* in the master bathroom have the single UI entity of Zone A (FIG. 1N). In one embodiment, the playback devices 110*a* and 110*n* may each output the full range of audio content of which each respective playback devices 110*a* and 110*n* is capable, in synchrony.

In some embodiments, an NMD is bonded or merged with one or more other devices so as to form a zone. As one example, the NMD 120*c* may be merged with the playback devices 110*a* and 110*n* to form Zone A. As another example, the NMD 120*b* may be bonded with the playback device 110*e*, which together form Zone F, named Living Room. In other embodiments, a stand-alone network microphone device may be in a zone by itself. In still other embodiments, however, a stand-alone network microphone device may not be associated with a zone. Additional details regarding associating network microphone devices and playback devices as designated or default devices may be found, for example, in previously referenced U.S. Pat. No. 10,499,146.

Zones of individual, bonded, and/or merged devices may be grouped to form a zone group. For example, referring to FIG. 1N, Zone A may be grouped with Zone B to form a zone group 108*a* that includes the two zones. Similarly, Zone G may be grouped with Zone H to form the zone group 108*b*. As another example, Zone A may be grouped with one or more other Zones C-I. The Zones A-I may be grouped and ungrouped in numerous ways. For example, three, four, five, or more (e.g., all) of the Zones A-I may be grouped. When grouped, the zones of individual and/or bonded playback devices may play back audio in synchrony with one another, as described in previously referenced U.S. Pat. No. 8,234, 395. Playback devices may be dynamically grouped and ungrouped to form new or different groups that synchronously play back audio content.

In various implementations, the names of one or more zones in an environment may serve as the default names of zones within a zone group or may be combined to form the name of the zone group. For example, Zone Group 108*b* can be assigned a name such as "Dining+Kitchen", as shown in FIG. 1N. In some embodiments, a zone group may be given a unique name selected by a user.

Certain data may be stored in a memory of a playback device (e.g., the memory 112*c* of FIG. 1C) as one or more state variables that are periodically updated and used to describe the state of a playback zone, the playback device(s), and/or a zone group associated therewith. The memory may also include the data associated with the state of the other devices of the media system and shared from time to time among the devices so that one or more of the devices have the most recent data associated with the system.

In some embodiments, the memory may store instances of various variable types associated with the states. Variables instances may be stored with identifiers (e.g., tags) corresponding to type. For example, certain identifiers may be a first type "a1" to identify playback device(s) of a zone, a second type "b1" to identify playback device(s) that may be bonded in the zone, and a third type "c1" to identify a zone group to which the zone may belong. As a related example, identifiers associated with the Second Bedroom 101*c* may indicate that the playback device 110*g* is the only playback device of the Zone C and that the Second Bedroom 101*c* is not in a zone group. Identifiers associated with the Den 101*d* may indicate that the Den 101*d* is not grouped with other zones but includes bonded playback devices 110*h*-110*k*. Identifiers associated with the Dining Room 101*g* may indicate that the Dining Room 101*g* is part of the Dining+Kitchen zone group 108*b* and that playback devices 110*b* and 110*b* (and the NMD 120*a*) are grouped (FIG. 1M). Identifiers associated with the Kitchen 101*h* may indicate the same or similar information by virtue of the Kitchen 101*h* being part of the Dining+Kitchen zone group 108*b*. Other example zone variables and identifiers are described below.

In yet another example, the MPS 100 may include variables or identifiers representing other associations of zones and zone groups, such as identifiers associated with Areas, as shown in FIG. 1N. An area may involve a cluster of zone groups and/or zones not within a zone group. For instance, FIG. 1N shows an Upper Area 109*a* including Zones A-D, and a Lower Area 109*b* including Zones E-I. In one aspect, an Area may be used to invoke a cluster of zone groups and/or zones that share one or more zones and/or zone groups of another cluster. In another aspect, this differs from a zone group, which does not share a zone with another zone group. Further examples of techniques for implementing Areas may be found, for example, in U.S. Pat. No. 10,712, 997 issued Jul. 14, 2020 and titled "Room Association Based on Name," and U.S. Pat. No. 8,483,853 issued Jul. 9, 2013, and titled "Controlling and manipulating groupings in a multi-zone media system," each of which is incorporated herein by reference in its entirety. In some embodiments, the MPS 100 may not implement Areas, in which case the system may not store variables associated with Areas.

Figure 3:
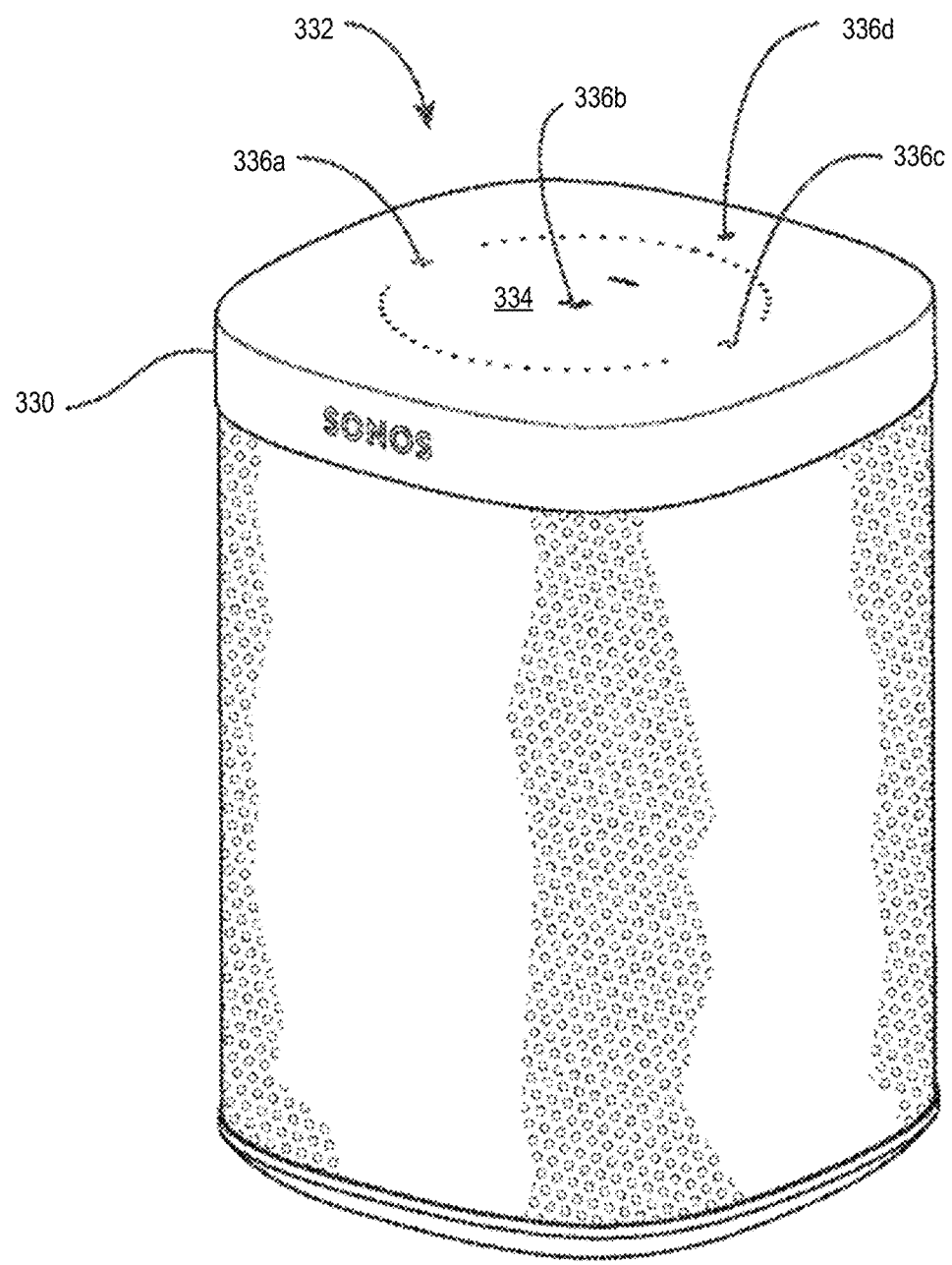
FIG. 3 is an isometric diagram of an example playback device housing.

FIG. 3 shows an example housing 330 of the playback device 110 that includes a user interface in the form of a control area 332 at a top portion 334 of the housing 330. The control area 332 includes buttons 336*a*, 336*b*, and 336*c* for controlling audio playback, volume level, and other functions. The control area 332 also includes a button 336*d* for toggling microphones (not visible in FIG. 3) of the playback device 110 to either an on state or an off state. The control area 332 is at least partially surrounded by apertures formed in the top portion 334 of the housing 330 through which the microphones receive the sound in the environment of the playback device 110. The microphones may be arranged in various positions along and/or within the top portion 334 or other areas of the housing 330 so as to detect sound from one or more directions relative to the playback device 110.

f. Audio Content

Audio content may be any type of media content now known or later developed. For example, in some embodiments, the audio content includes any one or more of: (i) streaming music or other audio (e.g., podcasts, news channels, radios, etc.) obtained from a streaming media service, such as Spotify, Pandora, Sonos HD Radio™ or other streaming media services; (ii) streaming music or other audio from a local music library, such as a music library stored on a user's laptop computer, desktop computer, smartphone, tablet, home server, or other computing device now known or later developed; (iii) audio content associated with video content, such as audio associated with a television program or movie received from any of a television, set-top box, Digital Video Recorder, Digital Video Disc player, streaming video service, or any other source of audio-visual media content now known or later developed; (iv) text-to-speech or other audible content from a voice assistant service (VAS), such as Amazon Alexa, Google Assistant, and/or other VAS services now known or later developed; (v) audio content from a doorbell or intercom system such as Nest, Ring, or other doorbells or intercom systems now known or later developed; and/or (vi) audio content from a telephone, video phone, video/teleconferencing system or other application configured to allow users to communicate with each other via audio and/or video.

A media content source is any system, device, or application that generates, provides, or otherwise makes available any of the aforementioned audio content to a playback device. For example, in some embodiments, a media content source includes any one or more of a streaming media (audio, video) service, digital media server or other computing system, VAS service, television, cable set-top-box, streaming media player (e.g., AppleTV, Roku, gaming console), CD/DVD player, doorbell, intercom, telephone, tablet, or any other source of digital audio content.

A playback device that receives or otherwise obtains media content from a media content source for playback and/or distribution to other playback devices may be referred to herein as the "sourcing" playback device, "master" playback device, or "group coordinator." In operation, a sourcing playback device may obtain any of the aforementioned types of media content from a media content source via an interface on the playback device, e.g., one of the sourcing playback device's network interfaces, a "line-in" analog interface, a digital audio interface, or any other interface suitable for receiving audio content in digital or analog format now known or later developed. Further, the sourcing playback device may process received media content for playback and/or distribution to other playback devices. In some embodiments, the sourcing playback device transmits the processed audio content to all the playback devices that are configured to play the audio content. In some embodiments, the sourcing playback device transmits the processed audio content to a multicast network address, and all the other playback devices configured to play the audio content receive the audio content via that multicast address. In some embodiments, the sourcing playback device alternatively transmits the processed audio content to each unicast network address of each other playback device configured to play the audio content, and each of the other playback devices configured to play the audio content receive the audio content via its unicast address.

A group coordinator may employ various synchrony techniques to provide audio content and timing information to one or more group members to facilitate synchronous playback among the group coordinator and the group members. In some embodiments, at least some aspects of the technical solutions derive from the technical structure and organization of the audio information, playback timing, and clock timing information that the playback devices use to play audio content from audio sources in synchrony with each other, including how different playback devices generate playback timing based on clock timing (local clock timing or remote clock timing) and play audio content based on playback timing (generated locally or remotely) and clock timing (generated locally or remotely). Additional details regarding audio playback synchronization among playback devices and/or zones can be found, for example, in U.S. Pat. No. 8,234,395 entitled, "System and Method for Synchronizing Operations Among a Plurality of Independently Clocked Digital Data Processing Devices," which is incorporated herein by reference in its entirety.

III. Audio Layering: Example Playback Roles—Methods and Systems

In some instances, a room or a zone can have two or more playback devices. The two or more playback devices may be assigned different playback roles while located in the same room or zone. For example, a first playback device, such as playback device 110*l*, in a baby's room may be placed on a nightstand near a sleeping baby, and may be designated to play back a first type of audio content, such as music (e.g., lullaby), at a first volume. A second playback device, such as playback device 110*m*, in the baby's room may be designated to play back a second type of audio content, such as ambient music (e.g., sleep machine, rain fall, brown noise, white noise), at a second volume. The first playback device and the second playback device may play back their respective audio content types concurrently to provide a spatial layering of audio and mixing of different audio content.

The first playback device or the second playback device may be coordinated with a lighting element such as a network-connected lamp (e.g., a smart lamp) or have a network-connected light bulb (e.g., smart bulb). The lighting element may be set to a particular color and/or brightness to accompany the audio content being played back by the first playback device and/or the second playback device. As one example, if one of the first or second playback devices is playing back sounds of rain, the color of the lighting element may be set to blue to correspond to an aquatic environment. As another example, if one of the first or second playback devices is playing back sounds of a jungle, the color of the lighting element may be set to green to correspond to a jungle environment.

In some instances, the lighting element may include a projection element to project images on a ceiling or a wall. For example, the lighting element may be able to project jungle animals on the wall when jungle sounds are being played back. Further, individual animals in a jungle image that is being projected may rotate in a circular motion to mimic the movement of a baby mobile. The rotation speed of the mobile image may be based on a tempo or beat, for example, of the lullaby being played back. Specific beats or accents in the music may line up with movement in the image. As yet another example, the lighting element may project images of water when sounds of an ocean or rainfall are being played.

This spatial layering effect can be achieved by dynamically assigning playback roles to the playback devices, triggering a scene (e.g., bedtime scene), or grouping of the playback devices. Example playback roles for playback devices include an "individual" playback role, a "personal" playback role, or a "room-filling" playback role. Each of these roles may have particular settings such as a volume or a directionality of audio and may be associated with particular types of audio content.

The individual playback role may be associated with any type of playback device and may be regularly used with smaller, portable, and/or handheld size playback devices or wearable playback devices (e.g., headphones, earphones, etc.). A user may select the individual playback role for a solo listening session or for a listening session based on the user's content preferences.

The personal playback role may be used for intimate or personal listening. A user may select the personal playback role when the user intends to sit near the playback device to create a personal listening atmosphere. The volume of the playback device may be preset or limited to a range of volumes that are comfortable for listening within a short proximity of the playback device. This short proximity may be a personal listening area within a room (e.g., within 5 feet of the playback device). The personal listening role may be associated with spoken word content such as podcasts or audiobooks or short proximity audio for a layered audio effect.

The room-filling playback role may be used for audio that is intended to fill a room for out-loud listening or with ambient or background audio. The room-filling playback role can be associated with a louder preset volume for out-loud listening (e.g., music, podcasts, etc.) and lower volume for ambient or background audio content. Room-filling playback role may be determined based on the type of playback device. For example, in-ceiling, wall-mounted, or floor-standing playback devices may be automatically assigned the room-filling playback role or may use the room-filing playback role as the default playback role.

Other playback roles are also possible. For example, an ambient audio playback role could be specifically used for ambient audio content such as soundscapes or sleep machine audio. Additionally, more than one playback device in a room may have the same playback role. For example, in a bedroom, a first playback device and a second playback device may both be assigned a personal playback role, and a third playback device may be assigned a room-filling playback role. Different volume limits or ranges may be saved for different playback roles. The limits may be default limits or user defined. For example, a maximum volume for personal listening role or ambient audio role may be limited to 75% of the maximum volume the playback device is capable of producing, or for a range between 25% to 75% of the total volume range of the playback device. For the room-filling playback role, the entire volume range that the playback device is capable of producing could be available (e.g., 0 to 100%).

Similar to playback roles, lighting elements may be associated with a particular lighting role. For example, a floor lamp or a ceiling room light may be associated with a room-filling lighting role. As another example, a table lamp may be associated with an ambient lighting role, and a desk light or other small light or candle-like light might be associated with a personal lighting role. Similar to volume limits and/or ranges for playback roles, lighting roles may have different brightness limits and/or ranges. For example, for the room-filling lighting role, a full range of brightness may be available (e.g., 0% to 100% brightness), whereas for the ambient lighting role, only a subset of the full range of brightness may be available.

Playback role may be triggered or assigned in various ways. For example, playback devices in a same room may be assigned different playback roles dynamically (e.g. based on a current room in which the playback device is located), based on group configuration, or based on scenes.

As one possibility, playback roles may be triggered or assigned dynamically. For example, a room may have at least a first and a second playback device. To dynamically assign playback roles, a user may use a controller to identify the first playback device as being associated with the personal playback role, and the second playback device as being associated with the room-filling playback role. The roles for each playback device may be stored in a state variable or a settings file in one or both of the first or second playback devices. The first and/or second playback device may copy the state variable or settings to one or more other devices of the media playback system such that each playback device in the media playback system stores the settings file in its local memory. The roles for each playback device may be stored in a table with identifiers for the playback devices and zone information. An example of such a table is shown in Table 1 below.

| Playback Device | Device ID | Device Name | Playback Role |
| --- | --- | --- | --- |
| Playback Device 1 | ABC1234 | Bedroom | Room-Filling |
| Playback Device 2 | ABC5678 | Kitchen | Room-Filling |
| Playback Device 3 | ABC2345 | Nightstand | Personal |

In some instances, a user may specify a location (e.g., room, zone, etc.) of a playback device during setup, and the location of the playback device can be used to automatically assign a default role to a playback device. For example, if the first playback device is set up in the baby's room and the user indicates that the first playback device is located on the nightstand, the system may assign a personal listening role to the first playback device as the default role. When the user sets up the second playback device in the baby's room, the system may automatically assign the second playback device to the room-filling role. In some instances, the user may be prompted to select a playback role for the second playback device. In other examples, certain types of playback devices can be associated with a particular default role. For example, a wearable playback device (e.g., headphones, earphones, etc.) may be assigned to an individual playback role by default.

As another possibility, playback roles may be triggered or assigned based on group configuration. In some instances, when a first playback device with a first role is grouped with a second playback device with a second role that is different from the first role, each playback device maintains its respective playback role. For example, the first playback device may be configured for a room-filling role, and the second playback device may be configured for an ambient role. When a group is formed with the first playback device and the second playback device, the first playback device may continue operating in the room-filling role, and the second playback device may continue operating in the ambient role.

In other instances, when a first playback device with a first role is grouped with a second playback device with a second role that is different from the first role, either the first role or the second role may be used for all playback devices in the group. For example, the first playback device may be configured for a room-filling role, and the second playback device may be configured for an ambient role. When a group is formed with the first playback device and the second playback device, the second device may be assigned the room-filling role while in the group with the first playback device and may transition from operating in the ambient role to operating in the room-filling role. After leaving the group, the second device may return to operating in the ambient role.

As yet another possibility, playback roles may be triggered or assigned through the use of scenes. For example, a room may have at least a first and a second playback device. A user may save a routine or scene named "Bedtime." While active, the Bedtime scene may assign the first playback device the personal playback role and the second playback device the room-filling playback role. The Bedtime scene may specify the audio content being played, which may be, for example, generative audio, a sleep noise playlist, a sleep radio station, etc. The Bedtime scene may also specify which role plays which audio. The Bedtime scene can specify a volume for each of the playback devices and/or roles. For example, the room-filling playback device may have a relatively louder volume setting, and the personal playback device may have a relatively quieter volume setting.

In some aspects, the playback roles for the playback devices in a room may be assigned based on the content being played, the time of day, and/or the day of the week. For example, if a user selects a children's audiobook for playback at 7 pm on a weeknight, the media playback system may determine that it is story time and a story time setting. In the story time setting, the audio for a narrator's voice may be associated with the personal playback role, and any sound effects for the audiobook may be associated with the room-filling playback role.

In some aspects, the first playback device may be a playback device that has transducers around the playback device and can play back audio in multiple directions. For example, transducers may be distributed continuously around the speaker to play back audio in 360 degrees. As another example, transducers may be placed at discrete locations to provide directed audio, such as at 0 degrees, 90 degrees, 180 degrees, and 270 degrees. Other examples are possible. When the personal playback role is active on the first playback device, the first playback device may be configured to playback audio in a particular direction within an angular range. For example, the first playback device may direct audio to someone sleeping in a bed and may limit the audio to 180 degrees or less on a side of the playback device facing the bed.

In some instances, the side of the playback device facing away from the bed may be used for ambient or room-filling audio. Thus, a single playback device can be assigned two or more playback roles. The first playback device can receive audio for both the personal playback role and the room-filling role and can determine that the transducers on the side of the first playback device facing the bed should play back the personal playback role audio and the transducers on the side of the first playback device facing away from the bed should play back the ambient audio.

Additional details regarding setting up and activating playback devices in a scene or zone scene can be found, for example, in U.S. Pat. No. 8,483,853 filed on Sep. 11, 2007 and entitled "Controlling and Manipulating Groupings in a Multi-Zone Media System,", and in U.S. Pat. No. 10,248, 376 filed on Jun. 11, 2015 and entitled "Multiple Groupings in a Playback System,", each of which is incorporated herein by reference in its entirety.

Additional details regarding having two or more playback devices coordinate playback of different audio content can be found, for example, in U.S. Pat. No. 10,028,069 filed on Jun. 22, 2017 and entitled, "Immersive Audio in a Media Playback System,", which is incorporated herein by reference in its entirety. For example, the first playback device may be treated as a playback device in a primary zone, and the second playback device may be a playback device in an auxiliary zone. The first and second playback devices may be grouped and/or audio may be distributed to the first and second playback devices as described in U.S. Pat. No. 10,028,069.

IV. Example Scene System

A scene system may include an audio scene, a light scene, and/or a sequence of scenes. A sleep scene system may be a sequence of scenes designed to support the natural progression of a user's sleep cycle. The sequence of scenes may include an audio scene component and a light scene component.

The scene system may monitor a user's sleep cycle by communicating with a sleep tracking device associated with the user. For example, if the user is wearing a sleep tracker or if the user is sleeping on a smart mat or smart bed (e.g., a baby), the scene system can monitor the sleep cycles of the user based on feedback from the sleep tracker or the smart mat/smart bed. The scene system may start with a sleep machine sound such as rainfall until the scene system receives information from the sleep tracker that the user has fallen asleep. The sleep tracking device may determine wakefulness based on movement of the user such as through changing physical contact points on a smart mat or movement determined by an accelerometer or other sensor device. The sleep tracking device may communicate with the media playback system over a wireless network.

After the user has fallen asleep, the scene system may change to a scene that facilitates entering a deep sleep cycle. For example, the audio scene component may be set to sleep soundscapes and the light scene component may be turned off. Once the scene system has received information (based on communicating with the sleep tracking device) that the user is in the deep sleep cycle, the scene system may change to a deep sleep scene that facilitates maintaining the deep sleep cycle (which may, in some instances, be the same scene that facilitates entering the deep sleep cycle). When the user exits the deep sleep cycle, the scene system may change back to a scene that helps the user return to the deep sleep cycle and may change back to the deep sleep scene once the user has returned to the deep sleep cycle.

If the user has set a smart alarm to sound at a time that falls within a window when the user is not in the deep sleep cycle, the scene system may change to a wake up scene when the alarm time is within the user's wake up window. As one example, a smart alarm may be set to 7:30 am and a wake up window—which is a window of time immediately preceding the time the smart alarm is set to go off—would be 7:00 am to 7:30 am for a 30 minute wake up window. The light scene component for the wake up scene may include the bulb temperature mimicking a temperature of early morning sunlight (e.g., 2000-3000 degrees Kelvin) or full sunlight (e.g., 5000 degrees Kelvin). The bulb temperature may gradually increase over the course of the user's wake up window, starting at, for example, 2000 degrees Kelvin and gradually increasing to 3000 degrees Kelvin by the time the alarm starts or the system detects that the user has woken up. The user can set a starting temperature and an ending temperature for the wake-up bulb temperature. As another example, the media playback system may store an alarm time and activate the wake up scene at a predetermined time (e.g., 30 minutes) before the alarm time.

As yet another example, the scene system may reactively change scenes based on mood information. For example, the media playback system may receive information that the smart mat is detecting frequent movement from the user (e.g., the baby), which may indicate that the user is restless. Based on the mood information indicating that the user is restless, and the scene system may change audio playback to audio content that provides a soothing effect to help the user relax and fall asleep. Further, the media playback system may cause a light projection element to display a mobile (e.g., a baby mobile) when the soothing audio content is being played back. After receiving information indicating that the user is no longer restless (e.g., that the user has fallen asleep), the media playback system may change the audio content to, for example, audio content such as sleep music to correspond to the user being asleep.

The scene system may also include other smart home devices such as smart blinds, smart televisions, or smart appliances (e.g., smart thermostat, etc.).

V. Example Modular Playback Device in some implementations, a playback device may be a modular playback device that is formed from two or more separable components. The separable components of the modular playback device may have varying levels of independent functionality when separated from the modular playback device and/or other components of the modular playback device. As one example, the modular playback device may comprise a first speaker component and a second speaker component. Each speaker component may function as an independent playback device, and when the first speaker component is placed in proximity or physically to the connected or coupled to the second speaker component, the first speaker component and the second speaker component may function as a single playback device. Proximity to a nearby speaker can be determined using, for example, NFC technology, wireless signal strength, UWB, and/or an ultrasonic tone.

In another example, the modular playback device may comprise a playback device and a base (e.g., charging base). When the playback device is connected to (e.g., placed on) the base, the playback device may assume a predetermined playback role associated with the base or the location or room of the base. For example, if the playback device is connected to the base in a child's room, it may configure itself to (i) limit voice command functionality and types of audio content available for playback and (ii) enable scenes associated with the child's room such as baby bedtime scenes or story time scenes. If the playback device is disconnected from the base and taken outside of the child's room, the playback device may configure itself to have the same permissions and settings as other devices in the media playback system that are located outside of the child's room and/or in the same room as the modular playback device.

In another example, the modular playback device may comprise a playback device and a lighting element with a charging dock or base for the playback device. The playback device may be mechanically locked into the charging dock or base to prevent a child from removing the playback device from the base or the room. In this regard, the playback device may be configured with child-proof settings while placed in the charging dock. For example, if the playback device has a microphone array to detect voice commands, the playback device may be configured or trained to only respond to an adult's voice in the home. The mechanical lock may be unlocked by the presence of an adult near the playback device. Presence can be detected, for example, by determining that a device (e.g., smartphone, smartwatch, etc.) associated with an adult is nearby (e.g., within a threshold distance) by measuring a Bluetooth signal strength associated with the device. Additionally or alternatively, biometric authentication such as voice or fingerprint recognition could be used by the playback device to determine the presence of an adult. In some implementations, one or more lighting elements of the modular playback device may form a dedicated control, as will be explained in more detail further below.

Additional details regarding a first playback device joining a group when in proximity with a second playback device can be found, for example, in U.S. Pat. No. 9,329,831 filed on Feb. 25, 2015 and entitled "Playback Expansion," which is incorporated herein by reference in its entirety.

Additional details regarding a playback device being assigned or assuming a zone property based on the device that the playback device is placed on can be found, for example, in U.S. Pat. No. 9,544,701 filed on Jul. 19, 2015 and entitled "Base Properties in a Media Playback System," which is incorporated herein by reference in its entirety.

In yet another example, the modular playback device may have upgradable components. For example, when a given speaker component is replaced with a different, more sophisticated speaker component (e.g., newer model), one or more new features may be enabled. Such features may include a radio playback feature, among other possibilities.

Additional details regarding a first playback device determining that it is in the same room as another playback device or a nearest playback device can be found, for example, in U.S. Pat. No. 11,188,294 filed on Aug. 31, 2020 and entitled "Ultrasonic Transmission for Presence Detection," which is incorporated herein by reference in its entirety.

Figure 4:
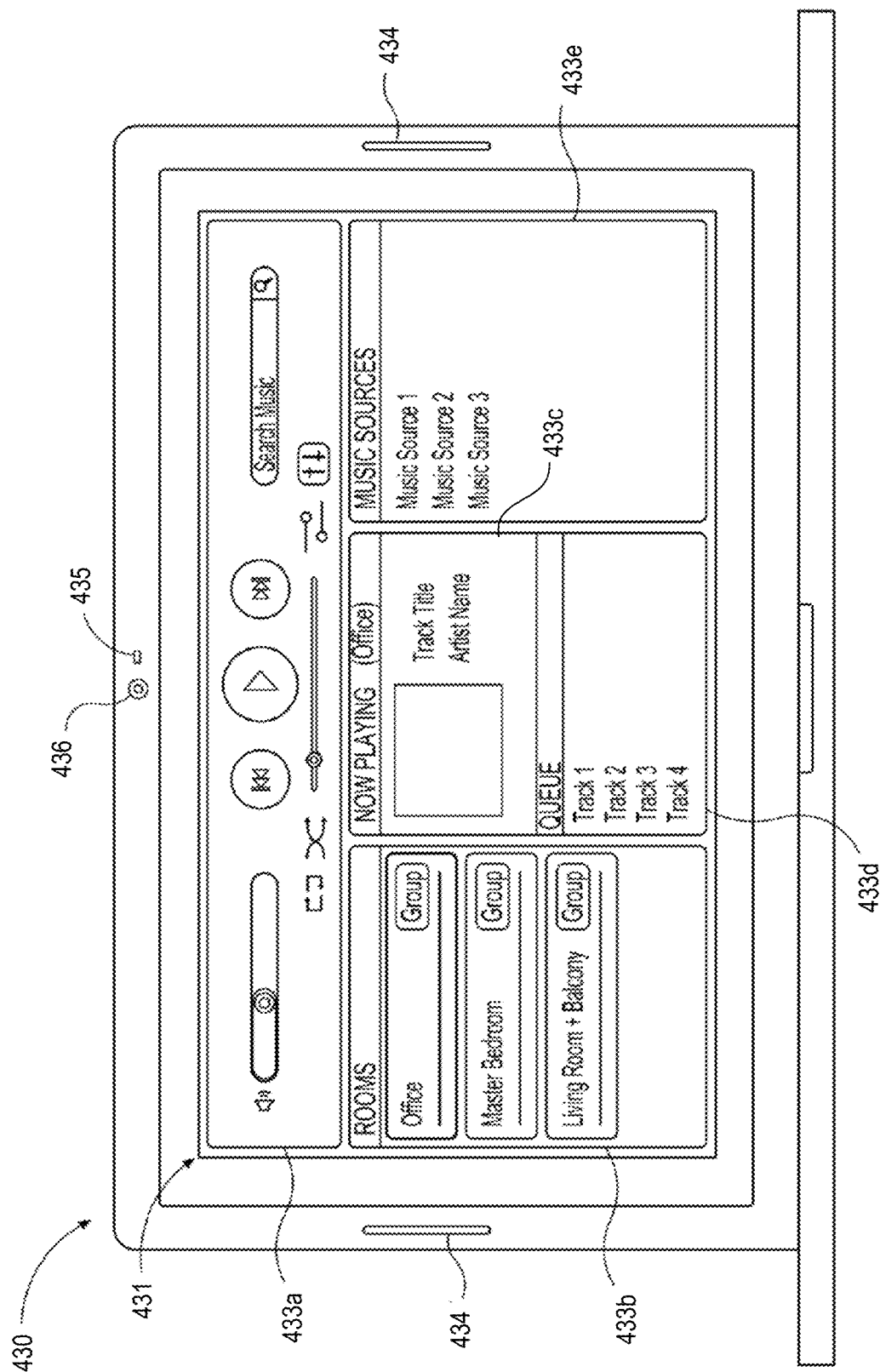
FIG. 4 is a front view of an example control device.

With reference now to FIG. 4, an example control device that may be used to communicate with one or more playback devices for creating an audio layering effect, assigning roles, creating scenes, and/or other implementing other features as described above is shown. FIG. 4 is a schematic diagram of a control device 430 (e.g., a laptop computer, a desktop computer). The control device 430 includes transducers 434, a microphone 435, and a camera 436. A user interface 431 includes a transport control region 433a, a playback zone region 433b, a playback status region 433c, a playback queue region 433d, and a media content source region 433e. The transport control includes one or more controls for controlling media playback including, for example, volume, previous, play/pause, next, repeat, shuffle, track position, crossfade, equalization, etc. The audio content source region 433e includes a listing of one or more media content sources from which a user can select media items for play back and/or adding to a playback queue.

The playback zone region 433b can include representations of playback zones within the media playback system. In some embodiments, the graphical representations of playback zones may be selectable to bring up additional selectable icons to manage and/or configure the playback zones in the media playback system, such as creation of one or more bonded zones, creation of one or more zone groups, separation of one or more zone groups, renaming of one or more zone groups, etc. As shown in FIG. 4, a respective "Group" icon is included with each of the respective graphical representations of the "Office" and "Master Bedroom" playback zones. Each respective "Group" icon may be selectable to surface options to select one or more other zones in the media playback system that may be grouped with the particular zone associated with that "Group" icon. Once grouped, one or more playback devices in a zone that has been grouped with the particular zone can be configured to play audio content in synchrony with the playback device(s) in the particular zone. Analogously, a respective "Group" icon may be included with a graphical representation of a zone group. As shown in FIG. 4, the respective "Group" icon for "Living Room+Balcony" may be selectable to surface options to deselect one or more zones to be removed from the zone group and/or to be added to the zone group. In some embodiments, the control device 430 includes other interactions and implementations for grouping and ungrouping zones via the user interface 431. In certain embodiments, the respective graphical representations of playback zones in the playback zone region 433b may be dynamically updated as playback zone configurations and/or zone group configurations are modified. The selected playback zone or zone group may be visually distinguished on the user interface, such as within the playback zone region 433b and/or the playback queue region 433d.

The playback status region 433c includes graphical representations of audio content that is presently being played, previously played, or scheduled to play next in the selected playback zone or zone group. The graphical representations of the audio content may include track title, artist name, album name, album year, track length, and/or other relevant information that may be useful for the user to know when controlling the media playback system via the user interface 431.

The playback queue region 433d includes graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device. In some embodiments, for example, a playlist can be added to a playback queue, in which information corresponding to each audio item in the playlist may be added to the playback queue. In some embodiments, audio items in a playback queue may be saved as a playlist. In certain embodiments, a playback queue may be empty, or populated but "not in use" when the playback zone or zone group is playing continuously streaming audio content, such as Internet radio that may continue to play until otherwise stopped, rather than discrete audio items that have playback durations. In some embodiments, a playback queue can include Internet radio and/or other streaming audio content items and be "in use" when the playback zone or zone group is playing those items.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, may be associated with a new playback queue that is empty, or may contain audio items from the playback queue associated with the established zone group before the established zone group was ungrouped.

Figure 5:
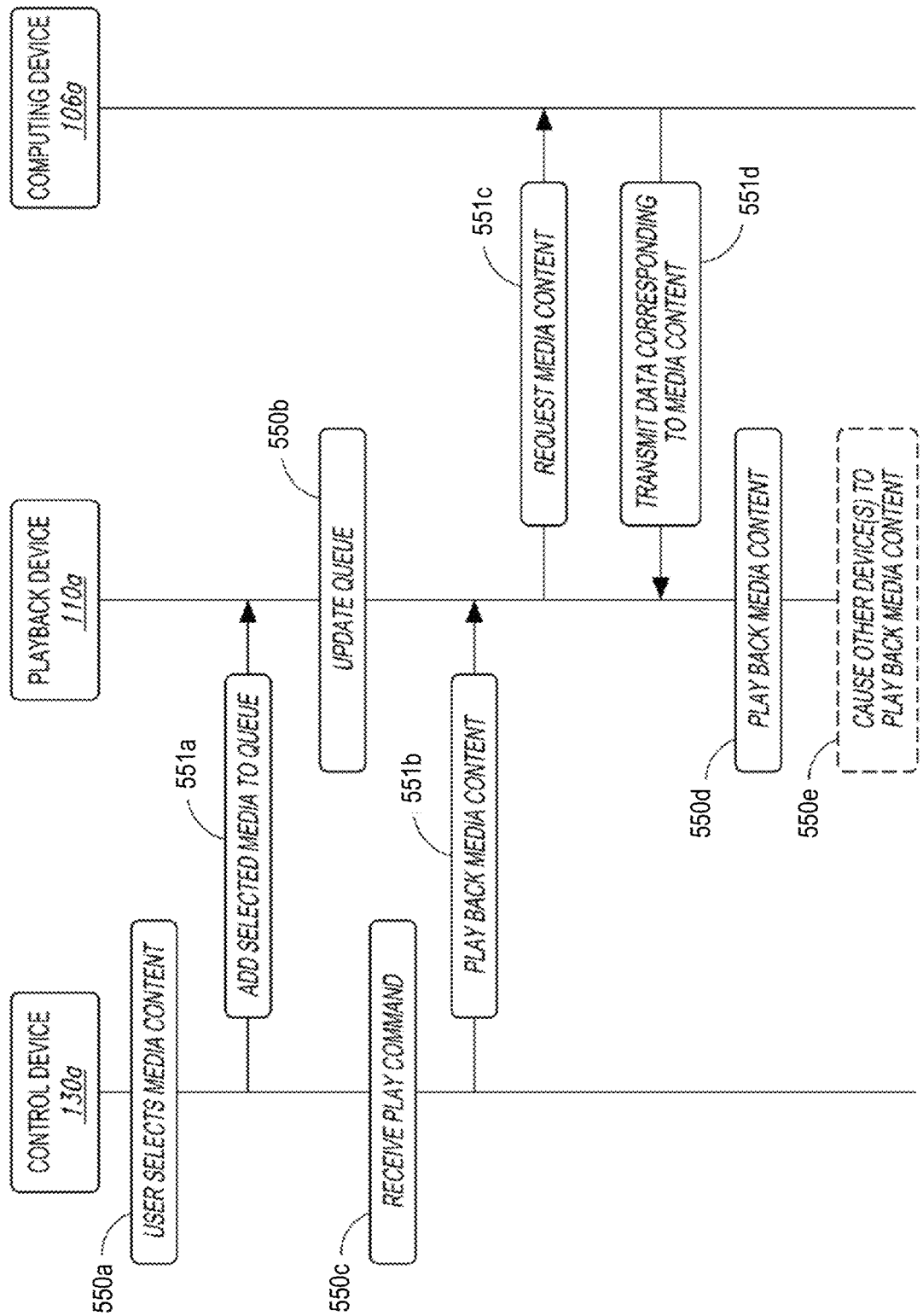
FIG. 5 is an example message flow diagram between playback devices of a media playback system.

FIG. 5 is a message flow diagram illustrating example data exchanges between devices of a media playback system, such as the media playback system 100.

At step 550a, the media playback system 100 receives an indication of selected media content (e.g., one or more songs, albums, playlists, podcasts, videos, stations) via the control device 130a. The selected media content can comprise, for example, media items stored locally on one or more devices (e.g., the audio source 150 of FIG. 1C) connected to the media playback system and/or media items stored on one or more media service servers (one or more of the computing device(s) 106 of FIG. 1B). In response to receiving the indication of the selected media content, the control device 130a transmits a message 551a to the playback device 110a (FIGS. 1A-1C) to add the selected media content to a playback queue associated with the playback device 110a.

At step 550b, the playback device 110a receives the message 551a and adds the selected media content to the playback queue for playback.

At step 550c, the control device 130a receives input corresponding to a command to play back the selected media content. In response to receiving the input corresponding to the command to play back the selected media content, the control device 130a transmits a message 551b to the playback device 110a causing the playback device 110a to play back the selected media content. In response to receiving the message 551b, the playback device 110a transmits a message 551c to the computing device 106a requesting the selected media content. The computing device 106a, in response to receiving the message 551c, transmits a message 551d comprising data (e.g., audio data, video data, a URL, a URI, etc.) corresponding to the requested media content.

At step 550d, the playback device 110a receives the message 551d with the data corresponding to the requested media content and plays back the associated media content. At step 550e, the playback device 110a optionally causes one or more other devices to play back the selected media content. In one example, the playback device 110a is one of a bonded zone of two or more players (e.g., as shown in FIGS. 1M-1N). The playback device 110a can receive the selected media content and transmit all or a portion of the media content to other devices in the bonded zone. In another example, the playback device 110a may be a coordinator of a group and is configured to transmit and receive timing information from one or more other devices in the group. The other one or more devices in the group can receive the selected media content from the computing device 106a, and begin playback of the selected media content in response to a message from the playback device 110a such that all of the devices in the group play back the selected media content in synchrony.

VI. Example Operation Modes for Targeted Audio Playback & Experiences

As discussed above, sound helps to create and/or support different listening moments, scenes, or listening experiences and foster a more personal, meaningful, and targeted interaction with one's environment. Listening experiences curated for a given listener based on one or more of the listener's characteristics, such as the listener's age, may help create a more purposeful and immersive experience for the listener during various times and stages of the listener's lifecycle. For example, a listening experience for a user who is a newborn or a baby may focus on providing a soothing ambience so as to help the user calm down and/or fall asleep. As another example, a listening experience for a user who is a toddler or of a pre-school age may focus on providing educational and/or other age-restricted audio content such that the user can explore audio content safely without risking exposure to content that may be more appropriate for a more mature or experienced user. In this regard, it may be desirable for a playback device to be configured to operate in a particular mode so as to provide an age-appropriate audio experience for a given user and adapt playback behavior based on the given user's developmental progress and ability to interact with the playback device. It may further be desirable to enable a user to autonomously engage in a desired listening experience in a way that eases reliance on a controller device (e.g., smartphone, tablet, computer, voice input device) to initiate, control, and/or otherwise facilitate the listening experience. Accordingly, disclosed herein are various modes of operation, dedicated controls, and related techniques and embodiments for creating a targeted audio experience.

a. First Mode

An example playback device, such as the playback device 110 of MPS 100 shown in FIG. 1A, may be configured to operate in one or more operation modes such that audio experiences including listening moments, moods, and/or scenes may be curated for a listener in a targeted way. For example, a targeted audio experience may be created for a given listener based on the given listener's age, among other examples.

In general, the playback device may be configured to operate, by default, in a first mode. The first mode may be a standard operating mode targeted for a standard adult user that allows the user to access unlimited playback controls and audio content. The playback device may also be configured to operate in one or more additional modes that provide a user with different levels of access to playback controls and audio content.

In one implementation, a playback device may be designated as a default device for a given type of user. For example, the playback device may be designated as a "child" playback device for a user who is a child. As one possibility, the playback device may be designated as a "child" playback device by a user during initial configuration of the playback device. For example, when setting up the playback device, the user may be prompted, via a user interface (such as the user interface 133 of FIG. 1H) presented by a controller device (such as the controller device 130a of FIG. 1H), with a query to determine if the playback device should be designated as a "child" playback device. For instance, the user may input information indicating the user's age or information indicating that the playback device is located in a room associated with a child user (e.g., a nursery). As another possibility, the playback device may be designated as a "child" playback device by the user at any time after initial setup by accessing configuration settings for the playback device using a controller device and input information, via the user interface, to indicate that the playback device should be designated as a "child" playback device.

b. Second Mode

After a playback device has been designated as a "child" playback device, a second mode of the playback device may be activated. The second mode may comprise a "child" mode. As one possibility, the user interface of the controller device may display an option for the user to activate and transition from the first mode (e.g., standard "adult" mode with no restrictions on content control) to the second mode of the playback device. Alternatively, the second mode may be activated manually via a physical control button of the playback device's on-product user interface or via a voice command detected by the playback device (or controller device, etc.). The second mode may enable different operating and playback features that are based on user characteristics, such as user age.

In some implementations, the second mode may be activated without designating the playback device as a "child" playback device. In other implementations, the playback device may, while operating in a first mode (e.g., a standard operating mode with no restrictions on content control), automatically transition to the second mode based on detecting a second-mode trigger. Such a second-mode trigger may take various forms. As one example, the second-mode trigger may comprise a command to play back audio content that is identified as age-specific content. As another example, the second-mode trigger may comprise a determination that audio content that is currently being played back is identified as age-specific content. Other examples are also possible.

Activating the second mode may enable the user to configure a specific set of settings (e.g., a subset of all of the settings available in the first mode) that cause the playback device to engage in desired playback behavior that is geared to a non-adult user (e.g., a child user). After the second mode has been activated, the controller device may present via the user interface a series of prompts and/or a guide that enables the user to configure the set of settings. For instance, the user may input information regarding an age, an age range, and/or an age category of the child user. For example, the user may select an age category such as "Newborn," "Infant," "Toddler," "Pre-school," "Kindergarten," or "School Age," among other possibilities. A given age category may be associated with a standard age range for the given category. For example, the category "Newborn" may be associated with an age range of 0-3 months, the category "Infant" may be associated with an age range of 3-12 months, the category "Toddler" may be associated with an age range of 12-36 months, and so on. Other examples of inputting age information are also possible. The provided age information of a child user may then be used by the media playback system to estimate the age progression of the child user and adapt the behavior of the playback device as the child user progresses in age. The media playback system may track or locally determine (e.g., using the date on which the age information was initially provided) on one or more playback devices 110, via one or more computing device(s) 106c, or on one or more controller device 130, the amount of time that has passed since the age information was provided and correspondingly calculate the age progression of the child user. Additionally, or alternatively, a user may be periodically prompted via the user interface to update the child user's age information, which may in turn enable additional controls and/or playback behavior based on the updated age information and thus allow the playback device to "grow with" a user over the course of time. In some implementations, the age information may be associated with a user profile for the child user. In some implementations, a playback device that is initially configured to operate in a second mode may transition to a first mode based on detecting a proximate presence of a second playback device that is configured to operate in the first mode.

After the second mode has been activated, the user may be prompted via the user interface to input further information defining a user control hierarchy that may assign a respective level of control to each user associated with the playback device. The respective level of control may dictate the playback device's may response to a given user's command based on the user's respective level of control. One possible hierarchy option may be a "primary-secondary" control hierarchy. In the "primary-secondary" control hierarchy, a first given user may be identified as a "primary" user and a second given user may be identified as a "secondary" user. The "primary-secondary" control hierarchy may be appropriate when a secondary user is in an early developmental stage, such as a newborn or a toddler stage, which may require a primary user to guide the secondary user's listening experience. For example, a parent or an older sibling may be identified as the "primary" user, and a toddler may be identified as the "secondary" user. In general, the primary user may have access to a wider variety of playback features of the playback device and a broader level of control with respect to issuing commands and selecting audio content for playback as compared to the secondary user.

One example of differing levels of control between the primary and the secondary users may be the type of command input source that may be utilized by the primary user and the secondary user. For instance, the playback device may accept (e.g., respond to) a playback command from the primary user that is received via any given input source of the playback device, which may include an input received via one or more physical controls (e.g., on-product user interface) of the playback device, an input received via a controller device (e.g., software or hardware controller) associated with the playback device, and/or via a voice input received via a microphone of the playback device or another NMD of the media playback system. Conversely, the playback device may accept, from the secondary user, only playback commands that are received via certain input sources, which may be referred to as "dedicated controls." Such dedicated controls may include physical controls of the playback device's on-product user interface, physical controls of a hardware controller device (e.g., a controller puck, a controller remote, etc.) that is associated with the playback device, and/or specific controls of a software controller device (e.g., smartphone, tablet, etc.) such as the controller device 130. Example dedicated controls that may be associated with a playback device will be discussed in more detail further below. In some implementations, a given controller device (either a hardware controller device or a software controller device) may be associated with a primary control level or a secondary control level that corresponds to controls and features available to a primary user and a secondary user, respectively. In some implementations, the secondary user may create a respective user profile that has limited control options and access to limited content based on the age of the secondary user. The hierarchy designations (e.g., primary, secondary, tertiary, etc.) of a given playback device can be stored at a controller device 130, in one or more settings and/or in a state variable(s) of one or more playback device(s) 110, and/or at computing device(s) 106c via network(s) 107.

Another example of differing levels of control between the primary and the secondary users may be different priority levels for eliciting a response from the playback device. For example, the playback device may assign a higher priority to commands received from the primary user and a lower priority to commands received from the secondary user. In situations where the playback device is configured to receive commands from both the primary and secondary users, the playback device may prioritize any commands issued by the primary user and implement only the primary user's command(s). As one example, if the primary user issues a playback command (e.g., pause audio playback), the playback device may ignore, for a defined amount of time (also referred to herein as a "timeout" period), any command that is issued by the secondary user. The defined amount of time may be an amount of time determined by the primary user, such as 10 minutes, 15 minutes, or 30 minutes, among other possibilities. During this time, the playback device may ignore any command issued by the secondary user to begin audio playback. If the playback device detects a command, such as a voice command, during the timeout period, the playback device may identify, based on a voice profile associated with the user issuing the command, if the user is the primary user or the secondary user. If the identified user is the primary user, the playback device may implement the command. For example, the playback device may detect, during the time out period, a voice command to begin audio playback. The playback device may then determine that the command was issued by the primary user. Accordingly, the playback device may implement the command and begin audio playback, even though the timeout period has not yet lapsed. Conversely, the playback device may determine that the command was issued by the secondary user, or if there is no voice profile associated with the secondary user, that the command was issued by someone other than the primary user (e.g., the primary user's voice profile was not identified). Accordingly, the playback device may ignore the command to begin audio playback and continue implementing the command to pause audio playback until the timeout period has lapsed.

Furthermore, the playback device may disable on-product controls for the duration of the timeout period such that the secondary user may not attempt to override the command issued by the primary user by pressing a physical control to begin audio playback. In some implementations, in response to an override attempt by the secondary user, the playback device may output an indication that commands from the secondary user will not be accepted or implemented until the timeout period has lapsed. The indication may be an audio indication outputted by the playback device and/or at a controller device, a visual indication outputted by the playback device and/or at a controller device, or a combination of the two. Other examples are also possible.

As another example, if the primary user has issued a command to play back given audio content (e.g., sleep content, night-time content, etc.), the playback device may ignore commands from the secondary user to play back different audio content. As described above, the playback device may disable controls accessible to the secondary user to prevent an override of the primary user's play back command. As yet another example, if the primary user has set the playback volume at a given level, the playback device may ignore any commands from the secondary user to adjust the playback volume level. In some implementations, the playback device may ignore commands from the secondary user that exceed a limit set by the primary user but may accept and implement commands that stay within a limit defined by the primary user. For example, if the primary user has set a current playback volume level or a maximum volume limit at 10, the playback device may ignore a command from the secondary user to increase the volume level beyond 10 but may accept a command from the secondary user to decrease the volume level.

In some implementations, the primary user may select or approve a subset of available playback controls that the secondary user may access. The subset may be, for example, controls including play/pause command, skip track, preference settings (e.g., like/dislike of a track), etc. Access levels to these controls may be applied as described above via on-device controls or buttons and/or via controller devices. Other examples are possible.

Figure 6:
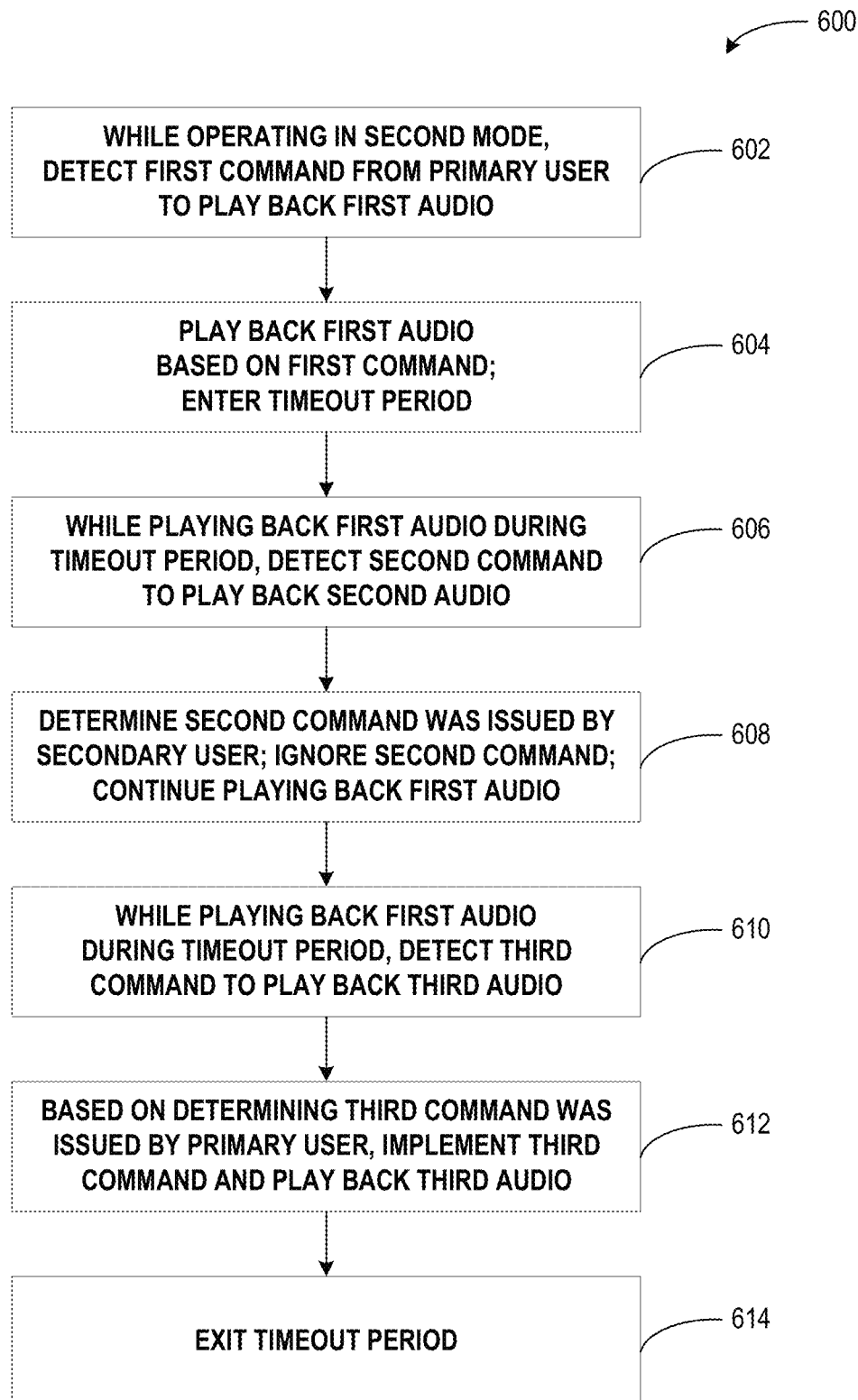
FIG. 6 is a flow diagram of one example process for playing back audio content while operating in a particular operation mode according to the disclosed techniques.

FIG. 6 depicts a flowchart of an example process for reacting to user commands based on user control hierarchy as described above within an operating environment involving, for example, the media playback system 100, one or more of the playback devices 110, one or more of the network microphone devices 120, and/or one or more of the control devices 130. The example process 600 may include one or more operations, functions, or actions as illustrated by one or more of blocks 602-614. Although blocks 602-614 are illustrated in sequential order, these blocks may also be performed in parallel, and/or in a different order than those described herein. Also, the various blocks may be combined into fewer blocks, divided into additional blocks, and/or removed based upon the desired implementation.

In addition, for the process 600, and other processes and methods disclosed herein, including example processes 700 and 800 of FIGS. 7-8 that will be discussed in more detail further below, each flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the methods 600, 700, and 800, and any other processes and methods disclosed herein, each block shown in FIGS. 6-8 may represent circuitry that is wired to perform the specific logical functions in the process.

Turning to the example method 600 of FIG. 6, a playback device may be configured to operate in a second mode (e.g., a "child" mode) as described above. Further, the playback device may be configured to operate in the second mode in accordance with a primary-secondary control hierarchy as described above. At block 602, the playback device may detect a first command to play back first audio content provided. The playback device may determine that the first user is the primary user (e.g., based on the primary user's user profile). Therefore, at block 604, the playback device may proceed to play back the first audio content based on the first command provided by the primary user. For example, the primary user may have provided a command to play back sleep-related audio content to help the secondary user (e.g., a child user) fall asleep. Thus, the playback device may play back the sleep-related audio content. Playback of the first audio content based on the first command from the primary user may trigger the start of a timeout period as described above.

At block 606, while the timeout period is ongoing and the playback device is playing back the first audio content, the playback device may detect a second command to play back second audio content. The playback device may then determine if the second command was issued by the primary user in order to determine if the second command should be implemented or ignored. At block 608, the playback device may determine that the second command was issued by the secondary user (e.g., based on the secondary user's user profile) and thus the second command is to be ignored. For example, the secondary user (e.g., child user) may not wish to go to sleep and may have issued a command to play back music (perhaps after the child's parent has left the room). Based on (i) determining that the second command was issued by the secondary user and (ii) the primary-secondary hierarchy, the playback device may continue playing back the first audio content in accordance with the first command issued by the primary user.

At block 610, while the timeout period is ongoing and the playback device is playing back the first audio content, the playback device may detect a third command to play back third audio content. The playback device may then determine if the second command was issued by the primary user in order to determine if the second command should be implemented or ignored. The playback device may determine that the third command was indeed issued by the primary user. For example, the secondary user (e.g., child) may have negotiated a compromise with the primary user (e.g., parent) to stay up a little longer, and the primary user may have agreed to let the secondary user listen to music, an audiobook, or other non-sleep-related content. At block 612, based on the determining that the third command was issued by the primary user, the playback device may play back the third audio content based on the third command.

At block 614, the playback device may exit the timeout period. In this regard, the third command may have triggered a premature end to the timeout period. Alternatively, the playback device may have continued playing back the third audio content until the time period lapsed.

Another possible user control hierarchy option may be a "primary-primary" control hierarchy, where each of a first given user and a second given user may be designated as a primary user. In a "primary-primary" hierarchy, both the first given user and the second given user may have an equal level of access to playback features of the playback device and an equal level of control with respect to issuing commands and selecting audio content for playback. The "primary-primary" hierarchy may be appropriate as a child user progresses developmentally and becomes a more sophisticated listener with an increased ability to interact with the playback device and create audio experiences.

While the user control hierarchy options have been described above with respect to a first and a second given user, it should be understood that any number of users may be identified in a control hierarchy.

c. Audio Content Selection for Playback in Second Mode

As mentioned above, when a listener is in an early developmental stage, assistance from an older and more sophisticated listener may be required to create an age-appropriate listening experience. Accordingly, during the early stages of a child user's life, the child may be a passive user (e.g., a user that is merely a listener and not involved in selecting audio content), and one or more other users, such as the child's parents or older siblings, may decide upon and select appropriate audio content for the child. For example, when the child is a newborn, the child's parents may select audio content that targets cognitive stimulation or sleep aid. As another example, when the child is a toddler, the child's parents may select audio content that targets early education.

As the child continues to grow, the child may become increasingly interested in actively participating in content selection and/or content discovery, with some dependency on content that is easy to find or discover. Therefore, as the child grows older and transitions into a more active user, the child may achieve a user status more equal to that of its parents and/or siblings with respect to discovering and selecting content for audio playback. In this regard, the child user may wish to incorporate or increase the frequency of private listening experiences (e.g., using a personal portable or wearable playback device such as a headphone device) in contrast with out-loud listening (e.g., speaker playback) and may wish to engage in more community-based listening experiences, such as sharing music and/or music listening experiences with other users (e.g., friends, siblings). In this regard, as a (child) user becomes more sophisticated, it may be desirable for a playback device to adapt playback features and control levels that are made available to the user to correspond with the user's progression.

When a playback device has been designated as a "child" playback device and configured to operate in the second mode as described above, audio content that is retrieved by the playback device from a media content source (e.g., Sonos Radio, Spotify, etc.) for playback in response to a user command may generally be limited to content that is identified by the media content source as child-appropriate (or age-specific, based on the provided age information) content. In some implementations, a playback device may have, stored in a memory of the playback device or otherwise accessible to the playback device (e.g., retrievable from one or more other devices of the media playback system, such as a group coordinator, a remote computing device 106c, etc.), one or more predefined sets of audio content that has been predetermined to be appropriate for a given age range or age category.

When the playback device is operating in the second mode, the playback device may receive a playback command in various ways. As one possibility, the playback device may detect a voice command received from a primary or a secondary user. The voice command may comprise an identification of given audio content, such as a name of a song. The playback device may then retrieve the given audio content from a media content source and play back the retrieved audio content based on the playback command. In some instances, the voice command may not include an identification of given audio content and may instead comprise a voice input capturing a rendition of the given audio content to be played back. For example, the voice input may comprise the primary or the secondary user singing, humming, or recording a portion of the given audio content desired for play back. In such instances, the playback device may send to a remote, cloud-based media identification service, a content identification request that includes a copy of the detected voice input comprising the desired audio content. The request may include metadata or some other parameter indicating that any audio content identified by the media identification service in response to the request should be limited to age-appropriate content (e.g., children's audio content based on the secondary user's age information) and/or exclude explicit content. The voice input may be received via a VAS associated with the playback device, a microphone component of the playback device, or a voice input control of a controller device associated with the playback device, among other possibilities. As another possibility of detecting a playback command, the playback device may receive a playback command via Near Field Communication ("NFC"). For example, a primary or secondary user may use a card, an album, a smartphone, or any other NFC-capable device or NFC-embedded content source to provide audio content for playback by the playback device. As yet another possibility, the playback device may receive a command to play back audio content via a user interface of a controller device that is associated with the playback device. Other examples are also possible.

In an instance when the playback device sends an audio content identification request to a media identification service as discussed above, the playback device may receive one or more results that correspond to the request. The playback device may then select from the one or more results given audio content based on a threshold confidence level (e.g., a high confidence) associated with the given audio content. As one possibility, a confidence level may be provided by the media identification service. A media content source or other service may provide the media identification service. For example, when the media identification service returns the results to the playback device, it may indicate, for each result, a respective likelihood that the result matches the audio content desired by the user. The playback device may then select and play back the audio content with the highest respective likelihood. In some instances, the media identification service may provide the results in a ranked order, such as in an order that ranks the results from highest confidence level to lowest confidence level, and the playback device may elect to play back the first returned result (e.g., the highest ranked result).

As another possibility, the confidence level may be determined based on recent playback information, which may be stored in a memory of, or otherwise accessible to, the playback device. For example, the playback device may determine if the given audio content was played back within a given period of the user's recent listening history (e.g., 1 day, 1 week, etc.). If the playback device determines that the given audio content was played back within the given period, the playback device may conclude that the confidence level of the given audio content is high and may select and play back the given audio content.

As yet another possibility, the confidence level may be determined based on user listening history, which may be stored in a memory of, or otherwise accessible to, the playback device. For example, the user's listening history may indicate that the user listens to given audio content based on a given time of day. For instance, the user's listening history may indicate that the user listens to (i) playlist A between 6-8 am (e.g., the user may have set up a daily alarm to begin playback of playlist A at 6 am), (ii)

playlist B between 8-9 am (the user may listen to playlist B every morning while eating breakfast), (iii) sleep sounds between 10-1 lam (the user may take a daily morning nap and may listen to sleep sounds to help fall asleep), and (iv) playlist C every afternoon between 2-4 pm (the user may listen to playlist C during afternoon recreation time). Accordingly, the playback device may compare the given audio content to the user's listening history to determine if the given audio content corresponds with the user's listening history. If the playback device determines that the given audio content does correspond with the user's listening history, the playback device may conclude that the confidence level of the given audio content is high and may select and play back the given audio content. For example, if the current time is 2:30 µm, and the given audio content matches a song in playlist C, the playback device may determine that the given audio content has a high confidence level and may play back the given audio content. Additional details regarding selecting audio content based on playback conditions including listening history can be found, for example, in U.S. Pat. No. 9,665,339 entitled "Methods and Systems to Select an Audio Track," which is incorporated herein by reference in its entirety. In some implementations, any audio content that is played back while the playback device is operating in the second mode may be identified by the playback device as second-mode content (e.g., "child" content) and stored as a separate set of second-mode listening history so that listening history collected during first mode operation remains unaffected, and vice versa. In general, when operating in the second mode, the listening history used to determine a confidence level for given audio content may be limited to only the second-mode listening history.

In some implementation, a playback device may be configured to operate in a "shuffle" mode such that listening histories of one or more operation modes of the playback device may be used to recommend playback content. For instance, when the shuffle mode is activated, the playback device may evaluate both first-mode listening history and second-mode listening history to recommend playback content. As one example, the respective listening histories for each of the first mode and the second mode may be evaluated equally for determining audio content for playback. For instance, a pool of listening history-based audio content from which the playback device may select given audio content may comprise an equal share of the first-mode listening history and the second-mode listening history. As another example, the respective listening histories for each of the first mode and the second mode may be evaluated differentially for audio content selection. For instance, the pool of listening history-based audio content from which the playback device may select given audio content may comprise different shares of the first-mode listening history and the second-mode listening history. For example, the first mode listening history may inform 75% of media content playback, whereas the second mode listening history may inform 25% of media content playback. Other distributions are also possible. As yet another example, listening histories from the first mode and the second mode may be combined, and media content playback may be determined based on the combined listening histories.

In some implementations, confidence levels for audio content may also be determined based on an equal, distributed, or combined evaluation of first mode and second mode listening histories as described above.

In instances where the playback device is unable to determine a threshold confidence level for one or more of the results returned by the media identification service, it may request an indication from the user for selection and playback of the desired audio content. The playback device may request an indication in various ways. As one possibility, the playback device may play back, as a preview, a short clip of each result that may potentially be the desired audio content. As the playback device cycles through each preview, it may attempt to detect a command from the user to play back audio content when a clip of the desired audio content is previewed. For example, the playback device may "listen" for a voice input received via one or more microphone components that identifies the desired audio content. As another example, the playback device may detect a physical input that is received via the on-product user interface. As yet another example, the playback device may receive an indication of an input provided via the user interface of the control device associated with the playback device. After receiving the indication from the user identifying the desired audio content, the playback device may proceed to play back the desired audio content.

As another possibility of requesting an indication from the user for selection and playback of the desired audio content, the playback device may display, via an interface of a controller device, selectable representations of respective art associated with each audio content result (e.g., an associated album cover for each song), which may then be selected by the user to identify the desired audio content. After receiving the indication from the user identifying the desired audio content, the playback device may proceed to play back the desired audio content. As yet another possibility, the playback device may determine a set of audio content options based on the user's voice command and the audio content identification request results. The playback device may then cause a visual representation of each option to be displayed via a user interface of a controller device associated with the playback device. The playback device may receive an indication of the desired audio content based on a selection by the user of the visual representation of the desired audio content. The playback device may additionally, or alternatively, output an audio indication of each option and attempt to detect an indication from the user identifying the desired audio content. The playback device may receive an indication of the desired audio content based on a voice input received from the user. In general, regardless of the manner in which the playback device requests an indication from the user to identify the desired audio content, the playback device may receive the indication from any input source, including a voice input, a physical input, or an input provided via a user interface of a controller device.

d. Third Mode

The playback device may be further configured to operate in a third operation mode. The third operation mode may comprise a sleep mode. Activating the sleep mode may cause the playback device to disable or restrict playback features and/or audio content selection. As one possibility, activating the sleep mode may cause the playback device to limit playback to only audio content that is related to or identified as sleep content. For example, audio content that may be identified as sleep content may include white noise content or ambient content that is intended to aid a user in falling asleep. As another possibility, activating the sleep mode may cause the playback device to "lock" playback volume level at a given level and/or implement a maximum volume level that may not be exceeded until the sleep mode is deactivated.

The third mode may be activated concurrently with one or more other modes. For example, the sleep mode may be activated while the playback device is operating in a first mode or a second mode. In some implementations, the playback device may further disable or restrict playback features based on the one or more other currently-activated operation modes. For example, if the playback device is designated as a "child" playback device and/or is operating in the second mode (e.g., the "child" mode) when the sleep mode is activated, the playback device may infer that (i) it is located in a space associated with the secondary user and (ii) the secondary user is attempting to fall asleep. Therefore, upon activation of the sleep mode, the playback device may automatically leave any playback groups or bonded zones of which the playback device may be a member. Leaving any such playback groups or bonded zones may help prevent the playback device from playing back (e.g., based on a command received by a primary user), audio content that may disrupt the secondary user, such as audio content that is not sleep content and/or audio content at a volume level that is higher than the maximum volume level. In some implementations, the playback device may automatically rejoin its previous playback groups or bonded zones after the sleep mode has been deactivated.

e. Fourth Mode

The playback device may be further configured to operate in a fourth operation mode. The fourth operation mode may comprise a monitoring mode. The monitoring mode may be activated concurrently with one or more other modes. In some implementations, when the sleep mode is activated, the playback device may automatically activate the monitoring mode. The monitoring mode may cause the playback device to enable features and/or engage in behavior that facilitates audio monitoring of the playback device's environment. Such behavior may take various forms.

As one possibility, when the monitoring mode is activated, the "monitoring" playback device may enable one or more microphone components of the playback device and detect for sound. As one example, the monitoring playback device may continuously detect sound and transmit a live (e.g., real-time) audio stream to a second playback device in a different location that has been designated as a receiving playback device. As another example, the monitoring playback device may continuously detect sound but may only transmit a live audio stream when certain sound is detected, and/or when sound within a certain frequency range is detected. For instance, when the monitoring mode is activated, the monitoring playback device may be configured to detect sound that is indicative of a child's voice, such as a child's call or a child's cry. In such an instance, the monitoring playback device may be configured to transmit a live audio stream upon detecting sound that is within a frequency range of a typical child's cry (e.g., 350 Hz-550 Hz). While engaged in detecting sound, the monitoring playback device may further apply one or more filters in order to increase audio gain within a target frequency range and/or decrease output of other undesired frequencies.

In some implementations, the monitoring playback device may send to the receiving playback device a notification alerting the receiving playback device of an incoming audio stream prior to transmitting the live audio stream. Further, the monitoring playback device may additionally or alternatively send to the receiving playback device one or more audio samples of the detected sound. Still further, the monitoring playback device may include a priority level associated with the transmitted audio indicating, for example, that that audio stream has a high priority level and should be played back immediately. In response to receiving the notification from the monitoring playback device, the receiving playback device may play back an audio alert (e.g., an alert tone or an alert chime) and/or display a visual indication (e.g., flash LEDs of the receiving playback device in a particular pattern and/or color) prior to playing back the audio transmitted by the playback device.

In some implementations, the receiving playback device may be playing back other content (e.g., music) when it receives an indication from the monitoring playback device to play back transmitted audio (e.g., the child's cry). The receiving playback device may receive the music content in a first stream of audio and the transmitted audio as a second stream of audio. The receiving playback device may apply one or more filters to increase audio levels, volume, or gain within a target frequency range (e.g., frequency range of a typical child's cry) during playback to amplify the volume of the audio stream transmitted by the monitoring playback device such that the audio stream is audible over the other content that the receiving playback device may be playing back. In some instances, the volume of the first stream may be reduced and/or the volume of the second stream may be increased to increase the prominence of the second stream of audio when the first and the second streams of audio are mixed for playback. In other instances, playback of the first stream may be paused, at least temporarily, while the second stream is played back, and then resumed after playback of the second stream is complete.

Additional details regarding transmitting and receiving audio alert communications can be found, for example, in U.S. Pat. No. 10,797,667 entitled "Audio Notifications," which is incorporated herein by reference in its entirety. Additional details regarding mixing more than one audio stream can be found, for example, in U.S. Pat. No. 9,665,341 entitled "Synchronized Audio Mixing," which is incorporated herein by reference in its entirety.

In some implementations, the monitoring playback device and the receiving playback device may be connected concurrently to a given wireless network (e.g., the same WIFI network or the same Bluetooth network). When the monitoring playback device begins operating in the monitoring mode, it may pair with the receiving playback device such that upon receiving an audio transmission from the monitoring playback device, the receiving playback device may mute or pause audio content that the receiving playback device was previously playing back (e.g., streaming over the given wireless network). After playing back the audio transmission, the receiving playback device may then unmute or resume playback of the previous audio content.

The function of designating a receiving playback device to receive the audio content detected by a monitoring playback device during monitoring mode may take various forms. A user may designate a receiving playback device by providing an input via voice command, via on-product user interface (e.g., by double tapping the Play/Pause button, etc.), and/or via a user interface control of a controller device. Furthermore, the function of designating the receiving playback device may be limited to a predetermined amount of time following initiation of the monitoring mode. The predetermined amount of time may be, for example, five minutes, among other possibilities. After a monitoring playback device has entered the monitoring mode, the monitoring playback device may attempt to detect an indication of a designation of a receiving playback device for the duration of the predetermined amount of time.

As one example, the monitoring playback device may broadcast a message to one or more playback devices of the household indicating that a user may designate a receiving playback device and inform the monitoring playback device of the designation by performing a given action, such as double tapping the Play/Pause button of the receiving playback device's on-board user interface. The monitoring playback device may then listen for a response indicating that a receiving playback device has been designated. As another example, the monitoring playback device may broadcast a message to one or more playback devices of the household indicating that the monitoring playback device has entered the monitoring mode and that a user may designate a receiving playback device by performing a given action. In turn, when a receiving playback device has been designated based on completion of the given action, it may notify the monitoring playback device that it has been designated as a receiving device. In some instances, more than one playback device of a household may be concurrently engaged in one or both of the second mode or the monitoring mode. In such instances, when a receiving playback device has been designated based on completion of the given action, it may notify one or more playback devices of the household that are currently operating in the second mode and/or the monitoring mode that it has been designated as receiving device for each monitoring playback device. Those playback devices that are operating in only the second mode and not the monitoring mode may ignore the notification.

If an indication regarding designation of a receiving device is not received within the predetermined amount of time, the monitoring playback device may send a second message to the one or more playback devices of the household. Alternatively, or additionally, the monitoring playback device may designate a given playback device as the receiving device. The monitoring playback device may designate a given playback device as the receiving device based on various factors. Such factors may include, for example, current playback of audio content by the given playback device. For example, the monitoring playback device may detect that the given playback device is currently playing back music in a given location and may infer that a primary user is located in proximity of the given playback device. Therefore, the monitoring playback device may designate the given playback device as the receiving playback device. The monitoring playback device may further send a notification to the given playback device indicating that it has been designated as the receiving playback device for audio transmitted by the monitoring playback device.

In some implementations, when the monitoring mode is activated on one playback device of a household, one or more other playback devices of the household may automatically activate the monitoring mode, in turn providing a more collective monitoring experience.

In some implementations, when the monitoring mode is activated on a given playback device, one or more playback devices of the household that are located within proximity of the given playback device may automatically be designated as receiving playback devices for given audio content detected and transmitted by the given playback device. One or more playback devices that are located within proximity of the given playback device may be identified based on transmitting an ultrasonic audio transmission. Additional details regarding using ultrasonic tones to detect the presence of devices may be found in U.S. Patent Publication No. 2020/0401365 entitled "Ultrasonic Transmission for Presence Detection," which is incorporated herein by reference in its entirety. After identifying the one or more playback devices that are located within proximity of the given playback device, the one or more playback devices may form a new playback group so as to receive the audio transmission from the given playback device and play back the audio transmission in synchrony.

In some implementations, the locations of one or more playback devices within a household may be leveraged to amplify the audio that is transmitted by a monitoring playback device. For example, one or more household playback devices that are located within a given area of the monitoring playback device may replicate the audio content that is transmitted by the monitoring playback device to a receiving playback device. For instance, if a monitoring playback device is located in an east wing of a home, one or more other household playback devices located in the east wing may play back the transmitted audio content. The one or more household playback devices may not be designated as receiving devices and may not need to be grouped for playback of the transmitted audio; instead, they may merely replicate the transmitted audio content. In effect, the sound of the transmitted audio content may be amplified, which in turn may provide a user with a more immersive audio experience and enable the user to more easily recognize that the monitoring playback device has detected and transmitted audio. Additional details regarding immersive audio playback can be found, for example, in U.S. Pat. No. 10,028,069 entitled "Immersive Audio in a Media Playback System," which is incorporated herein by reference in its entirety.

In some instances, a given playback device that is associated with a primary user (e.g., a parent) or a given location (e.g., master bedroom) may be engaged in the sleep mode. In such instances, a monitoring playback device may infer that the primary user is near the given playback device and/or within the given location. Therefore, instead of broadcasting a household-wide notification that it has entered the monitoring mode, the monitoring playback device may automatically designate the given playback device as the receiving playback device.

Figure 7:
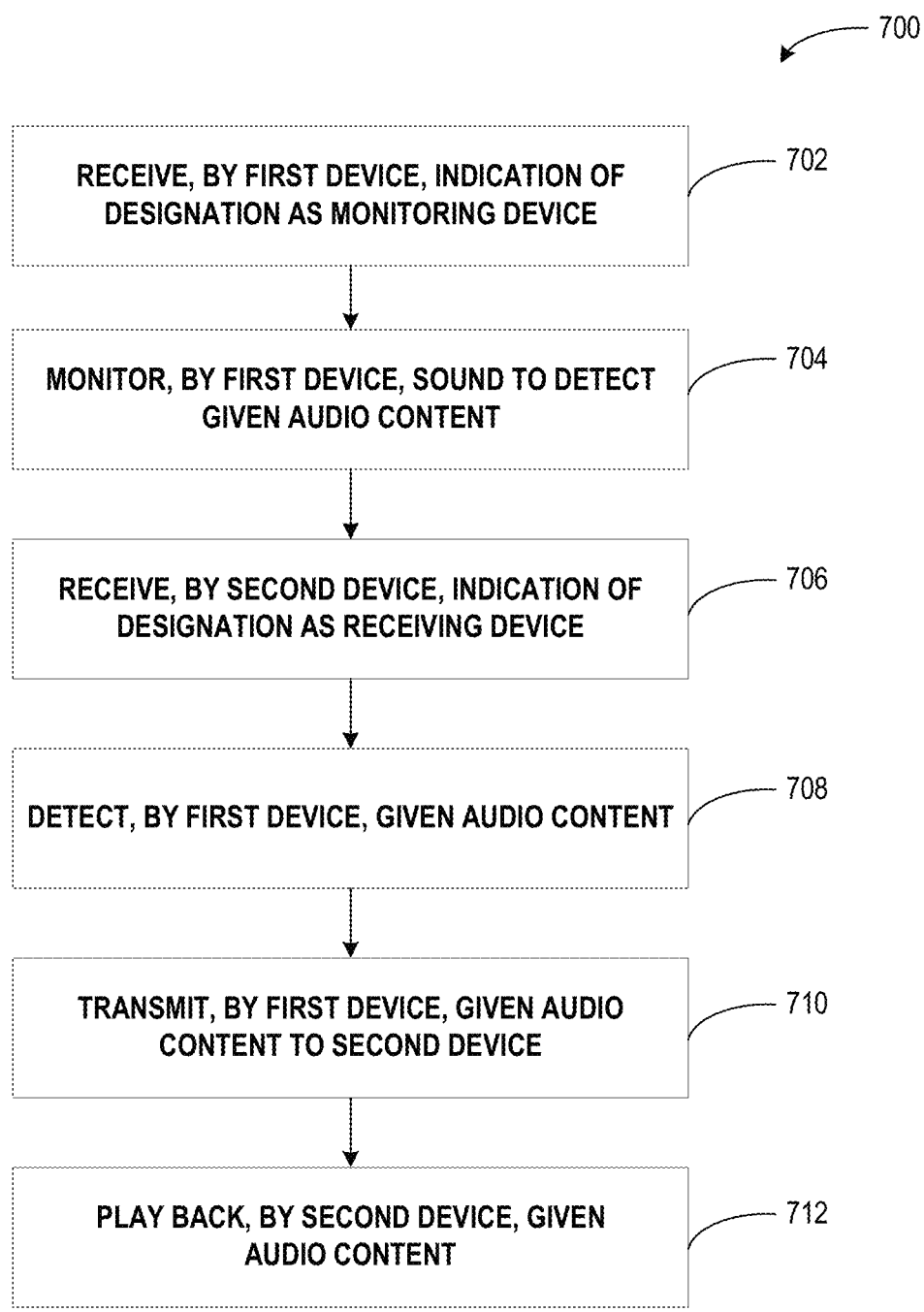
FIG. 7 is a flow diagram of a second example process for playing back audio content while operating in a particular operation mode according to the disclosed techniques.

FIG. 7 depicts a flowchart of an example process that may be implemented in accordance with the fourth mode as described above within an operating environment involving, for example, the media playback system 100, one or more of the playback devices 110, one or more of the network microphone devices 120, and/or one or more of the control devices 130. The example process 700 may include one or more operations, functions, or actions as illustrated by one or more of blocks 702-712. Although blocks 702-712 are illustrated in sequential order, these blocks may also be performed in parallel, and/or in a different order than those described herein. Also, the various blocks may be combined into fewer blocks, divided into additional blocks, and/or removed based upon the desired implementation.

The example process 700 may begin at block 702, with a first playback device receiving an indication that it has been designated as a monitoring device. As described above, this may involve the first playback device automatically activating the monitoring mode or being selected as a monitoring playback device via a user interface of a controller device associated with the first playback device. At block 704, the first playback device may begin detecting for certain sound and/or for sound that is within a certain frequency range. At block 706, the first playback device may receive an indication of one or more other playback devices that have been designated as receiving devices. For instance, the first playback device may receive an indication that a second playback device has been designated as the receiving device. At block 708, the first playback device may detect given audio content that matches the certain sound and/or sound that is within the certain frequency range. Thus, at block 710, the first playback device may transmit the given audio content to the second playback device. In response, at block 712, the second playback device may play back the given audio content transmitted by the first playback device. As described above, the second playback device may temporarily pause and/or mute other audio content that it may have been playing back at the time the given audio content was received and/or amplify the given audio content.

It should be understood that the example process 700 depicts only one embodiment of monitoring audio content and that one or more playback devices of a media playback system may monitor audio content in various ways as disclosed herein.

f. Scenes

In some implementations, the playback device may include a scene recommendation engine such that the playback device is configured to recommend or implement a given audio scene based on various factors. As one possibility, during initial configuration of the playback device, a primary user may input information related to a secondary user's established routines. One such routine may include a secondary user's typical sleep times. The playback device may then initiate a sleep-related scene during the times that have been defined as the secondary user's typical sleep times. In some instances, the scene recommendation engine may be located in the cloud, and the playback device may transmit one or more requests for scene recommendations over a network. The one or more requests may include environmental information (e.g., time of day, weather, status of other network connected devices in the home, currently active scenes, etc.).

In some implementations, a given scene, such as a sleep-related scene, may be associated with a designated scene selection button of the on-product user interface of the playback device. The playback device may then initiate the given scene when the designated scene selection button is selected. Still further, in some implementations, the designated scene selection button may be associated with two or more scenes, and successively selecting the scene selection button may cause the playback device to cycle through the two or more scenes if a selected scene is not desired.

As another possibility, the playback device may infer a user's state based on detecting a status of one or more other proximate smart devices and accordingly initiate playback of a given audio scene. For example, the playback device may detect that smart blinds in a user's room have been drawn during the daytime or that the user has selected the scene selection button after drawing the smart blinds. Accordingly, the playback device may infer that the user is napping or sleeping and may thus initiate playback of one or more audio scenes associated with sleep.

Additional information regarding scene systems may be found in U.S. Provisional Application No. 63/114,931 entitled, "Playback Roles for Layering of Audio," which is incorporated herein by reference in its entirety.

g. Multiple Secondary Users

In some implementations, the second mode may be activated on more than one playback device and may identify more than one secondary user. In some instances, when a first playback device in a first location and a second playback device in a second location are each configured to operate in the second mode (e.g., the "child" mode), the first and the second playback devices may be configured to communicate with each other and share information regarding a first secondary user and/or a second secondary user. Accordingly, the first playback device in the first location may initiate, based on a command received at the first playback device, playback of a given scene or a given listening experience at the second playback device in the second location. To illustrate with an example, the first playback device may be associated with an older sibling and may be located in the older sibling's room. The second playback device may be associated with a younger sibling and may be located in the younger sibling's room. The older sibling, the younger sibling, and their parent may all be in the younger sibling's room while the parent is setting up the younger sibling for a nap. The parent may input a first command at the second playback device to initiate a naptime scene in the younger sibling's room and a second command at the second playback device to initiate playback of given audio content (e.g., an audiobook or a given playtime playlist, etc.) at the first playback device in the older sibling's room.

h. Playback Roles and Playback Modes

A playback device may be assigned one or both of a playback role and a playback mode. Aspects described herein that apply to assigned playback roles and playback modes may be simultaneously or concurrently applied. For example, a first playback device that is assigned an ambient playback role and configured to operate in a sleep mode may play back audio content in a manner that is consistent with the ambient playback role and in accordance with the sleep mode parameters as described above.

In some instances, a given mode may be associated with one or more playback roles such that operating in the given mode may cause a playback device to operate in accordance with the playback role(s) associated with the given mode when the given mode is activated for the playback device. As one example, the sleep mode may be associated with the ambient playback role such that a playback device is configured to operate in the ambient playback role when the sleep mode is activated for the playback device.

Further, a scene may be associated with one or both of a playback role or a playback mode. For example, a sleep scene may be associated with a particular playback role (e.g., ambient playback role) and a particular playback mode (e.g., sleep mode), which may be separate from any other playback roles associated with the particular playback mode. In some instances, the playback role associated with the scene may override any other playback role(s) associated with the particular playback mode. In other instances, the other playback role(s) associated with the particular playback mode may override the playback role associated with the scene. For example, a particular playback mode such as a sleep mode may be associated with an individual playback role, and a sleep scene may be associated with an ambient playback role. In instances where the sleep scene playback role is configured to override any other playback role, when the sleep scene is activated for a playback device, the playback device may play back ambient audio content in accordance with the ambient playback role instead of the individual playback role. Conversely, in instances where the other playback role is configured to override the sleep scene playback role, when the sleep scene is activated for a playback device, the playback device may play back audio content in accordance with the individual playback role (e.g., jazz music) instead of the ambient playback role. Other examples are also possible.

VII. Example Dedicated Controls for Targeted Audio Playback & Experiences

As mentioned above, it may be desirable to enable a user to autonomously engage in a desired listening experience in a way that eases reliance on a software-based controller device (e.g., smartphone, tablet, computer, voice input device) to initiate, control, and/or otherwise facilitate the listening experience. For instance, a child user's parent may wish to encourage her to explore her audio preferences and become confident in selecting a desired audio experience. However, the parent may wish to limit the child user's exposure to a software controller device (e.g., a smartphone or tablet, etc.) so as to minimize distraction and prevent the child from developing a reliance on the software controller device. In this regard, a playback device that is configured to operate in one or more of the modes as described above may be associated with one or more dedicated controls for initiating, controlling, and/or otherwise facilitating a listening experience. Such dedicated controls may comprise one or more hardware controllers (e.g., controller puck(s), controller remote(s), controller key(s) etc.) having one or more physical and/or capacitive controls that can be used to send commands to the playback device. Such dedicated controls for controlling a playback device may take various forms.

a. Cover

Disclosed herein is a first type of dedicated control that may take the form of a removable cover that can be placed over and connected to a playback device. The cover may be constructed from a textile material and may comprise one or more embedded electrical components, corresponding to transport control commands (e.g., pause, play, skip, etc.), volume commands, (e.g., increase volume, decrease volume, etc.) and/or playback commands for given audio content, that have been woven into the textile material of the cover via conductive thread. The cover may further comprise one or more textile cabling components that can be plugged into a receiving port of the playback device via one or more connectors that connect the electrical components and the playback device, thereby enabling the cover to serve as a controller for the playback device. Other examples of connectors include wireless connectors (e.g., Bluetooth, NFC, etc.) or other means of physical connection such as magnetic connectors.

The manner in which the conductive thread is woven into the cover may take various forms. As one possibility, the conductive thread may take the form of one or more individual shapes, designs, and/or images that are each located in a distinct area of the cover that is electrically isolated from each other area. Each individual shape, design, and/or image may form a respective control surface that corresponds to a given playback command for the playback device. In some implementations, one or more different conductive threads may be used for each control surface. As another possibility, the cover may comprise one or more shapes, designs, and/or images that are printed onto distinct areas of the cover, and the conductive thread may be woven into a given portion of each shape, design, and/or image to create a respective control surface that is electrically isolated from each other control surface and corresponds to a given playback command for the playback device. In some implementations, one or more different conductive threads may be used for each control surface. As yet another possibility, the conductive thread may be woven throughout the cover, and the textile material of the cover may be organized into one or more electrical grids, where each grid comprises a particular shape, design, and/or image that forms a respective control surface corresponding to a given playback command for the playback device. In some implementations, one or more different conductive threads may be used for each grid or for a given portion of a given grid. The conductive thread may be woven into the cover in other ways as well.

The cover may be configured to perform as a dedicated control in various ways. As one possibility, the cover may be pre-configured with a given set of available transport control commands, volume commands, and audio content. For instance, the cover may be embedded with a memory chip or some other manufacturer-configured identifier that includes predetermined configuration data that can be used by the playback device and/or a software controller device (e.g., a smartphone) to identify the control commands and audio content that are associated with the cover.

As another possibility, the cover may be configured via a software controller device (e.g., smartphone, tablet, etc.), such as the controller device 130, that is configured to communicate with the playback device and the cover (e.g., while the cover is connected to the playback device). For instance, while the cover is connected to (e.g., plugged into) the playback device, a user interface (e.g., the user interface 133) that is displayed on the software controller device may present a user with a series of prompts and/or options for configuring the cover. The user may then assign to each respective control surface (e.g., shape, design, image, grid, etc.) of the cover a given playback command (e.g., a transport control command, a volume command, a playback command to play back audio content, etc.) that is to be performed when the respective control surface is selected (e.g., when the conductive thread woven into the respective control surface is touched).

A removable cover dedicated control may take various forms. As one example, a dedicated control cover may comprise one or more electrically isolated control surfaces woven with conductive thread. Each control surface may be associated with a different type or genre of audio content.

Figure 8B:
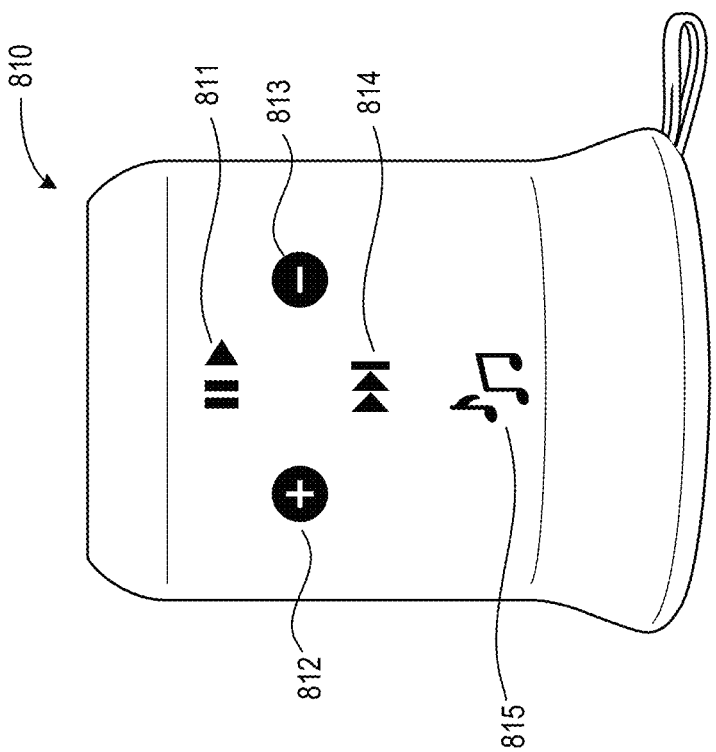
FIGS. 8A and 8B depict examples of dedicated controls according to disclosed embodiments of dedicated controls.
Figure 8A:
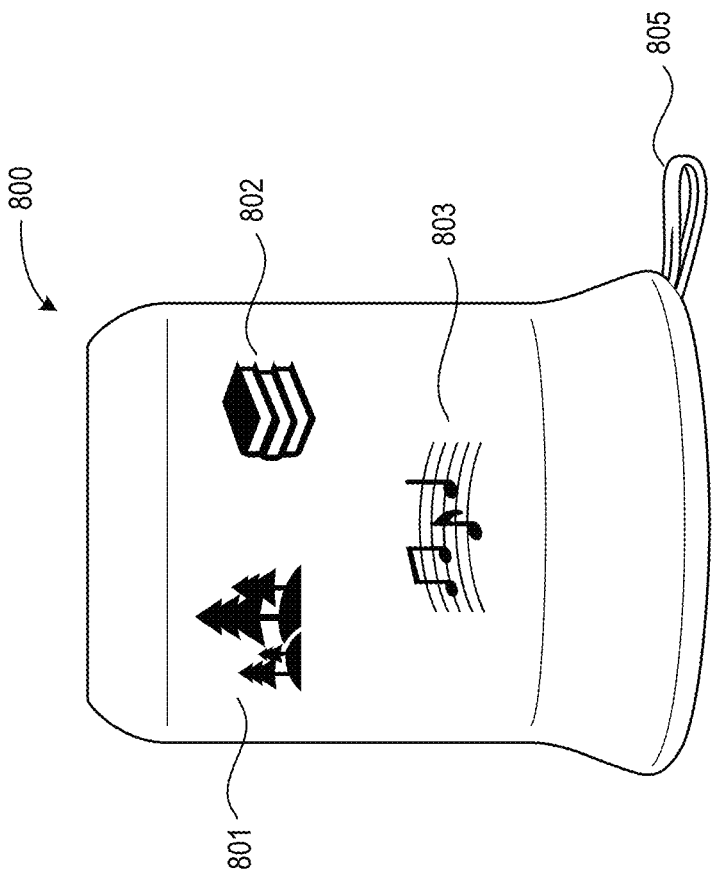

FIG. 8A depicts one such example of a dedicated control cover that may be placed over a playback device, such as any of the playback devices 110. As shown in FIG. 8A, the example cover 800 may comprise a set of control surfaces, each identified by a respective image and associated with a particular type of audio content that may be played back when the control surface is selected. For example, a first control surface 801 comprising an image of a forest may be associated with audio of nature sounds, such as birds chirping, other animal sounds, jungle sounds, and/or water sounds. A second control surface 802 comprising an image of a set of books may be associated with a given audiobook. A third control surface 803 comprising a musical icon(s) may be associated with given genre of music and/or a given playlist. After configuring each control surface as described above, a user may facilitate a desired listening experience by selecting a given image on the cover 800. Other examples are also possible. As described above, each of the images 801-803 may be pre-configured and/or may be configured by a user. Further, the cover 800 may comprise a fingerhold 805 that facilitates gripping the cover 800 for placing and/or removing the cover 800.

FIG. 8B depicts another example of a removable cover dedicated control. As shown in FIG. 8A, the example cover 800 may comprise a set of images, each forming an electrically isolated control surface that is woven with conductive thread. As shown in FIG. 8B, a first image 811 may be configured to correspond to a "play/pause" command, a second image 812 may be configured to correspond to an "increase volume" command, a third image 813 may be configured to correspond to a "decrease volume" command, a fourth image 814 may be configured to correspond to a "skip" command to play a next track, and a fifth image 815 may be configured to correspond to a given playlist comprising given audio content (e.g., age-appropriate audio content for a child user). Thereafter, a user (e.g., a child user) may be able to facilitate a listening experience at will by selecting one or more of the images of the cover to initiate and/or control audio playback by the playback device.

Other examples of a dedicated control that takes the form of a removable cover are also possible.

In some implementations, different regions of a control surface may be associated with different commands. For example, a first region of a given control surface may be associated with a "decrease volume" command and a second region of the given control surface may be associated with an "increase volume" command. Other examples are also possible.

In some implementations, a playback device may be associated with more than one cover that is each designated for a unique purpose. As one example, a first cover may be designated as a transport control and volume control cover, where each control surface is associated with a given transport control command or a given volume control command, a second cover may be designated as an audiobook cover, where each control surface is associated with a given audiobook, and a third cover may be designated as a music cover, where each control surface is associated with a given genre of music or a given playlist. Designated covers may enable a child user's listening experiences to be more focused (e.g., by playing from a determined set of audio content, such as a set of audiobooks) while still allowing the child user autonomy to control aspects of the listening experiences, such as initiating playback or selecting different content for playback from the set of available content based on the cover's configuration.

As another example, one or more covers of a playback device may each be associated with a respective user. For instance, a first cover may be associated with controls and/or audio content for a first user (e.g., an adult), a second cover may be associated with controls and/or audio content for a second user (e.g., a young adult), a third cover may be associated with controls and/or audio content for a third user (e.g., a child), and so on. In this way, each member of a household may have a respective cover that can be used with a given playback device to facilitate a personalized listening experience for that member.

As yet another example, respective covers for multiple playback devices of a local media playback system may be configured to provide a given audio scene or listening experience in a respective location of each playback device. For example, a first cover for a first playback device located in a master bathroom may be configured to control a set of audio content comprising relaxing sounds and/or music, a second cover for a second playback device located in an entertainment room may be configured to control a set of audio content comprising various playlists that may be appropriate when entertaining company, and a third cover for a third playback device located in a play room may be configured to control a set of audio content comprising stories and children's music. Other examples are also possible.

In some implementations, a user may be able to customize a cover by applying her own art to one or more control surfaces of the cover. As one example, the cover may comprise the textile material, embedded electrical components, and the textile cabling components, but may not include any printed shapes, images, or designs, or woven conductive thread. Instead, conductive thread, or some other conductive material that can be easily applied to the textile material (e.g., conductive paint, conductive tape, etc.) may be included with the cover so that the user can apply the conductive material in a customized way to create one or more custom shapes, designs, and/or images as desired, and then configure each control surface as described above. As another example, the cover may comprise the textile material, embedded electrical components, the textile cabling components, and one or more clusters of conductive thread woven into the textile material that each forms an electrically isolated control surface, but no printed shapes, images, or designs. The user may then add her own shapes, images, and/or designs (e.g., by painting or drawing over the control surfaces) as desired, and then configure each control surface as described above. Other examples are also possible.

A cover may be configured as a dedicated control at the time of configuring the playback device with which it is associated. Alternatively, or additionally, the cover may be configured and/or re-configured at one or more subsequent times.

Advantageously, a dedicated control cover as described above enables a child user to independently facilitate a listening experience without requiring assistance or intervention from another user (e.g., an adult user) or a software controller device, while still ensuring that the child user is protected from accessing audio content that may be inappropriate. Furthermore, the dedicated control cover may be adjusted over the course of time to adapt to the child user's personality and/or medio content interests as the child user grows. For example, a cover may be reconfigured to modify the available audio content with which the cover is associated. As another example, the cover may be replaced with a different cover that is more aesthetically pleasing based on the child user's changing tastes.

b. Remote

Young listeners may be interested in discovering audio content and making independent choices regarding selecting audio content for playback. However, parents of young listeners may wish to limit young listeners' access to inappropriate content and/or apply constraints on audio controls such as volume level when using a software controller device to select audio content for playback. Therefore, also disclosed herein is a type of dedicated control for controlling a playback device that may take the form of a remote that comprises one or more selectable surface areas that are associated with respective commands. Advantageously, the disclosed remote may provide a user with autonomy in selecting audio content for playback and additionally enables a user to explore creative thinking, decision making, and motor skills.

The remote may comprise various shapes and/or sizes. As one example, the remote may take the form of a circular wheel comprising one or more selectable wedges that is each associated with one or more given respective commands. As another example, the remote may take the form of a square or rectangular block comprising one or more selectable sections that is each associated with one or more given respective commands. Other examples are also possible.

The one or more selectable surface areas may take various forms. As one example, each selectable surface area may take the form of a physical button that may be pushed, depressed, or clicked. As another example, each selectable surface area may take the form of a touch screen or other capacitive surface that is configured to receive a touch input. As yet another example, the remote may further comprise a rotatable pointer that may be positioned to "point" to and thereby select a given surface area.

Figure 9:
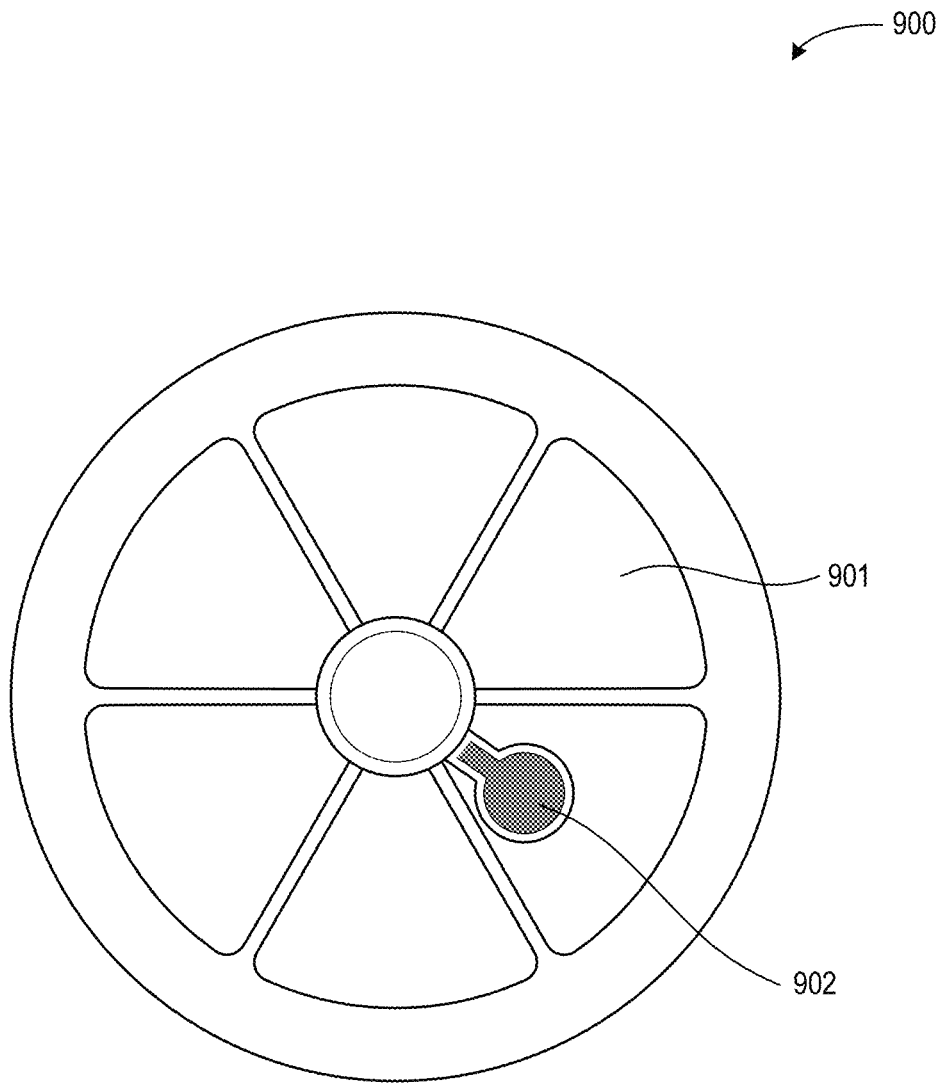
FIG. 9 depicts another example of a dedicated control according to disclosed embodiments of dedicated controls.

FIG. 9 depicts one such example remote 900 that takes the form of a circular wheel comprising six selectable wedges 901 that may each be configured to respond to a respective command. In one implementation, each of the selectable wedges 901 may take the form of a physical button that may be pushed, depressed, or clicked. Each wedge 901 may comprise a respective color. In another implementation, each of the selectable wedges 901 may take the form of a touch screen or other capacitive surface that is configured to receive a touch input. Each wedge 901 may be configured to display a respective color when selected. The respective colors of the wedges 901 may be pre-set or user-configured. Further, the remote 900 may include a rotatable pointer 902 that may be positioned to point to and thereby select a given surface area or may dynamically point to a given wedge to indicate that the given wedge was selected. Other examples are also possible.

Additional information about tuning a music discovery dial may be found in U.S. patent application Ser. No. 15/912,137 filed Mar. 5, 2018 and entitled "Music Discovery Dial," now U.S. Pat. No. 10,656,902, which is incorporated herein by reference in its entirety. Other examples are also possible.

The remote may be configured in various ways. As one example, the remote may be pre-configured by the manufacturer such that each selectable area controls given audio content that has been pre-selected and determined to be age-appropriate for a given user. As another example, the remote may be configured by a user via a software controller device (e.g., smartphone, tablet, etc.), such as the controller device 130, that is configured to communicate with the remote (e.g., via WIFI, Bluetooth, or a wired connection, etc.). For instance, a user interface (e.g., the user interface 133) that is displayed on the software controller device may present the user with a series of prompts and/or options for associating each respective selectable area with one or more given commands. In this respect, the one or more given commands associated with each respective selectable area of the remote may comprise both an audio playback command and a visual indicator command.

The audio playback command may comprise a command to play back given audio content when the respective selectable area is selected. The given audio content may be selected from a given media content source, such as a from a media streaming service (e.g., Spotify, Pandora, etc.). In some implementations, the remote may retrieve and store the selected given audio content in a memory of the remote at the time of configuration. In some implementations, the remote may store a pointer to the selected given audio content and then retrieve the given audio content for playback from the media content source or receive the given audio content for playback from the playback device when the respective selectable area is selected. Other examples are also possible.

The visual indicator command may comprise a command to display a given visual indicator at each of the remote and one or more playback devices associated with the remote. A visual indicator may take the form of displaying a light or a series of lights. For example, a user may configure the remote such that when a given selectable surface area is selected, the remote (i) causes the selected surface area to light up in a given color (e.g., light blue), (ii) plays back given audio content (e.g., ocean sounds), and (iii) causes the associated playback device to display a given light color and/or light pattern (e.g., a blue light, a blinking blue light, or a pattern of blue light, etc.). In this respect, the remote may be configured to display the same colored visual indicator at both the remote and the playback device or display different colors at each of the remote and the playback device. Further, in some implementations, the remote may be associated with more than one playback devices, such that each selectable area is associated with a given playback device, controls given audio content, and causes the given playback device to display a given color visual indicator. In some implementations, the remote may be associated with more than one playback device as a result of a given playback device being a member of a bonded zone including one or more other playback devices, such that each selectable area controls given audio content that is to be played back synchronously by the one or more playback devices and causes the one or more playback devices to display the same color visual indicator. More information about adjusting audio playback based on bonded zone players may be found in U.S. patent application Ser. No. 14/040,068 filed Sep. 27, 2013 and entitled "System and Method for Issuing Commands in a Media Playback System," now U.S. Pat. No. 9,355,555, which is incorporated herein by reference in its entirety.

c. Sound Key

As mentioned above, sound may help create and/or support different listening moments, scenes, and/or listening experiences and may foster a more personal, meaningful, and targeted interaction with one's environment. Further, sharing sound can help facilitate bonding moments that create memorable and enjoyable experiences between users. Therefore, it may be desirable for users to share their listening preferences and/or experiences with family and friends. However, sharing audio content and listening preferences typically requires the use of a software controller device, such as a smartphone, which may become a distraction for users when attempting to engage in quality bonding time and may also raise concerns about access to undesired content for younger users. Therefore, also disclosed herein is a type of dedicated control that may take the form of a portable "sound key."

Figure 10A:
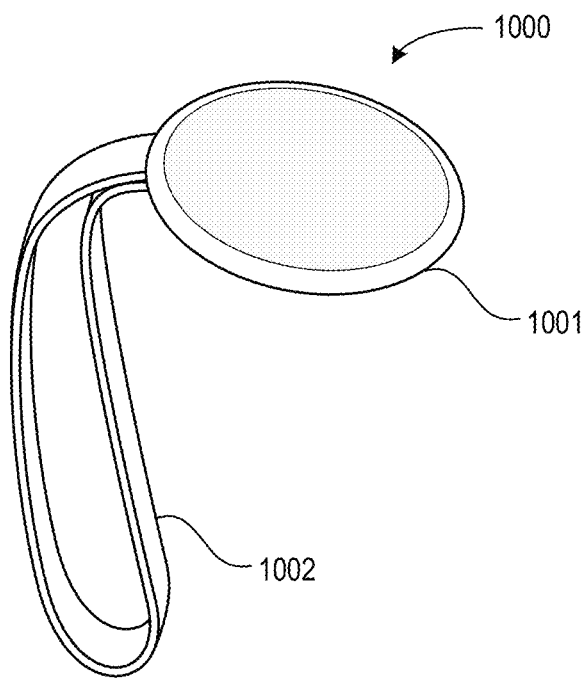
FIGS. 10A, 10B, and 10C depict yet another example of dedicated controls according to disclosed embodiments of dedicated controls.

A sound key may generally have a "key" component—that may resemble a stone, a charm, or some other conveniently portable object—that is configured to communicate with one or more playback devices and a detachable "leash" component—such as a chain, a lanyard, a bracelet, among other possibilities—that enables a user to conveniently carry and transport the sound key. FIG. 10A depicts one example of a second key. As shown in FIG. 10A, the example sound key 1000 may comprise a key component 1001 and a leash component 1002 as described above.

A sound key, such as the sound key 1000, may be configured to collect information regarding a user's personal listening experiences. In this regard, a user's sound key may serve as the user's personal audio "fingerprint." Listening experiences may include, as some examples, listening history, preferred genres of music, most frequently played audio content, and preferred audio scenes, among other possibilities. In general, a sound key may be configured using a software controller device (e.g., smartphone, tablet, etc.) that presents a user interface that enables a user to input configuration settings for the sound key in response to a series of prompts and/or questions. The sound key may be configured to collect information regarding a user's personal listening preferences in various ways.

Figure 10B:
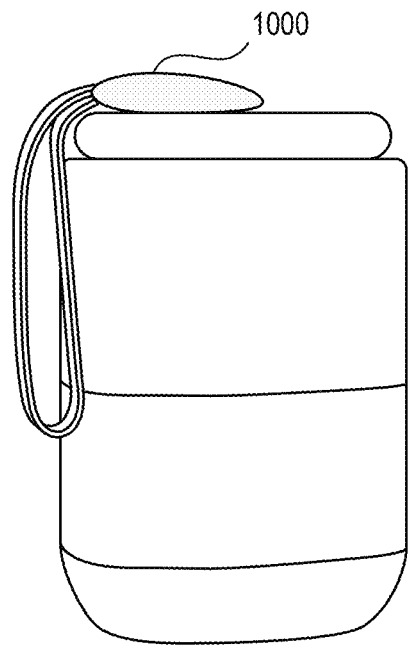

In one aspect, the sound key may be associated with a given user, which may involve providing the sound key with user information including an account or profile of the given user. Such user information may also include a user age (e.g., toddler, kindergarten, etc.) and/or a user type (e.g., child, adult, etc.) that may be used to inform listening experiences for the given user. In another aspect, the sound key may be further associated with a given playback device that may be a primary playback device associated with the given user such that the sound key monitors, evaluates, and/or stores information regarding the given user's listening experiences based on audio content that is played back by the primary playback device. In some implementations, the sound key may be additionally or alternatively configured to monitor, evaluate, and/or store information regarding the user's listening experiences based on audio content that is played back by any playback device within a given proximity of the user's sound key. In general, the sound key may be placed near (e.g., within a given proximity of), placed on top of, or "tapped" on a given playback device to initiate or pause interaction between the sound key and a playback device. FIG. 10B depicts an example of the sound key 1000 in an instance where the sound key 1000 has been placed on top of a playback device (which may be any of the playback devices 110) such that the sound key 1000 and the playback device are configured to interact with each other. While the sound key 1000 remains atop the playback device, it may continue to monitor and/or collect information about an ongoing listening experience including audio content being played back by the playback device.

Additional information regarding detecting users based on playback device proximity and retrieving user configuration data to process commands and play back media content is described in U.S. Pat. Pub. No. 2020/0194004, filed Dec. 10, 2019, and titled "User Specific Context Switching," which is incorporated by reference herein in its entirety. Additional information regarding media playback based on identifying user-specific preferences from a plurality of user accounts is described in U.S. patent application Ser. No. 14/263,743 filed Apr. 28, 2014 and titled "Management of Media Content Playback," now U.S. Pat. No. 9,478,247, which is incorporated by reference herein in its entirety.

After the sound key has been configured to collect a user's listening experiences, the sound key may be used to reproduce and/or resume the user's listening experiences at one or more other playback devices, share the user's listening experiences with one or more other users, and/or create new listening experiences with one or more other users. This may take various forms.

As one possibility, a sound key may be used to reproduce and/or resume the user's listening experiences at a different playback device. For instance, a user's sound key may have been tapped on or placed near/atop a first playback device (e.g., a primary playback device) in the user's bedroom that is playing back first audio content based on the user's listening experiences that have been collected by the sound key. The user may wish to move to a different room and may wish to "move" the current listening experience including the first audio content to the different room. Thus, the user may tap the sound key on the first playback device, which may (i) cause the first playback device to pause playback of the first audio content at the first playback device and (ii) cause the sound key to collect information about the first audio content playback at the first playback device (e.g., track that was playing, timing information when the track was paused, etc.). The user may then transport the sound key to the different room and tap the sound key at a second playback device in the second room, thereby (i) causing the second playback device to begin playing back the first audio content at the second playback device based on the information collected by the sound key at the first playback device indicating when the audio content was previously paused and (ii) causing the sound key to collect information about playback of the first audio content at the second playback device.

As another possibility, the sound key may be used to share the user's listening experiences with one or more other users. For instance, the user may share his listening experiences with a second user by tapping his sound key on a playback device associated with the second user (e.g., a primary playback device of the second user).

As yet another possibility, two or more users may use their respective sound keys to create shared listening experiences. For instance, the two or more users may place their respective sound keys near or atop a given playback device or concurrently, or substantially concurrently (e.g., within a given amount of time, such as 5 seconds, 10 seconds, etc.), tap their respective sound keys on the given playback device to initiate a shared listening experience. Based on information about the users' respective user experiences (e.g., playlists, genres of music, recently and/or frequently played content) that is provided by their respective sound keys, the playback device may identify and play back given audio content. The given audio content may be identified in various ways. As one possibility, the audio content may be identified based on metadata corresponding to audio content for the users. For example, the playback device may determine that each user's sound key indicates that each user listens to music by Artist A. Thus, the computing device may identify songs by Artist A and similar artists, create a playlist comprising the songs, and play back the playlist. As another possibility, the playback device may identify one or more common audio characteristics (e.g., a genre of music) and may identify and play back audio content based on the one or more common audio characteristics. In turn, each respective sound key may collect and store information about the audio content played at the new shared experience. The collected information may be used to create a playlist or a scene, such as a "family mode" scene, that can be used to inform future shared experiences. Other examples are also possible.

In some implementations, when two or more sound keys are used to share or create listening experiences as described above, a given user's sound key may dictate the type of audio content that is played back based on one or more user characteristics. For example, if at least one of the sound keys is associated with a child user or with a user of a given age (e.g., less than 12 years), the audio content that is identified for playback for a new shared experience may be limited to children's content. Audio content may be identified as children's content in various ways as described above, including, as some non-limiting examples, based on audio content metadata, identifiers provided by a media content service, and/or audio content that is similar to the child user's listening history (which may be provided by the child user's respective sound key). In some limitations, when two or more sound keys are respectively associated with different types of users, a given user type may control what audio content is played back. For example, audio content playback may be limited to children's content any time a child user's sound key is used to initiate and/or control audio content at a playback device that is not associated with the sound key (e.g., the playback device has not been identified as a primary playback device for the child user). Other examples are also possible.

In some implementations, a sound key may be Near Field Communication ("NFC")-capable and may interact with other NFC-capable objects to identify and play back audio content that creates a given listening experience and/or audio scene. In such implementations, the sound key may be tapped on other NFC-embedded objects to collect one or more characteristics of the object that may then be used to identify and play back, at a given playback device, audio content that is associated with the other NFC-embedded objects. As one example, the sound key may be tapped on an NFC-embedded book to collect information (e.g., metadata) regarding one or more characteristics of the book (e.g., book title, author name). Thereafter, the sound key may be tapped on a playback device to communicate that collected information to the playback device, which may identify and play back, based on the information collected by the sound key, audio content that is associated with the book, such as a corresponding audiobook or a soundtrack corresponding to a film adaptation of the book.

As another example, the sound key may be tapped on an NFC-embedded movie case (e.g., a Blu-ray disc case) to collect information (e.g., metadata) regarding one or more characteristics of the movie (e.g., movie title, score, etc.). Thereafter, the sound key may be tapped on a playback device to communicate that collected information to the playback device, which may identify and play back, based on the information collected by the sound key, audio content that is associated with the movie, such as a corresponding soundtrack.

As yet another example, the sound key may be tapped on an NFC-embedded toy to collect information (e.g., metadata) regarding one or more characteristics of the toy (e.g., character name etc.). Thereafter, the sound key may be tapped on a playback device to communicate that collected information to the playback device, which may identify and play back, based on the information collected by the sound key, audio content that is associated with the toy. For example, the sound key may have identified the toy as a character from a children's movie, such as an Elsa doll from the movie "Frozen." Therefore, the playback device may play back a soundtrack or a given song associated with the character and/or the movie, such as the song "Let it Go." As another example, the sound key may have identified the toy as a character from a video game, such as a given type of Pokémon. Therefore, the playback device may play back a soundtrack or a given sound associated with the character and/or the video game, such as the given Pokémon's catchphrase and/or the Pokémon audio theme. Other examples are also possible.

In some implementations, the sound key may be tapped on more than one object successively, or substantially successively, to collect information (e.g., metadata) regarding one or more characteristics of each object, which may thereafter be used to identify other audio content for playback or create an audio playlist comprising a combination of audio content associated with each object. The sound key may determine that objects have been tapped successively based on an amount of time that has lapsed in between each tap. For example, the sound key may determine that information collected for objects that are tapped in succession within a certain amount of time (e.g., 5 seconds, 10 seconds, etc.) should be treated as a single set of audio content source material.

Figure 10C:
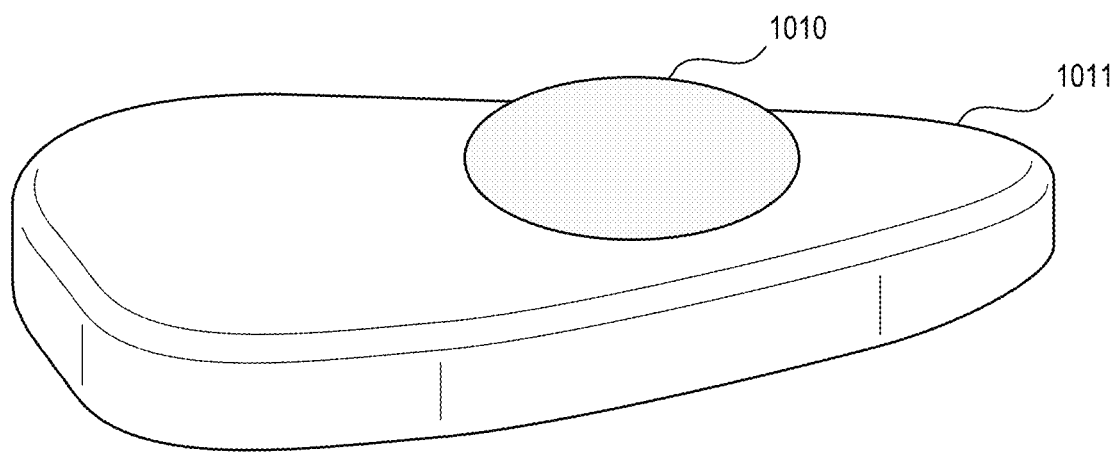

In some implementations, the sound key may be configured to communicate with one or more separate controllers associated with a playback device, such as a controller similar to a dedicated control remote described above. The controller may have one or more magnetized surfaces areas that are each associated with a given playback command (e.g., initiate a given audio scene, play back given audio content, etc.). In such implementations, the sound key may also be magnetized or have a removable magnetic component that may be attached to the sound key for use with the controller. The sound key may then be used as a remote for the controller by moving the sound key over and/or around the general surface of the controller. When the sound key magnetically connects to a particular surface area, the given playback command associated with the particular surface area may be initiated. FIG. 10C depicts one such example of a sound key and controller device that are configured to communicate as described above. As shown in FIG. 10C, an example sound key 1010 may comprise a stone, charm, or other conveniently portable object. The sound key 1010 may be configured to communicate with the controller device 1011 as described above by being placed on/around different regions of the surface of the controller device 1011 and thereby select a given region associated with a respective playback command.

In another implementation, a sound key may include a graphical display (e.g., a touchscreen display) that may display a visual representation of information collected by the sound key. For example, the graphical display may display metadata (e.g., album artwork, track information, artist, genre, etc.) associated with audio content. The graphical display may enable a user to interact with the sound key via graphical user interface (GUI) controls to browse the collected information and perhaps select one or more components of the visual representation for additional information/interaction. The sound key may additionally include one or more physical controls (e.g., buttons) that enable the user to interact with the sound key. Further, the sound key may include a control to execute a reset function (e.g., an "erase" or a "reset" button) to delete historical information that has been collected by the sound key as of the time the function is executed. Thereafter, the sound key may then begin collecting information anew. In some implementations, the reset function may be automatically executed after a default or predetermined amount of time has passed since the sound key was last tapped or since the sound key's most recent collection of information. In some instances, the user may be provided with the option to store the collected information in a memory of the sound key or another device of the media playback system (e.g., a group coordinator device, a remote computing device, etc.).

d. Modular Lighted Controls

Sound's ability to create listening moments, scenes, and/or listening experiences and foster meaningful and targeted interactions with one's environment may be further enhanced with accompanying light. Therefore, also disclosed herein is a type of dedicated control for controlling a playback device that may comprise a set of one or more lighted controls for controlling a playback device, such as a pair of lighted controls that may be used to interact with the playback device to create dynamic audiovisual experiences. Each lighted control of the playback device may generally resemble a stone-shaped piece that may be removably attached to various regions of the playback device. However, the lighted controls may take other shapes as well. In general, the set of lighted controls may be placed near (within a given proximity of), atop, or tapped on a playback device to initiate or otherwise engage in playback control of the playback device.

Figure 11:
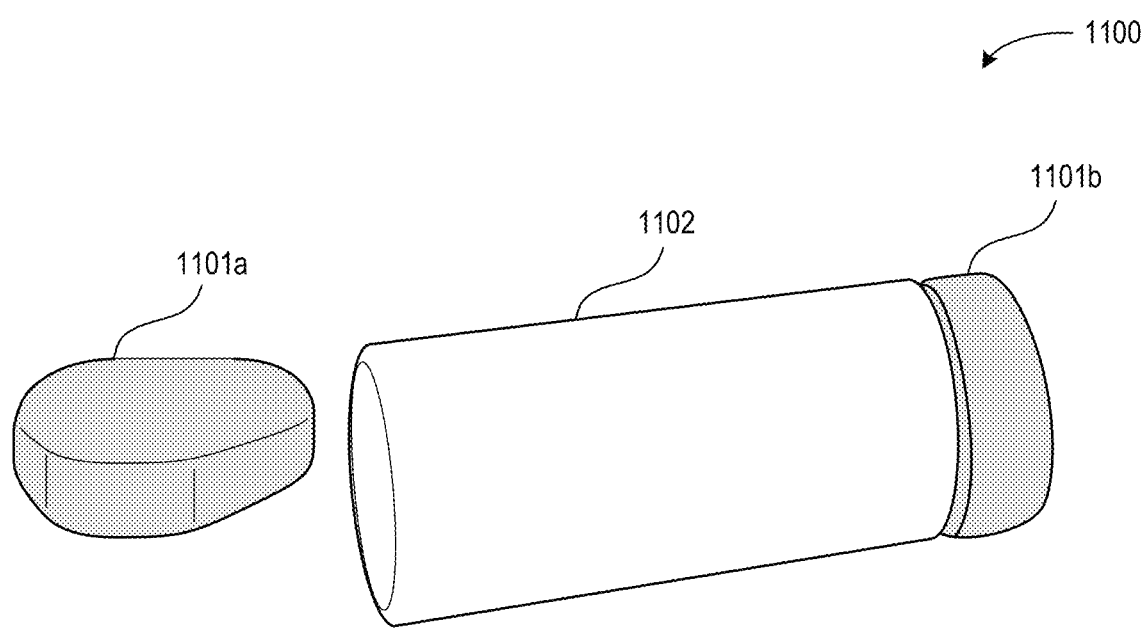
FIG. 11 depicts a further example of a dedicated control according to disclosed embodiments of dedicated controls.

FIG. 11 depicts one such example 1100 of a set of modular lighted controls. As shown in FIG. 11, a first lighted control 1101*a* and a second lighted control 1101*b* may form a set of modular lighted controls for a playback device 1102 (which may be a modular playback device as described above). The lighted controls 1101*a* and 1101*b* may be configured to control playback of the playback device 1102 in various ways, as will be described in more detail below.

A set of one or more lighted controls may be configured via a user interface of a software controller device to initiate audio playback commands (e.g., transport control commands, volume commands, control audio content, etc.), and/or visual commands (e.g., turn light on or off, change light color, etc.) based on given behavior of the lighted controls, which may include, as some non-limited examples, attaching the lighted controls to a given region of the playback device, or detaching the lighted controls from the playback device. In this regard, each lighted control may be configured to initiate a different set of one or more audiovisual commands. As one possibility, a first lighted control may be configured to control transport control and volume commands, and a second lighted control may be configured to control audio content. As another possibility, the lighted controls may be configured in a primary-secondary hierarchy similar to the primary-secondary hierarchy described above with respect to the second mode of operation, where a first lighted control may be associated with a primary user (e.g., a parent) and offer a broader set of audiovisual controls, and a second lighted control may be associated with a secondary user (e.g., a child) and offer a limited set of audiovisual controls. In this way, a parent user and a child user may use the lighted controls together to create shared audiovisual experiences. Other examples are also possible.

Further, the lighted controls may adapt audiovisual behavior based on one or more audio characteristics of audio content being played back by the playback device. For instance, the lighted controls may adapt their lighting to match the genre, volume, bass, cadence, equalization settings, and/or the general vibe of the audio content that is being played back by the playback device. As one example, if the audio content comprises rock music, the lighted controls may display bright colors and may frequently change colors throughout playback to match the beat and/or inflection of the music and vocals and thus create a vibrant, energized visual scene. Conversely, if the audio content comprises jazz music, the lighted controls may display muted colors that create a relaxed visual scene. Other examples are also possible.

Still further, the lighted controls may adapt audiovisual behavior based on a time of day. For instance, the lighted controls may display a broad range of light colors and visual themes during the daytime. Conversely, the lighted controls may limit nighttime visual displays to more muted colors and/or create more relaxed and calming visual themes. Similarly, the lighted controls may be used to control different types of audio content that is played back by the playback device based on a time of day.

Furthermore, the lighted controls may create a given visual theme in response to an audio scene that is being played back by the playback device. For instance, the playback device may detect (via one or more microphones) certain trigger words in its environment and may then play back given audio content based on the detected trigger words. For example, a parent may be reading a child a bedtime story which may incorporate trigger words that indicate given audio cues, such as "rain" or "birds." Based on detecting the trigger words, the playback device may play back audio content such as rainfall sounds or bird chirps/bird songs to create an immersive audio experience. In response, the lighted controls may react to create a corresponding visual experience, such as by dimming the lights or displaying a given color to enhance the audio experience.

In some implementations, the lighted controls and/or the playback device may be configured to interact with one or more objects, such as toys, that have been designed to communicate with the lighted controls and/or the playback device via one or more embedded sensors. For instance, the lighted controls may be used to control audio content and lighting behavior based on information that is associated with a given toy. For example, one or more of the lighted controls may determine, via the toy's sensor, that the toy is a dinosaur. The lighted control(s) may then cause the playback device to play back related audio content (e.g., dinosaur sounds) and may display a corresponding visual theme (e.g., a jungle or a rocky terrain). Other examples are also possible.

It should be understood that one or more features of any one of the dedicated controls described above may be combined with one or more features of any other of the dedicated controls to form one or more additional types of dedicate controls.

Figure 12:
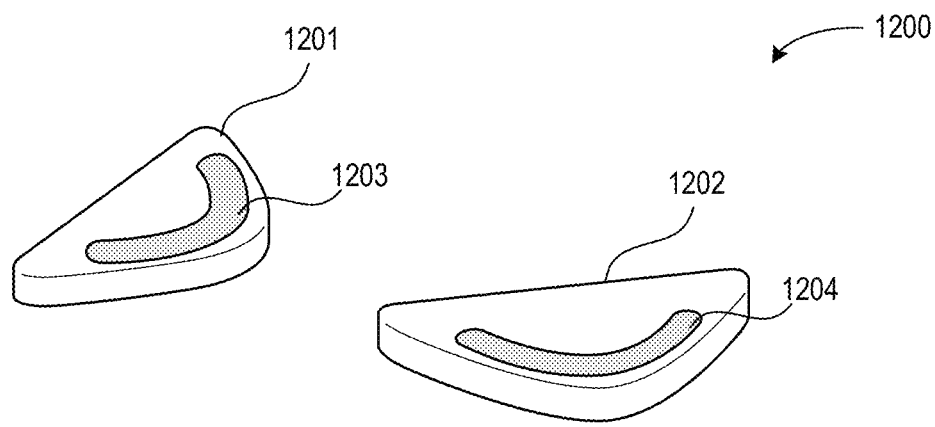
FIG. 12 depicts a further example of a dedicated control according to disclosed embodiments of dedicated controls.

As one example, an additional type of dedicated control may take the form of a "dual control" dedicated control that comprises a pair of remotes that can be used by two users to control a playback device. The remotes may be configured via a user interface of a software controller device as described above. Further, the remotes may be configured in a primary-secondary hierarchy similar to the primary-secondary hierarchy described above with respect to the second mode of operation, where a first remote may be associated with a primary user (e.g., a parent) and offer a broader set of controls and access to a broader range of audio content, and a second remote may be associated with a secondary user (e.g., a child) and offer a limited set of controls and access to a limited range of audio content. In this way, a parent user and a child user may use the remotes together to create shared audio experiences. In some implementations, the remotes may also be used to control a lighted display of the playback device. FIG. 12 depicts one such example of a dual control dedicated control 1200. The dual control 1200 may comprise a first remote 1201 and a second remote 1202. Although not shown in FIG. 12 the remotes 1201 and 1202 may have a respective set of controls that may be associated with a respective user type. Further, the remotes 1201 and 1202 may have respective light controls 1203 and 1204 that facilitate control of a lighted display of a given playback device, such as by tapping the lighted controls to select a given color and/or color scene that is to be displayed by the given playback device. Other examples are also possible.

Figure 13A:
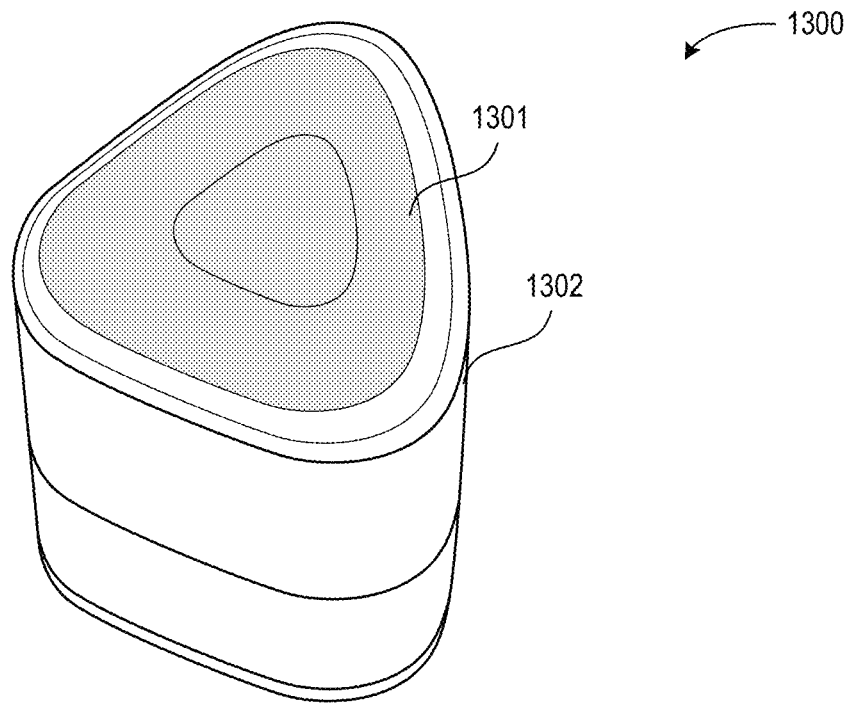
FIGS. 13A and 13B depict further examples of dedicated controls according to disclosed embodiments of dedicated controls.

As another example, an additional type of dedicated control may take the form of a single lighted control (e.g., a stone-shaped controller designed to be attached to a playback device) for controlling a playback device that is configured to induce a specific audiovisual theme. For instance, the lighted control may be configured as a pre-natal or neo-natal control that initiates and/or controls a calming, tranquil, and soothing audiovisual experience. For example, when the lighted control is placed near or atop the playback device, the playback device may play back relaxing sounds and/or music, and the lighting control may display one or more colors that induce a calming environment. FIG. 13A depicts one such example 1300 of a single lighted control. As shown in FIG. 13A, a lighted control 1301 may be placed atop a playback device 1302 to control playback of audio content by the playback device 1302.

Figure 13B:
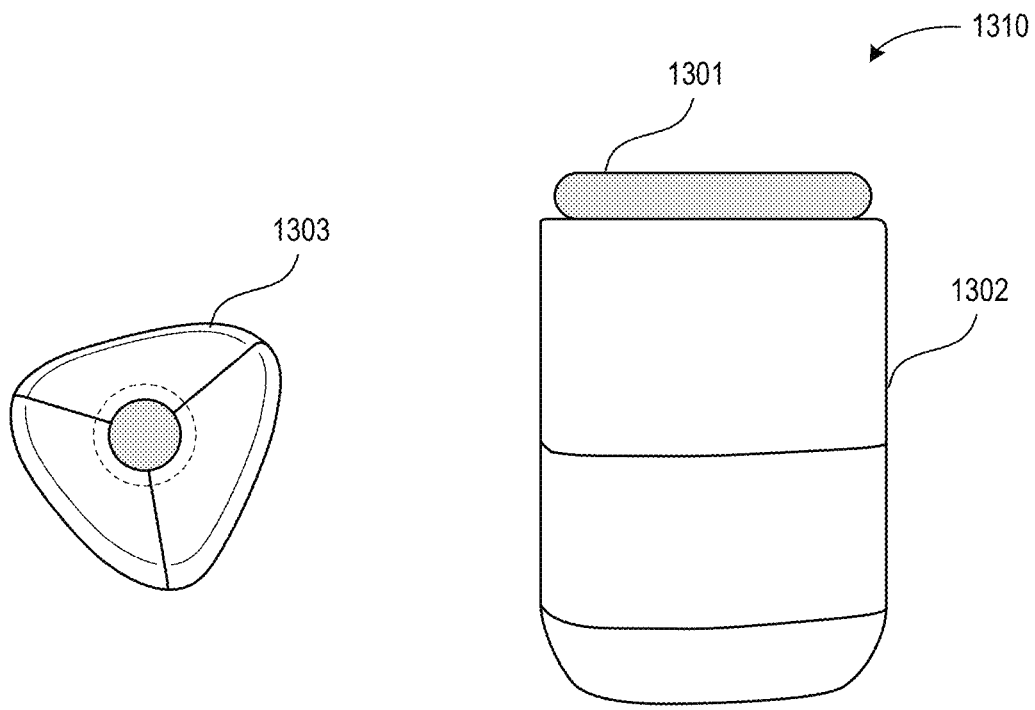

In some implementations, the lighted control may additionally be controlled with a separate controller, such as an associated remote, that enables a user to remotely control the lighted control. In such implementations, the lighted control may be kept near or atop the playback device, and the associated remote may be used to turn the lighted control on or off, or to initiate a given audiovisual theme. Advantageously, such a dedicated control may be used to create an audio environment for a fetus before birth. After the baby is born, the dedicated control may be used to provide a familiar audio environment that may help the baby feel relaxed and comforted. FIG. 13B depicts one such example 1310 of a lighted control and separate controller that may be used to control audio playback. FIG. 13B depicts the lighted control 1301 and playback device 1302 of FIG. 13A. As shown in FIG. 13B, the lighted control 1301 may remain atop the playback device 1302. A separate controller 1303 may be used to further enable control of a listening experience as described above.

Still other examples of additional dedicated controls comprising one or more features of the dedicated controls disclosed herein are possible.

Figure 14:
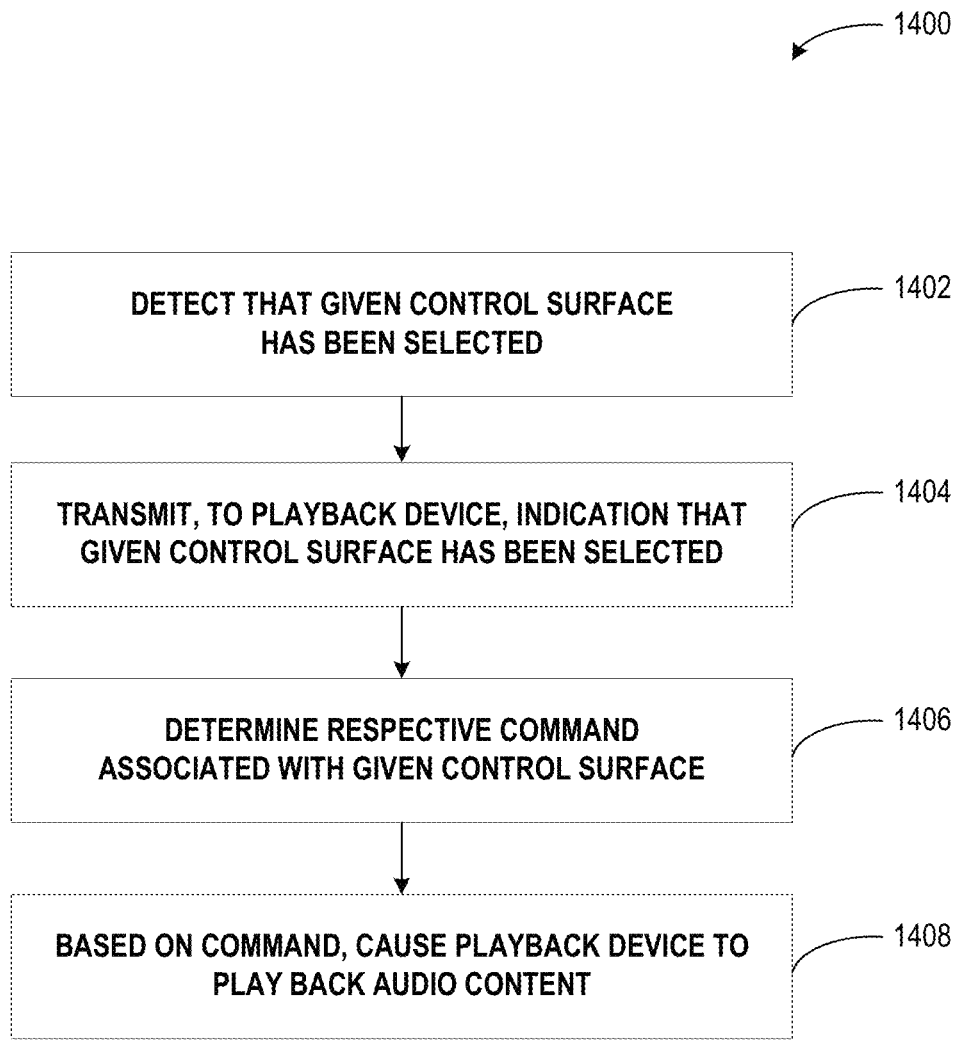
FIG. 14 is a flow diagram of an example process for playing back audio content based on commands received at one or more dedicated controls.

FIG. 14 depicts a flowchart of an example process for playing back audio content based on a command received via a dedicated control, which may be any of the various dedicated controls disclosed herein and previous described. The example process 1400 may be executed within an operating environment involving, for example, the media playback system 100, one or more of the playback devices 110, one or more of the network microphone devices 120, one or more of the control devices 130, and/or one or more of the dedicated controls described above with respect to FIGS. 8A-13B. The example process 1400 may include one or more operations, functions, or actions as illustrated by one or more of blocks 1402-1408. Although blocks 1402-1408 are illustrated in sequential order, these blocks may also be performed in parallel, and/or in a different order than those described herein. Also, the various blocks may be combined into fewer blocks, divided into additional blocks, and/or removed based upon the desired implementation.

The example process may begin at block 1402, when the media playback system detects that a given control surface of a dedicated control has been selected. The media playback system may detect the selection in any of the various ways described herein, which may involve detection by a dedicated control (e.g., via one or more physical controls and/or a user interface of the dedicated control), a controller device, and/or a playback device of the media playback system.

At block 1404, the media playback system may transmit, to a given playback device with which the dedicated control is associated, an indication that the given control surface of the dedicated control has been selected. In turn, at block 1406, a determination of the respective command associated with the given control surface of the dedicated control may be made. This may involve the given playback device communicating with the dedicated control, another playback device of the media playback system, and/or a remote computing device of the media playback system to determine the respective command associated with the given control surface. As another possibility, the given playback device may have received and stored the respective command at a time when the dedicated control was configured and associated with the given playback device. Other examples as previous described are also possible.

Regardless of the way in which the determination of the respective command is made, based on the command, given audio content may be retrieved for playback by the given playback device. As one possibility, the playback device may obtain the given audio content from one or more playback devices of the media playback system. As another possibility, the playback device may obtain the given audio content from a media content source and/or a remote computing device as previous discussed. At block 1408, the playback device may play back the given audio content.

While FIG. 14 describes one example process with respect to a single dedicated control and a single playback device, it should be understood that a media playback system may comprise any number of dedicated controls and network devices, and determining audio content for playback may involve communication and/or coordination between any of those dedicated controls and devices at a given time.

VIII. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A playback device comprising:
   at least one processor;
   a non-transitory computer-readable medium; and
   program instructions stored on the non-transitory computer-readable medium that are executable by the at least one processor such that the playback device is configured to:
   based on a room setting of the playback device, determine that the playback device is associated with a first room of a media playback system;
   based on determining that the playback device is associated with the first room, operate in a first mode, wherein the first mode comprises a default mode of the playback device, and wherein the first mode is associated with a first user type, a first set of playback control options, and a first type of audio content;
   while operating in the first mode, determine that the room setting of the playback device has changed;
   based on the changed room setting, determine that the playback device is no longer associated with the first room and is associated with a second room of the media playback system;
   based on determining that the playback device is associated with the second room, transition from operating in the first mode to operating in a second mode, wherein the second mode is associated with a second user type that is different from the first user type, a second set of playback control options that is different from the first set of playback control options, and a second type of audio content that is different from the first type of audio content;
   while operating in the second mode, determine that the playback device is no longer associated with the second room and is associated with the first room;
   transition from operating in the second mode to operating in the first mode;
   while operating in the first mode, receive a command to play back audio content;
   determine that the command corresponds to a user of the first user type, a playback control option within the first set of playback control options, and audio content of the first type of audio content; and
   based on (i) operating in the first mode and (ii) the determination that the command corresponds to a user of the first user type, a playback control option within the first set of playback control options, and audio content of the first type of audio content, execute the command to play back the audio content.

2. The playback device of claim 1, wherein the program instructions that are executable by the at least one processor such that the playback device is configured to transition from operating in the second mode to operating in the first mode comprise program instructions that are executable by the at least one processor such that the playback device is configured to:
   transition from operating in the second mode to operating in the first mode based on determining that the playback device is no longer associated with the second room.

3. The playback device of claim 1, further comprising program instructions stored on the non-transitory computer-readable medium that are executable by the at least one processor such that the playback device is configured to:
   after determining that the playback device is no longer associated with the second room and is associated with the first room, continue operating in the second mode.

4. The playback device of claim 1, wherein the first mode corresponds to an adult mode, wherein the first user type corresponds to an adult user, wherein the second mode corresponds to a child mode, and wherein the second user type corresponds to a child user.

5. The playback device of claim 1, wherein the second set of playback control options is a subset of the first set of playback control options.

6. The playback device of claim 1, wherein the program instructions that are executable by the at least one processor such that the playback device is configured to determine that the playback device is no longer associated with the second room and is associated with the first room comprise program instructions that are executable by the at least one processor such that the playback device is configured to:
   determine that the playback device has been removed from a playback device base of the second room.

7. The playback device of claim 1, wherein the playback device is a first playback device, and wherein the program instructions that are executable by the at least one processor such that the playback device is configured to determine that the playback device is no longer associated with the second room and is associated with the first room comprise program instructions that are executable by the at least one processor such that the playback device is configured to:
   determine that the playback device is no longer within a given proximity of a second playback device associated with the second room.

8. The playback device of claim 1, further comprising program instructions stored on the non-transitory computer-readable medium that are executable by the at least one processor such that the playback device is configured to:
   based on determining that a predetermined period of time has lapsed, transition from operating in the first mode to operating in the second mode independent of the room setting of the playback device.

9. The playback device of claim 1, wherein the playback device is a first playback device, and wherein the program instructions that are executable by the at least one processor such that the playback device is configured to execute the command to play back the audio content comprise program instructions that are executable by the at least one processor such that the playback device is configured to:
   determine that the command to play back the at audio content was provided by a user that matches the first user type; and
   based on the determination that the user matches the first user type, execute the playback command to play back the audio content.

10. A non-transitory computer-readable medium, wherein the non-transitory computer-readable medium is provisioned with program instructions that, when executed by at least one processor, cause a playback device to:
   based on a room setting of the playback device, determine that the playback device is associated with a first room of a media playback system;
   based on determining that the playback device is associated with the first room, operate in a first mode, wherein the first mode comprises a default mode of the playback device, and wherein the first mode is associated with a first user type, a first set of playback control options, and a first type of audio content;
   while operating in the first mode, determine that the room setting of the playback device has changed;

based on the changed room setting, determine that the playback device is no longer associated with the first room and is associated with a second room of the media playback system;

based on determining that the playback device is associated with the second room, transition from operating in the first mode to operating in a second mode, wherein the second mode is associated with a second user type that is different from the first user type, a second set of playback control options that is different from the first set of playback control options, second type of audio content that is different from the first type of audio content;

while operating in the second mode, determine that the playback device is no longer associated with the second room and is associated with the first room;

transition from operating in the second mode to operating in the first mode;

while operating in the first mode, receive a command to play back audio content;

determine that the command corresponds to a user of the first user type, a playback control option within the first set of playback control options, and audio content of the first type of audio content; and based on (i) operating in the first mode and (ii) the determination that the command corresponds to a user of the first user type, a playback control option within the first set of playback control options, and audio content of the first type of audio content, execute the command to play back the audio content.

11. The non-transitory computer-readable medium of claim 10, wherein the program instructions that, when executed by the at least one processor, cause the playback device to transition from operating in the second mode to operating in the first mode comprise program instructions that, when executed by the at least one processor, cause the playback device to:

transition from operating in the second mode to operating in the first mode based on determining that the playback device is no longer associated with the second room.

12. The non-transitory computer-readable medium of claim 10, wherein the non-transitory computer-readable medium is also provisioned with program instructions that, when executed by at least one processor, cause the playback device to:

after determining that the playback device is no longer associated with the second room and is associated with the first room, continue operating in the second mode.

13. The non-transitory computer-readable medium of claim 10, wherein the first mode corresponds to an adult mode, wherein the first user type corresponds to an adult user, wherein the second mode corresponds to a child mode, and wherein the second user type corresponds to a child user.

14. The non-transitory computer-readable medium of claim 10, wherein the second set of playback control options is a subset of the first set of playback control options.

15. The non-transitory computer-readable medium of claim 10, wherein the program instructions that, when executed by at least one processor, cause the playback device to determine that the playback device is no longer associated with the second room and is associated with the first room comprise program instructions that, when executed by at least one processor, cause the playback device to:

determine that the playback device has been removed from a playback device base of the second room.

16. The non-transitory computer-readable medium of claim 10, wherein the playback device is a first playback device, and wherein the program instructions that, when executed by at least one processor, cause the playback device to determine that the playback device is no longer associated with the second room and is associated with the first room comprise program instructions that, when executed by at least one processor, cause the playback device to:

determine that the playback device is no longer within a given proximity of a second playback device associated with the second room.

17. The non-transitory computer-readable medium of claim 10, wherein the non-transitory computer-readable medium is also provisioned with program instructions that, when executed by at least one processor, cause the playback device to:

based on determining that a predetermined period of time has lapsed, transition from operating in the first mode to operating in the second mode independent of the room setting of the playback device.

18. The non-transitory computer-readable medium of claim 10, wherein the playback device is a first playback device, and wherein the program instructions that, when executed by at least one processor, cause the playback device to execute the command to play back the audio content comprise program instructions that, when executed by at least one processor, cause the playback device to:

determine that the command to play back the audio content was provided by a user that matches the first user type; and based on the determination that the user matches the first user type, execute the command to play back the audio content.

19. A method carried out by a playback device, the method comprising:

based on a room setting of the playback device, determining that the playback device is associated with a first room of a media playback system;

based on determining that the playback device is associated with the first room, operating in a first mode, wherein the first mode comprises a default mode of the playback device, and wherein the first mode is associated with a first user type, a first set of playback control options, and a first type of audio content;

while operating in the first mode, determining that the room setting of the playback device has changed;

based on the changed room setting, determining that the playback device is no longer associated with the first room and is associated with a second room of the media playback system;

based on determining that the playback device is associated with the second room, transitioning from operating in the first mode to operating in a second mode, wherein the second mode is associated with a second user type that is different from the first user type, a second set of playback control options that is different from the first set of playback control options, and a second type of audio content that is different from the first type of audio content;

while operating in the second mode, determining that the playback device is no longer associated with the second room and is associated with the first room;

transitioning from operating in the second mode to operating in the first mode;

while operating in the first mode, receiving a command to play back audio content;

determining that the command corresponds to a user of the first user type, a playback control option within the first set of playback control options, and audio content of the first type of audio content; and based on (i) operating in the first mode (ii) the determination that the command corresponds to a user of the first user type, a playback control option within the first set of playback control options, and audio content of the first type of audio content, executing the command to play back the audio content.

20. The method of claim 19, wherein transitioning from operating in the second mode to operating in the first mode comprises:

transitioning from operating in the second mode to operating in the first mode based on determining that the playback device is no longer associated with the second room.

* * * * *